US012342704B2

(12) United States Patent
Fukuoka

(10) Patent No.: US 12,342,704 B2
(45) Date of Patent: *Jun. 24, 2025

(54) SELF-LUMINOUS DISPLAY PANEL HAVING DIFFERENT OPTICAL DISTANCES BETWEEN LIGHT-SHIELDING FILM AND LIGHT EMISSION REFERENCE POINTS DEPENDING ON LIGHT EMISSION COLOR

(71) Applicant: JDI Design and Development G.K., Tokyo (JP)

(72) Inventor: Kenta Fukuoka, Tokyo (JP)

(73) Assignee: JDI DESIGN AND DEVELOPMENT G.K., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/509,720

(22) Filed: Nov. 15, 2023

(65) Prior Publication Data

US 2024/0090292 A1 Mar. 14, 2024

Related U.S. Application Data

(63) Continuation of application No. 17/061,598, filed on Oct. 2, 2020, now Pat. No. 11,864,443.

(30) Foreign Application Priority Data

Oct. 4, 2019 (JP) .................................. 2019-184108
Aug. 31, 2020 (JP) .................................. 2020-145856

(51) Int. Cl.
*H10K 59/35* (2023.01)
*H10K 50/852* (2023.01)
(Continued)

(52) U.S. Cl.
CPC ......... *H10K 59/352* (2023.02); *H10K 50/852* (2023.02); *H10K 50/865* (2023.02);
(Continued)

(58) Field of Classification Search
CPC ............. H01L 27/3216; H01L 51/5265; H01L 51/5284; H01L 27/322; H01L 27/3244
(Continued)

(56) References Cited

U.S. PATENT DOCUMENTS 5,443,922 A 8/1995 Nishizaki et al.
11,864,443 B2 * 1/2024 Fukuoka .............. H10K 59/352
(Continued)

FOREIGN PATENT DOCUMENTS

JP H05-163488 A 6/1993
JP 2000-098126 A 4/2000
(Continued)

*Primary Examiner* — Nduka E Ojeh
(74) *Attorney, Agent, or Firm* — XSENSUS LLP

(57) ABSTRACT

A self-luminous display panel in which pixels composed of sub-pixels are arranged, including light-emitting elements and a light-shielding film. The light-emitting elements correspond one-to-one with the sub-pixels, each sub-pixel in a pixel emitting a different color of light. The light-shielding film is provided with openings at positions corresponding to the light-emitting elements in plan view, downstream in a light emission direction of the light-emitting elements. Optical distances between the light-shielding film and light emission reference points of the light-emitting elements are different, depending on light emission color of the light-emitting elements.

12 Claims, 31 Drawing Sheets

(51) Int. Cl.
*H10K 50/86* (2023.01)
*H10K 59/12* (2023.01)
*H10K 59/38* (2023.01)
*H10K 71/00* (2023.01)

(52) U.S. Cl.
CPC ............. *H10K 71/00* (2023.02); *H10K 59/12* (2023.02); *H10K 59/38* (2023.02)

(58) Field of Classification Search
USPC .......................................................... 257/40
See application file for complete search history.

(56) References Cited

U.S. PATENT DOCUMENTS

| | | |
|---|---|---|
| 2008/0224963 A1 | 9/2008 | Takagi et al. |
| 2010/0213438 A1 | 8/2010 | Cho et al. |
| 2011/0043096 A1 | 2/2011 | Asaki |
| 2017/0076678 A1* | 3/2017 | Lee ...................... G02F 1/1336 |
| 2018/0151840 A1 | 5/2018 | Fukuda |
| 2018/0277610 A1* | 9/2018 | Kubota .................. H10K 71/00 |
| 2020/0266394 A1* | 8/2020 | Kishimoto ............. H05B 33/10 |
| 2021/0104708 A1 | 4/2021 | Fukuoka |
| 2021/0371427 A1* | 12/2021 | Yamaguchi .......... C07D 495/00 |
| 2021/0399068 A1 | 12/2021 | Kim et al. |

FOREIGN PATENT DOCUMENTS

| | | |
|---|---|---|
| JP | 2008-226747 A | 9/2008 |
| JP | 2009-104969 A | 5/2009 |
| JP | 2010-199067 A | 9/2010 |
| JP | 2011-040352 A | 2/2011 |
| JP | 2011-096379 A | 5/2011 |
| JP | 2012-018868 A | 1/2012 |
| JP | 2014-013703 A | 1/2014 |
| JP | 2014-044938 A | 3/2014 |
| JP | 2016-206634 A | 12/2016 |
| JP | 2018-088365 A | 6/2018 |

* cited by examiner

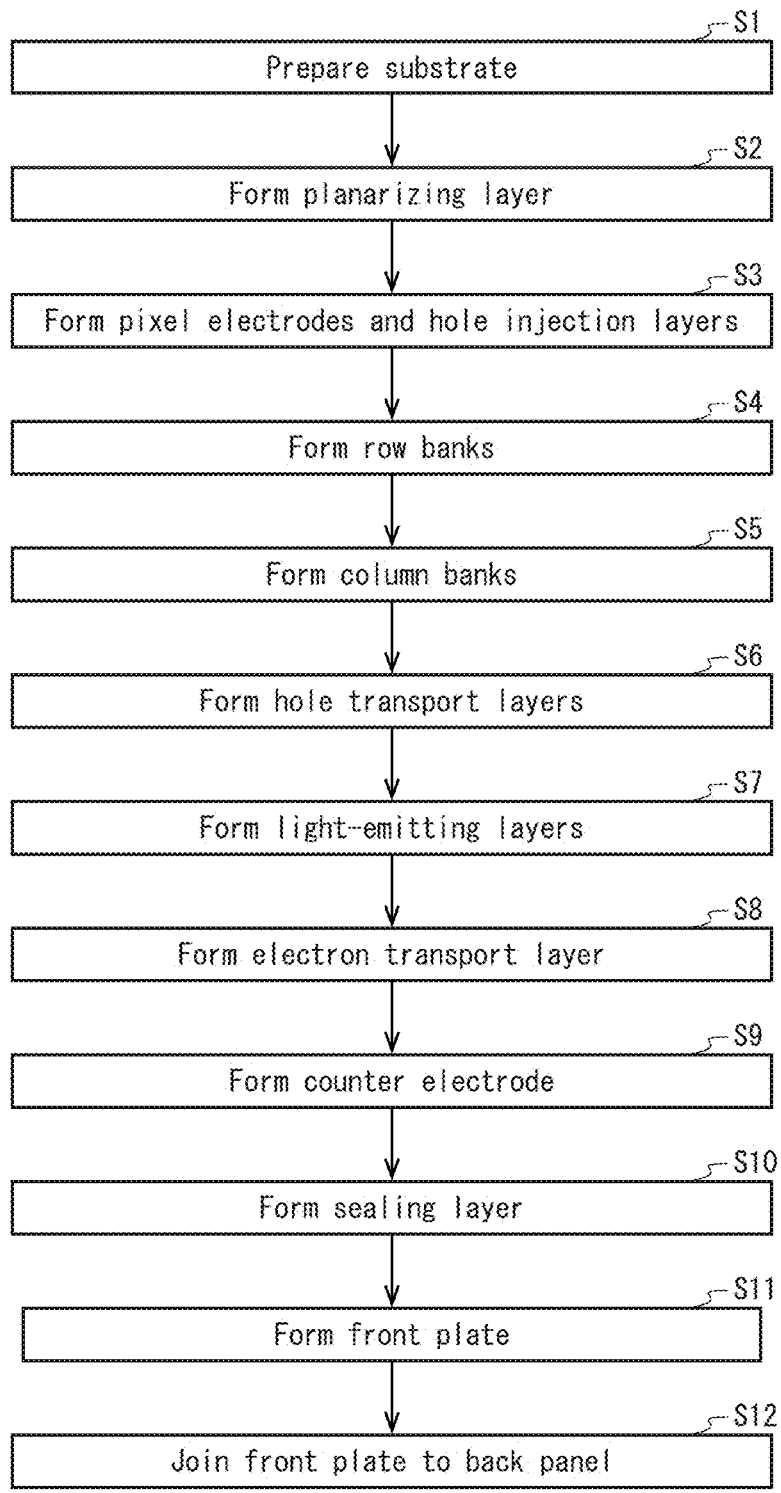

FIG. 5A
FIG. 5B
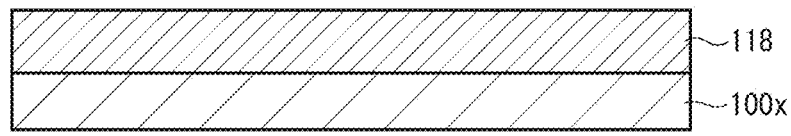
FIG. 5C
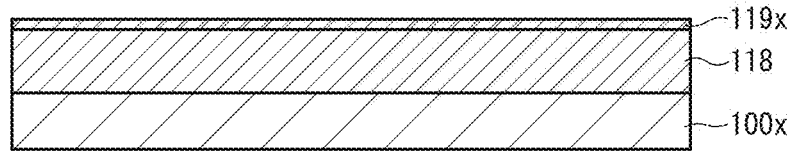
FIG. 5D
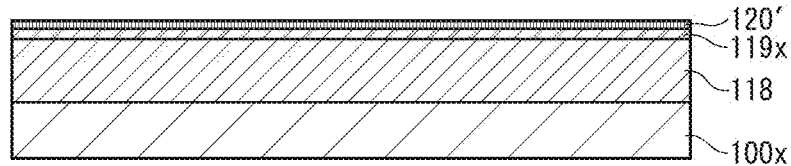
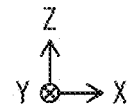

FIG. 9A
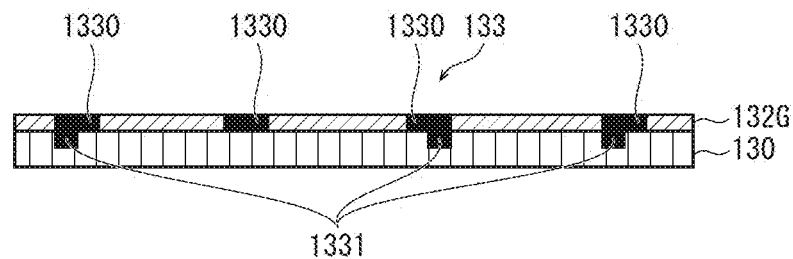
FIG. 9B
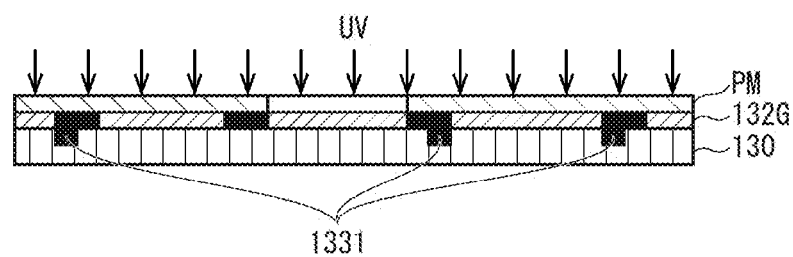
FIG. 9C
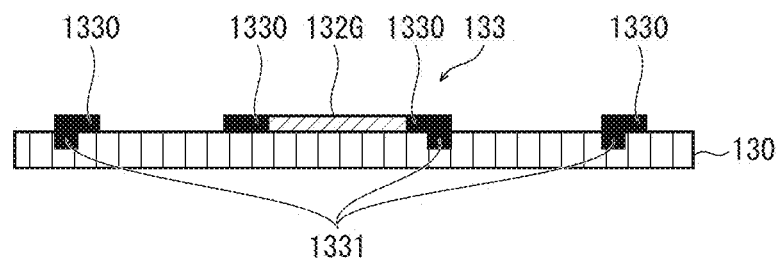
FIG. 9D
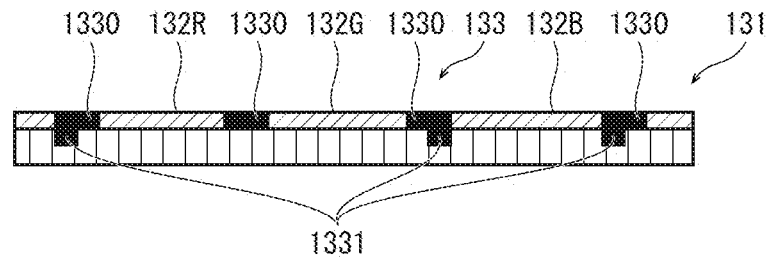
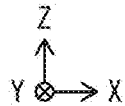

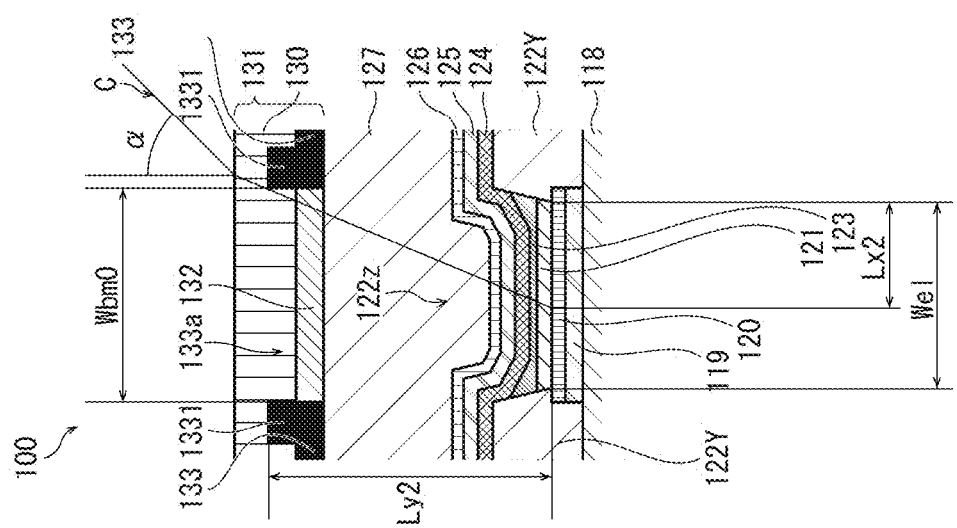
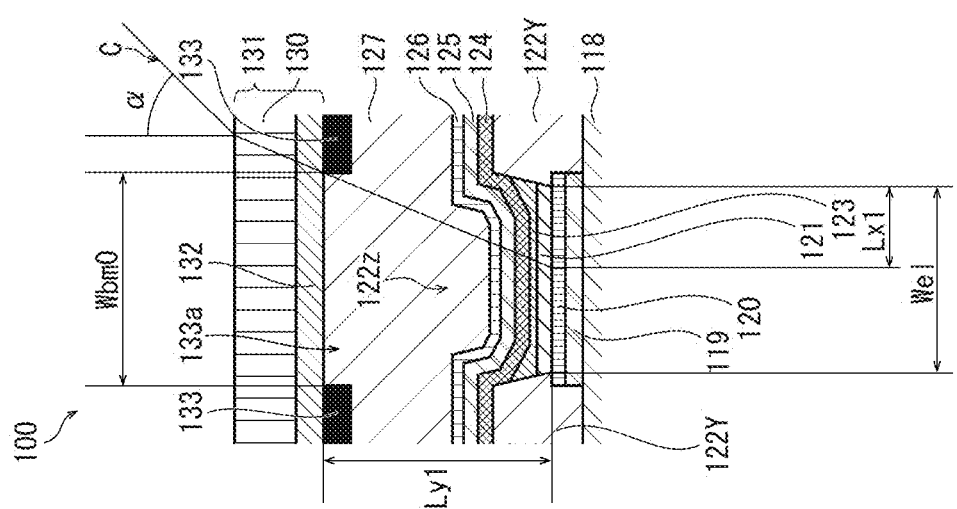
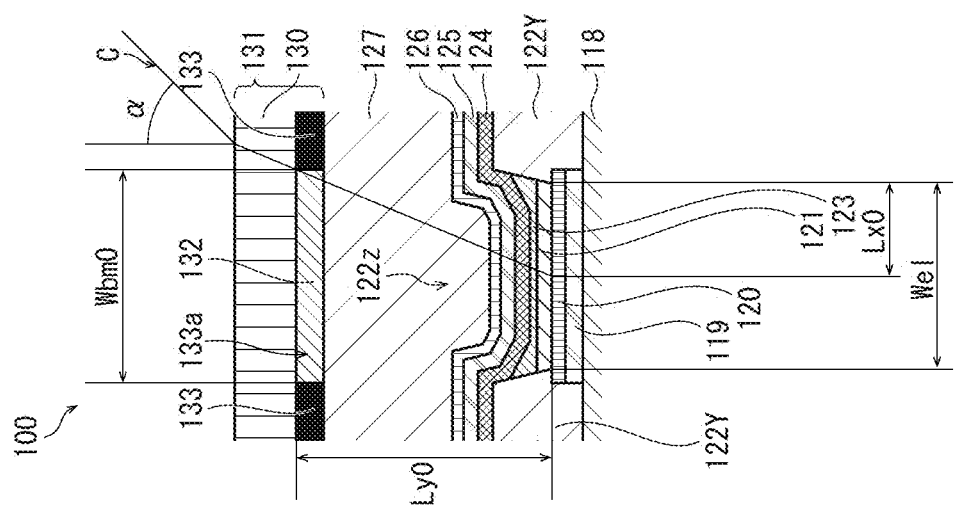

SELF-LUMINOUS DISPLAY PANEL HAVING DIFFERENT OPTICAL DISTANCES BETWEEN LIGHT-SHIELDING FILM AND LIGHT EMISSION REFERENCE POINTS DEPENDING ON LIGHT EMISSION COLOR

CROSS-REFERENCE TO RELATED APPLICATIONS

The present application is a continuation of U.S. application Ser. No. 17/061,598, filed Oct. 2, 2020, which claims priority to Japanese Patent Application No. 2019-184108 filed Oct. 4, 2019, and Japanese Patent Application No. 2020-145856 filed Aug. 31, 2020, the contents of each are hereby incorporated by reference in their entirety.

BACKGROUND OF THE DISCLOSURE

Technical Field

The present disclosure relates to display panels in which pixels including a light-emitting element such as an organic electroluminescence element (also referred to as an organic EL element) are arranged in two dimensions across a main surface of a substrate, and methods for manufacturing such display panels.

Description of the Related Art

In recent years, organic EL display panels in which organic EL elements are arranged in a matrix on a substrate have been implemented as display panels used in display devices such as digital televisions. An organic EL element has a basic structure in which a light-emitting layer including organic light-emitting material is sandwiched between a pair of electrodes. When driven, a voltage is applied between the pair of electrodes, causing recombination of holes and electrons injected into the light emitting layer and light emission.

A top-emission type of organic EL element has a structure in which a substrate, a pixel electrode made of a light-reflecting material (reflective electrode), an organic layer (including a light-emitting layer), and a counter electrode made of a light-transmissive material are arranged in this order. By adopting an optical resonator structure in which constructive interference between light from the light-emitting layer reflected by the reflective electrode and emitted from the counter electrode and light emitted directly from the light-emitting layer, high light extraction efficiency can be realized.

In an organic EL display panel for a color display, such an organic EL element forms a red (R), green (G), or blue (B) color sub-pixel, and adjacent RGB sub-pixels combine to form a pixel in the color display. Typically, in an organic EL display panel, as described in JP 2008-226747, for example, a grid-shaped light shielding film is provided at boundaries between adjacent sub-pixels, and a color filter layer corresponding to each of the RGB colors is provided above the sub-pixels that are surrounded in plan view by the light shielding film. This prevents a reduction in display contrast caused by reflection of external light on outer edges of reflective electrodes of sub-pixels and prevents mixing of colors between adjacent pixels.

However, when the organic EL display panel is viewed at an angle from the front, the grid-shaped light shielding film shields a portion of each light-emitting area of the sub-pixels, and therefore chromaticity of a display image changes. To address this problem, for example, JP 2011-40352 describes a technique for reducing chromaticity changes when viewed from an oblique angle, by making sizes of banks that partition RGB colors of sub-pixels and sizes of a grid-shaped light shielding film different for each color of sub-pixel.

SUMMARY

A self-luminous display panel according to at least one embodiment of the present disclosure is a self-luminous display panel in which pixels composed of sub-pixels are arranged, including light-emitting elements and a light-shielding film. The light-emitting elements correspond one-to-one with the sub-pixels, each sub-pixel in a pixel emitting a different color of light. The light-shielding film is provided with openings at positions corresponding to the light-emitting elements in plan view, downstream in a light emission direction of the light-emitting elements. Optical distances between the light-shielding film and light emission reference points of the light-emitting elements are different, depending on light emission color of the light-emitting elements.

BRIEF DESCRIPTION OF DRAWINGS

These and other objects, advantages, and features of the technology pertaining to the present disclosure will become apparent from the following description thereof taken in conjunction with the accompanying drawings, which illustrate at least one embodiment of the technology pertaining to the present disclosure.

FIG. 4 is a flowchart of a method of manufacturing the organic EL display panel 10 according to at least one embodiment.

FIGS. 5A, 5B, 5C, and 5D are schematic diagrams of cross-sections taken from the same location as A1-A1 in FIG. 1, illustrating states in manufacturing of the organic EL display panel 10, according to at least one embodiment.

FIGS. 9A, 9B, 9C, and 9D are schematic diagrams of cross-sections taken from the same location as A1-A1 in FIG. 1, illustrating states in manufacturing of the organic EL display panel 10, according to at least one embodiment.

FIGS. 11A, 11B, and 11C are diagrams of cross-sections of light-emitting elements 100 in the organic EL display panel 10, in which optical distances between light emission reference points and the light shielding film 133 are different.

DETAILED DESCRIPTION

Background to Disclosure

There are technical problems with the structure described in JP 2008-226747, in that when the organic EL display panel is viewed from an oblique direction, the shielding of part of a self-luminous area of each sub-pixel by the grid-shaped light-shielding film causes a change in chromaticity of a displayed image, and in a high definition organic EL display panel, it is difficult to sufficiently reduce such a change in chromaticity.

Figure 31:
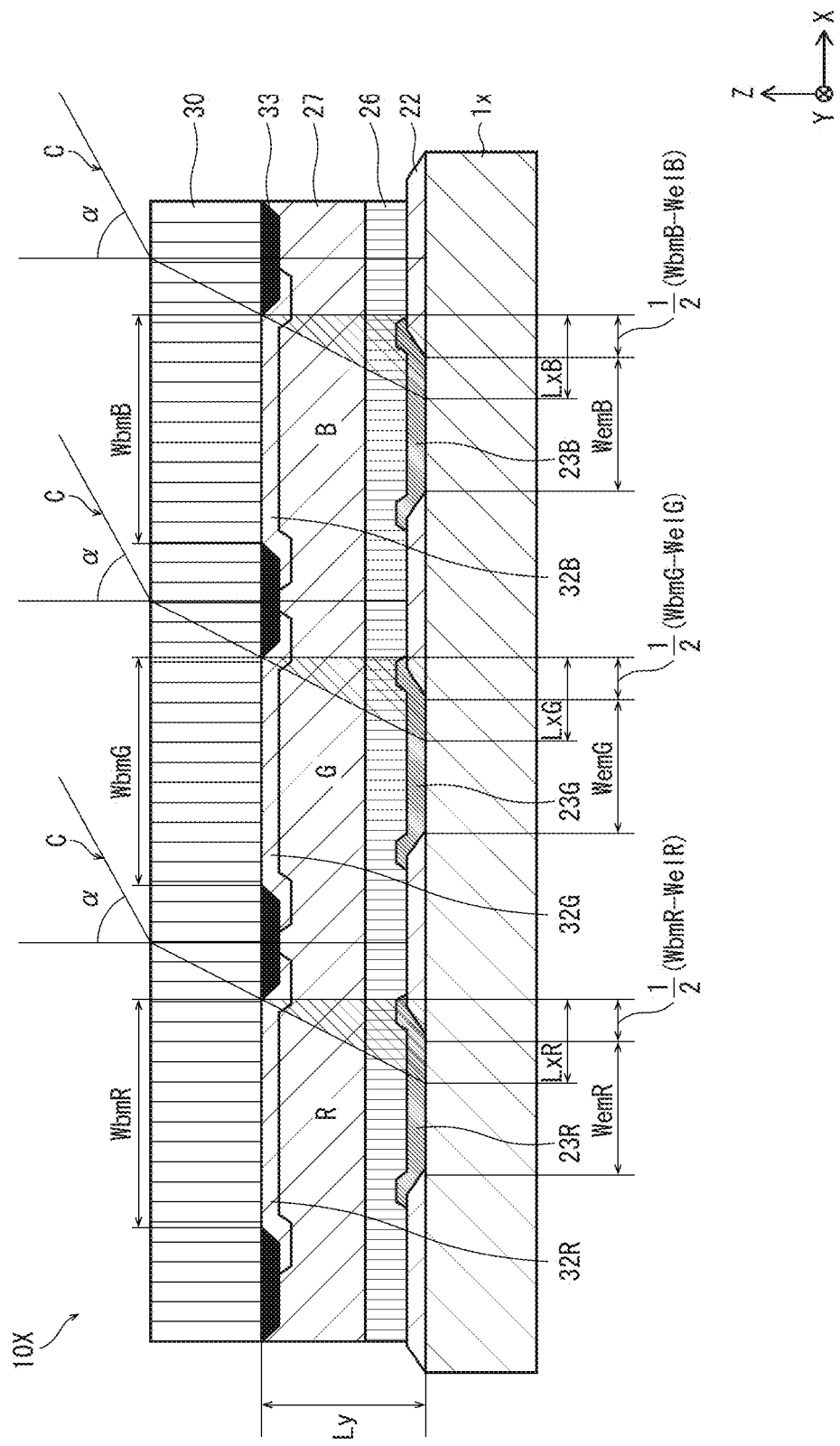
FIG. 31 is a schematic diagram of a cross-section taken along a row direction of a pixel of an organic EL display panel.

FIG. 31 is a schematic diagram of a cross-section taken in a row direction (X direction in FIG. 31) of a pixel of an organic EL display panel 10X. In the organic EL display panel 10X, one pixel includes light-emitting elements 23R, 23G, 23B arranged side by side in the row direction that emit RGB colors of light and are partitioned from each other by banks 22 that extend in a column direction (Y direction in FIG. 31) on a surface of a substrate 1x. The light-emitting elements 23R, 23G, 23B and the banks 22 are covered with a sealing layer 26 made of an inorganic material, and the substrate 1x is joined to an upper substrate 30 via a joining layer 27 made of a resin material. The substrate 1x is separated from the upper substrate 30 by a distance Ly. The upper substrate 30 is provided with a light-shielding film 33 containing a black pigment that has openings corresponding to the light-emitting elements 23R, 23G, 23B. Likewise, color filter layers 32R, 32G, 32B in the openings correspond to the light-emitting elements 23R, 23G, 23B.

In the display panel 10X, when a width of light-emitting elements is Wel (WelR, WelG, WelB), a width of openings of the light shielding film 133 is Wbm (WbmR, WbmG, WbmB), and a distance between a light emission reference point and the light shielding film 133 is Ly, the widths WbmR, WbmG, WbmB of the openings of the light shielding film 133 are greater than the corresponding widths WelR, WelG, WelB of the light-emitting elements 23R, 23G, 23B. Light is emitted upwards (Z direction in FIG. 31) from the light-emitting elements 23.

When the display panel 10X is viewed from a direction of line of sight C with a viewing angle α, a light shielding width is Lx (LxR, LxG, LxB), and therefore a light shielding ratio with respect to the light-emitting element width Wel is Lx/Wel. Thus, a rate of reduction of luminance from the light-emitting element 23 visually recognized by a viewer increases as the light shielding ratio increases. When the rate of reduction of luminance is different among the light-emitting elements 23R, 23G, 23B, luminance balance from light-emitting elements 100R, 100G, 100B changes, and therefore chromaticity visually recognized by a viewer changes. When viewed from an oblique angle, this appears as a chromaticity shift in grays and midtones.

In response to this problem, JP 2011-40352, for example, proposes a technique of intentionally making light-shielding ratios of the light-emitting elements 23R, 23G, 23B different, by making gaps between the banks 22 partitioning the light-emitting elements 100 different and making sizes of openings of the grid-shaped light-shielding film 33 different, in order to compensate for and reduce visually recognized chromaticity changes from an oblique viewing angle. However, in a study by the inventor, it was found that in a high definition organic EL display panel, there is a problem with the method described in JP 2011-40352 in that it is difficult to sufficiently reduce changes in chromaticity visually recognized when viewed from an oblique viewing angle, due to the increase in pixel density and decrease in area of each light-emitting element 23.

For example, when an opening area of the grid-shaped light shielding film 33 is reduced relative to the banks 22, it may be difficult to align the light shielding film 33 on the upper substrate 30 to the light-emitting elements 100 when joining the upper substrate 30 to the substrate 1x. Further, when an opening area of the grid-shaped light-shielding film 33 is increased relative to the banks 22, an increase in opening width Wbm is limited by a minimum line width of the light-shielding film 33, and it may not be possible to sufficiently reduce the light-shielding ratio.

Further, light-shielding ratios of the light-emitting elements 23R, 23G, 23B at the viewing angle α are different due to structural differences, and this may cause changes in chromaticity visually recognized by a viewer.

The present disclosure is made in view of the problems described above, and an object of the present disclosure is to provide a self-luminous display panel capable of high definition and a reduction in change of chromaticity of emitted light when a display image is viewed from an oblique viewing angle.

In order to solve the technical problems, the inventor extensively studied structures of self-luminous display panels capable of high definition and reduced chromaticity changes of emitted light when a display image is viewed from a viewing angle 45° or more from the front, and arrived at the self-luminous display panel pertaining to at least one embodiment of the present disclosure.

The self-luminous display panel pertaining to at least one embodiment of the present disclosure is capable of high definition and reduced chromaticity changes of emitted light when a display image is viewed from an oblique viewing angle.

Such technical problems are not limited to organic EL display panels that use organic EL elements as light-emitting elements. Similar technical problems occur in any display panel that includes self-luminous light-emitting elements in which a wet process is used to form an organic functional layer to construct an optical resonator structure, such as inorganic EL display panels in which light-emitting layers are made of inorganic materials, quantum dot display panels in which light-emitting layers are made of quantum dot light-emitting elements (quantum dot light-emitting diodes (QLED)), and the like.

Overview of Embodiments of Present Disclosure

A self-luminous display panel according to at least one embodiment of the present disclosure is a self-luminous display panel in which pixels composed of sub-pixels are arranged, including light-emitting elements and a light-shielding film. The light-emitting elements correspond one-to-one with the sub-pixels, each sub-pixel in a pixel emitting a different color of light. The light-shielding film is provided with openings at positions corresponding to the light-emitting elements in plan view, downstream in a light emission direction of the light-emitting elements. Optical distances between the light-shielding film and light emission reference points of the light-emitting elements are different, depending on light emission color of the light-emitting elements.

According to this structure, in a high definition organic EL display panel, even when pixel density is increased and unit areas of the light-emitting elements are decreased, a self-luminous display panel structure can be realized that reduces changes in chromaticity of emitted light when a display image is viewed from an oblique angle of 45° or more from the front.

According to at least one embodiment, the optical distances are each a maximum distance in the light emission direction between an edge of one of the openings of the light-shielding film, and one of the light emission reference points of a corresponding one of the light-emitting elements.

According to this structure, light-shielding width and light-shielding ratio can be controlled independently of relative positions of the light-emitting elements and the openings of the light-shielding film. Thus, even when light-shielding widths and light-shielding ratios are different depending on the light emission color of the light-emitting elements, the margin for error for alignment of the light-shielding film on the front plate to the sub-pixels on the substrate when joining the front plate to the back panel does not change. Further, a problem of being unable to sufficiently reduce shielding ratio due a need to ensure a minimum line width of the light-shielding film does not occur. As a result, in a high definition organic EL display panel, even when pixel density is increased and unit areas of the light-emitting elements are decreased, a self-luminous display panel structure can be realized that reduces changes in chromaticity of emitted light when a display image is viewed from an oblique angle.

According to at least one embodiment, positions in the light emission direction of top edges of the openings of the light-shielding film corresponding to the light-emitting elements are different, depending on the light emission color of the light-emitting elements.

According to at least one embodiment, positions in the light emission direction of the light emission reference points of the light-emitting elements are different, depending on the light emission color of the light-emitting elements.

According to these structures, optical distances from the light emission reference points of the light-emitting elements to the light-shielding film can be configured to be different depending on the light emission color of the light-emitting elements.

According to at least one embodiment, the self-luminous display panel further includes a light-adjusting film between the light-emitting elements and the light-shielding film in the light emission direction. The light-adjusting film has areas corresponding to the light-emitting elements in plan view, and a refractive index of the light-adjusting film is different for different areas, depending on light emission color of the light-emitting elements.

According to this, a display panel structure can be implemented that reduces changes in chromaticity visually recognized from an oblique viewing angle, by arrangement of a light-adjusting film in the light-emitting element sections. Further, light extraction efficiency can be improved by adopting the optical resonator structure in which a boundary between the light-adjusting film and the sealing layer is a third reflective interface.

According to at least one embodiment, the self-luminous display panel further includes a light-adjusting film between the light-emitting elements and the light-shielding film in the light emission direction, the light-adjusting film being common to a plurality of the light-emitting elements that emit different colors of light. A refractive index of the light-adjusting film is different for different wavelengths of light emitted by the light-emitting elements.

This structure reduces changes in chromaticity visually recognized from an oblique viewing angle. Further, by making the refractive index of the light-adjusting film different for different light-emitting elements, the differences in light shielding ratios of the light-emitting elements can be more finely compensated for, and changes in visual recognition of chromaticity when viewed from an oblique angle can thereby be more accurately reduced.

According to at least one embodiment, the light-shielding film is composed of portions of color filter layers overlapping in plan view above boundaries between the light-emitting elements, where the color filter layers correspond one-to-one with the light-emitting elements.

According to this structure, by implementing changes in a direction that cancels out differences in light-shielding ratio of the light-emitting elements, changes in visual recognition of chromaticity when viewed from an oblique angle can be reduced.

According to at least one embodiment, the pixels are arranged in a matrix of rows and columns, the light-emitting elements have different lengths in a row or column direction depending on the light emission color of the light-emitting elements, and among the light-emitting elements of each pixel, a first light-emitting element that has a larger length in the row or column direction has a larger value among the optical distances than a second light-emitting element that has a smaller length in the row or column direction.

According to this structure, changes in chromaticity visually recognized from an oblique viewing angle can be reduced by arrangement of a light-adjusting film in the front plate.

According to at least one embodiment, the pixels are arranged in a matrix of rows and columns, the light-emitting elements have different light emission distributions in a row or column direction depending on the light emission color of the light-emitting elements, and among the light-emitting elements of each pixel, a first light-emitting element that has a light emission distribution shape that has a larger half maximum luminance range has a smaller value among the optical distances than a second light-emitting element that has a light emission distribution shape that has a smaller half maximum luminance range.

According to this structure, a change in visually recognized chromaticity when viewed from an oblique direction is reduced, where the change is due to differences in luminance of each color of light-emitting element causing differences in visually recognized luminance distribution among the light-emitting elements that have the same apparent light-shielding ratio when viewed from the oblique direction.

According to at least one embodiment, the pixels are arranged in a matrix of rows and columns, and in plan view, in a row direction, a column direction, or both the row and column directions, the openings of the light-shielding film each include the light-emitting element corresponding to the opening, and a distance between an edge of the opening and the light-emitting element is the same among the light-emitting elements, regardless of the light emission color of the light-emitting elements.

According to this structure, light-shielding width and light-shielding ratio can be controlled independently of relative positions of the light-emitting elements and the openings of the light-shielding film. Thus, even when light-shielding widths and light-shielding ratios are different depending on the light emission color of the light-emitting elements, the margin for error for alignment of the light-shielding film on the front plate to the sub-pixels on the substrate when joining the front plate to the back panel does not change.

According to at least one embodiment, the pixels are arranged in a matrix of rows and columns, the light-emitting elements of each pixel are arranged in a line in the row direction, banks extending in the column direction are disposed between the light-emitting elements in the row direction, each of the light-emitting elements includes a light-emitting layer including an applied film disposed in a gap between the banks, and each of the light-emitting layers includes a flat portion that has a substantially uniform film thickness disposed in a range that includes a center point in the row direction of the gap between the banks, and pinning portions disposed on either side of the flat portion in the row direction that have a larger film thickness than the flat portion.

According to this structure, light-shielding ratios when viewed from an oblique viewing angle are such that the light-shielding ratio in the row direction is greater than the light-shielding ratio in the column direction, and a chromaticity change visually recognized from the oblique viewing angle also changes more in the row direction than in the column direction. Thus, a structure of a display panel can be implemented that effectively reduces changes in chromaticity visually recognized from an oblique direction by, for example, providing thickened portions around edges of openings of the light-shielding film.

According to at least one embodiment, a difference in chromaticity between chromaticity observed from a viewing angle of 45° from the front of the display panel in the row direction and chromaticity observed from a viewing angle of 45° from the front of the display panel in the column direction is from 0 to 0.02, where the difference in observed chromaticity is caused by a portion of light emitted from each light-emitting element being shielded by an edge of the opening of the light shielding film.

According to this structure, it is possible to reduce a change in chromaticity visually recognized from an oblique viewing angle when opening widths in the row direction and the column direction of each of the openings of the light-shielding film are decreased, causing light-shielding ratios to increase.

According to at least one embodiment, luminance observed from a viewing angle of 45° from the front of the display panel in the column direction is 103% or more of luminance observed from a viewing angle of 45° from the front of the display panel in the row direction, where a difference in observed luminance is caused by a portion of light emitted from each light-emitting element being shielded by the edge of the opening of the light-shielding film.

According to this structure, a structure of a display panel can be implemented that more accurately compensates for changes in chromaticity visually recognized when viewed from an oblique angle due to different light-shielding ratios among light-emitting elements when the light-emitting layers of the light-emitting elements are applied films elongated and continuous in the column direction in gaps between column banks.

Embodiment

<Overall Structure of Organic EL Display Panel 10>

Figure 1:
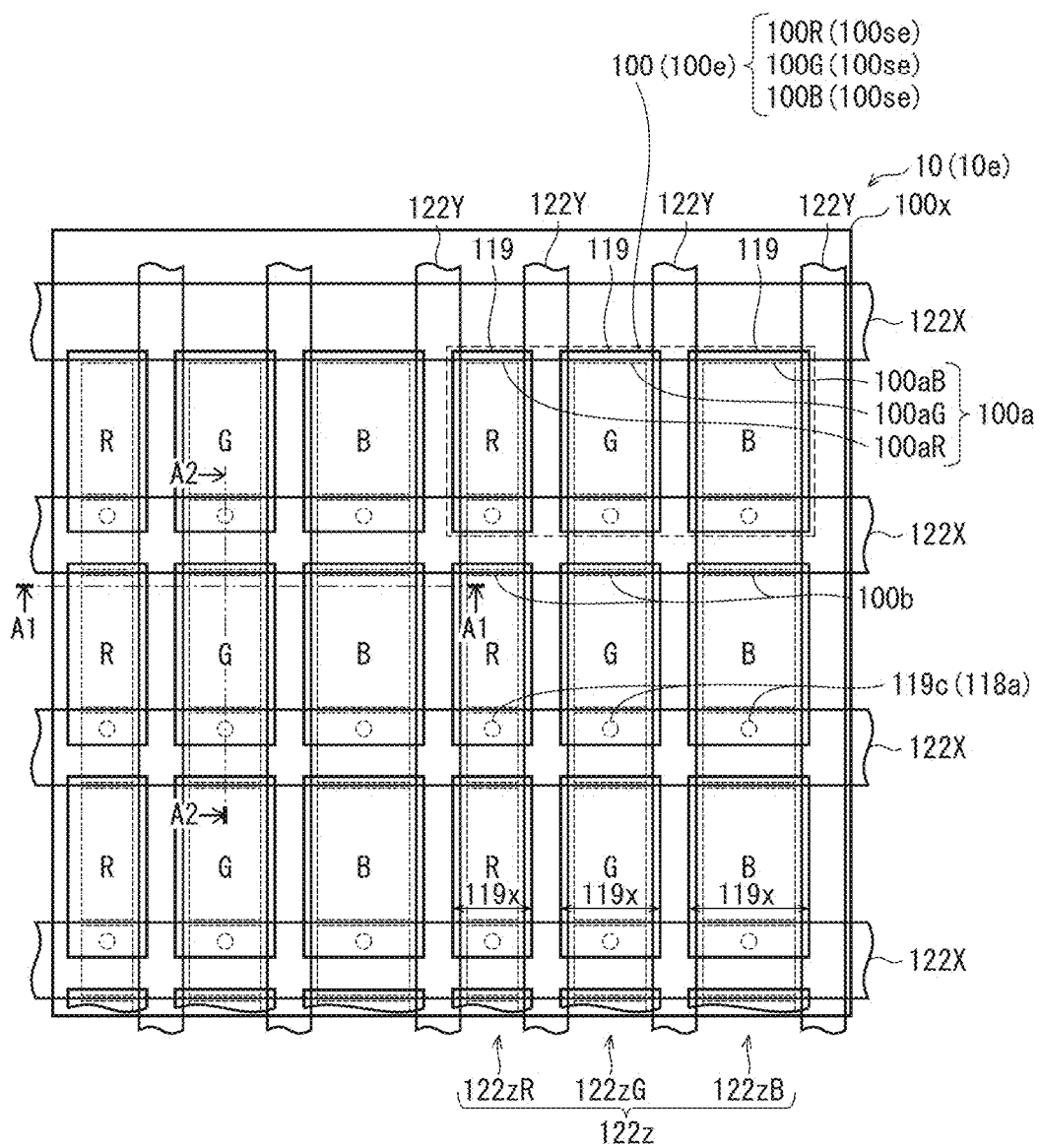
FIG. 1 is a schematic plan view diagram enlargement of a portion of an organic EL display panel 10 according to at least one embodiment.

The following describes an organic EL display panel 10 (also referred to as "display panel 10") pertaining to the present embodiment, with reference to the drawings. Note that the drawings are schematic diagrams and are not necessarily to scale. FIG. 1 is a plan view diagram of the display panel 10 according to at least one embodiment.

The display panel 10 has a top-emission structure in which light is emitted from a top surface thereof, and in which organic EL elements 100, which constitute pixels, are arranged on a substrate 100x (TFT substrate) including thin film transistors (TFTs). Here, in the present description, the X direction, Y direction, and Z direction in the drawings represent a row direction, column direction, and thickness direction of the display panel 10, respectively.

As illustrated in FIG. 1, the display panel 10 includes light-emitting elements 100R, 100G, and 100B arranged in a matrix on the substrate 100x (also referred to as "light-emitting elements 100"), defined by column banks 122Y and row banks 122X (also referred to as "banks 122") arranged in a partitioned area 10e (also referred to as "area 10e"). The light-emitting elements 100R, 100G, 100B includes corresponding self-luminous areas 100aR, 100aG, 100aB that emit a corresponding color of light (red, green, or blue) (also referred to as "self-luminous areas 100a"). Each of the light-emitting elements 100 correspond to a sub-pixel 100se, which is a light-emitting unit. A unit pixel 100e includes three of the sub-pixels 100se arranged in a row. In the area 10e of the display panel 10, the unit pixels 100e are arranged in a matrix of rows and columns.

Further, as illustrated in FIG. 1, in the display panel 10, pixel electrodes 119 are arranged in a matrix of rows and columns on the substrate 100x, separated from each other by defined distances in the row and column directions. Each of the pixel electrodes 119 has a rectangular shape in plan view and is made of a light-reflective material. The pixel electrodes 119 are arranged so that three of the pixel electrodes 119 in a row along the row direction correspond to three of the self-luminous areas 100a: 100aR, 100aG, and 100aB. Lengths 119x in the row direction of the pixel electrodes 119 are configured such that the length 119x of the pixel electrodes 119 corresponding to the light-emitting elements 100B is longest, the length 119x of the pixel electrodes 119 corresponding to the light-emitting elements 100R is shortest, and the length 119x of the pixel electrodes 119 corresponding to the light-emitting elements 100G is between these two values. Areas of the self-luminous areas 100aB, 100aG, 100aR have the same relationship of relative sizes.

In the display panel 10, the banks 122 have a line-shaped bank structure. Between every two adjacent pixel electrodes 119 in the row direction is a column bank 122Y that extends in the column direction (Y direction in FIG. 1).

Similarly, between every two adjacent pixel electrodes 119 in the column direction is a row bank 122X that extends in the row direction (X direction in FIG. 1). Areas in which the row banks 122X are present are areas in which organic electroluminescence does not occur in the light-emitting layers 123, and are therefore referred to as non-self-luminous areas 100b.

Gaps between the column banks 122Y corresponding to the self-luminous areas 100aR are referred to as red gaps 122zR, gaps corresponding to the self-luminous areas 100aG are referred to as green gaps 122zG, and gaps corresponding to the self-luminous areas 100aB are referred to as blue gaps 122zB (gaps between the column banks 122Y may also be referred to as "gaps 122z").

Further, as illustrated in FIG. 1, in the display panel 10, the self-luminous areas 100a and the non-self-luminous areas 100b are arranged to alternate in the column direction alongside the gaps 122z. Contact recesses 119c (in contact holes 118a) are provided in the non-self-luminous areas 100b to connect the pixel electrodes 119 to TFT sources $S_1$.

<Components of Display Panel 10>

Figure 2:
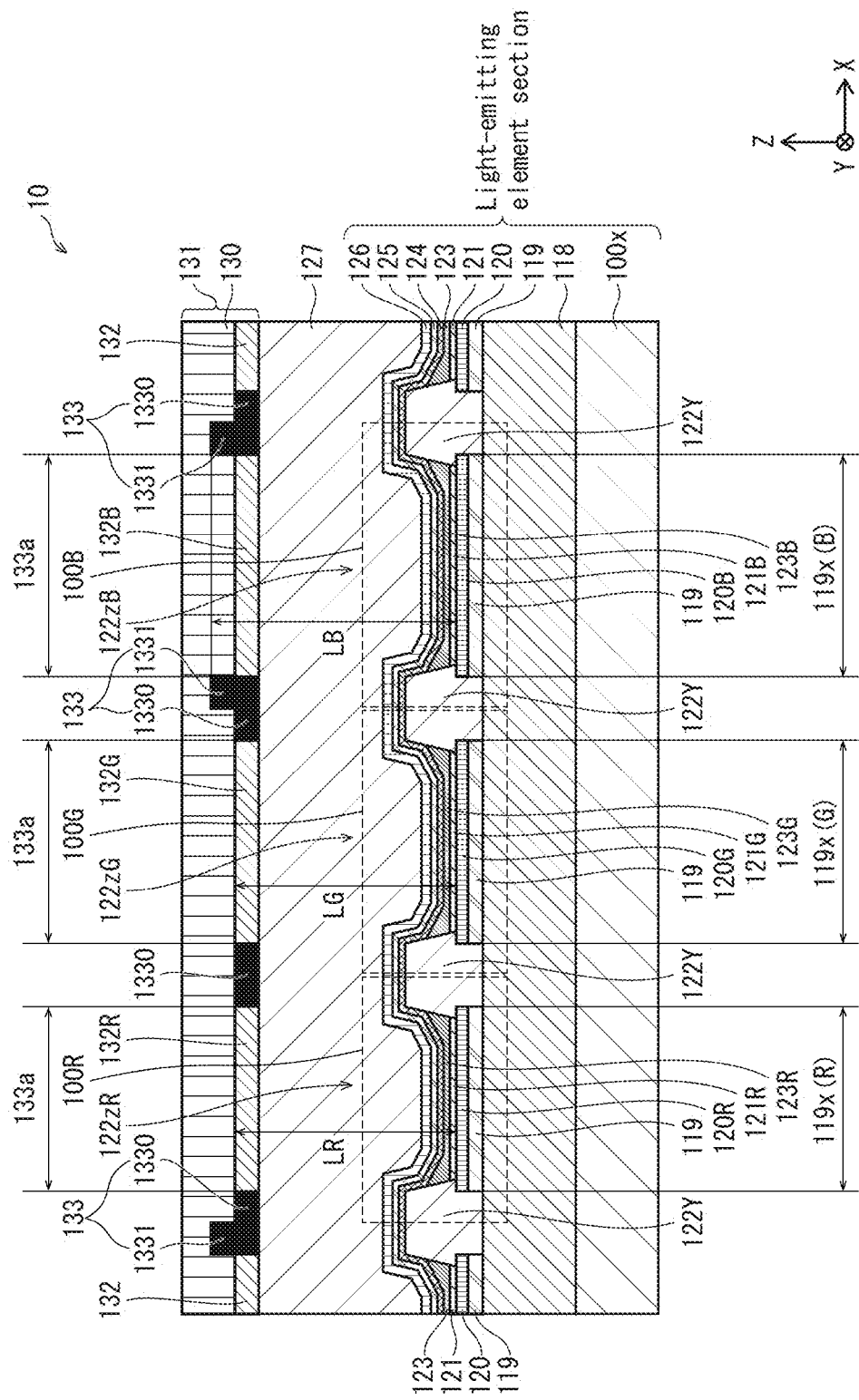
FIG. 2 is a diagram of a cross-section taken along a line A1-A1 in FIG. 1, according to at least one embodiment.
Figure 3:
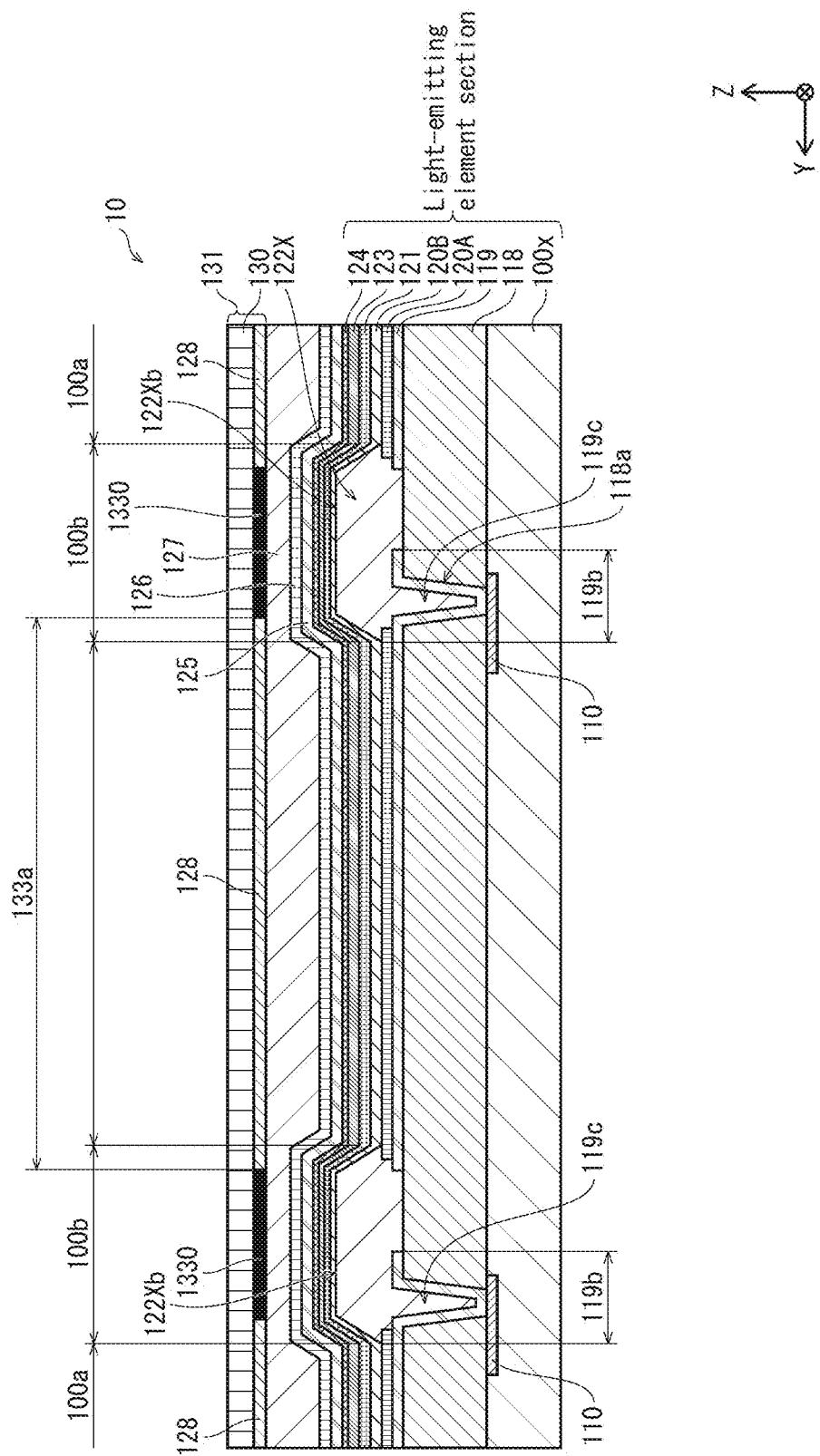
FIG. 3 is a diagram of a cross-section taken along a line A2-A2 in FIG. 1, according to at least one embodiment.

The following describes structure of the organic EL elements 100 in the display panel 10, with reference to FIG. 2 and FIG. 3. FIG. 2 and FIG. 3 are schematic diagrams of cross-sections taken along lines A1-A1 and A2-A2 in FIG. 1.

In the display panel 10 pertaining to the present embodiment, a substrate on which thin film transistors are formed (a TFT substrate) is formed as a substrate in the Z axis direction, and an organic EL element section is formed thereon.

(Light-Emitting Element Section)

[Substrate 100x]

The substrate 100x is a support member of the display panel 10 and includes a base (not illustrated) and a thin film transistor layer (not illustrated) on the base.

The base is a support member of the display panel 10, and is a flat plate. As a material of the base, an electrically insulating material such as a glass material, a resin material, a semiconductor material, a metal material coated with an insulating layer, or the like can be used.

TFT circuitry electrically connects the pixel electrodes 119 to an external power source according to a drive signal from a circuit external to the light-emitting elements 100. The TFT layer is a multi-layer structure including an electrode, a semiconductor layer, an insulating layer, and the like formed on a top surface of the base. According to the present embodiment, the TFT layer includes multiple TFTs and wiring formed on the top surface of the base. The wiring electrically connects the pixel electrodes 119 corresponding to the TFT sources $S_1$, an external power source, an external circuit, and the like.

[Planarizing Layer 118]

The planarizing layer 118 is disposed on a top surface of the base and TFT layer. The planarizing layer 118 disposed on the top surface of the substrate 100x planarizes the top surface of the substrate 100x that is uneven due to the TFT layer, filling spaces between the wiring and the TFTs, and electrically insulating between the wiring and the TFTs.

In order to connect the pixel electrodes 119 to the wiring connected to the TFT sources $S_1$, the contact holes 118a corresponding to the pixel electrodes 119 are formed in the planarizing layer 118 above part of the wiring.

[Pixel Electrodes 119]

As illustrated in FIG. 2 and FIG. 3, the pixel electrodes 119 correspond one-to-one with the sub-pixels 100se and are disposed on the planarizing layer 118 in the area 10e of the substrate 100x.

The pixel electrodes 119 supply carriers to the light emitting layers 123. For example, if functioning as anodes, the pixel electrodes 119 supply holes to the light-emitting layers 123. The display panel 10 is a top-emission type of display panel, and the pixel electrodes 119 are light-reflective. The pixel electrodes 119 each have, for example, a substantially rectangular flat plate shape in plan view. According to the present embodiment, as described above, the lengths 119x(B), (G), (R) in the row direction of the pixel electrodes 119 of the light-emitting elements 100B, 100G, 100R are configured from longest (B) to shortest (R). Thus, current density of the light-emitting layers 123 goes from least to most in the order of light-emitting elements 100B, 100G, 100R, compensating for differences in element life of the light-emitting elements 100 of each color.

The connecting recesses 119c of the pixel electrodes 119 are formed by recessing portions of the pixel electrodes 119 in the direction of the substrate 100x in the contact holes of the planarizing layer 118. Bottoms of the connecting recesses 119c connect to wiring connected to TFT sources $S_1$ corresponding to the pixel electrodes 119.

[Hole Injection Layers 120]

Hole injection layers 120 are laminated on the pixel electrodes 119 as illustrated in FIG. 2 and FIG. 3. The hole injection layers 120 have a function of transporting holes injected from the pixel electrode layers 119 to hole transport layers 121.

The hole injection layers 120 each include a lower layer made of a metal oxide formed on the pixel electrodes 119 and an upper layer made of an organic material laminated on the lower layer in the gaps 122zR, 122zG, 122zB. The upper layers formed in the RGB sub-pixels have different film thicknesses depending on RGB sub-pixel color.

According to the present embodiment, as illustrated in FIG. 3, the hole injection layers 120 extend linearly in the column direction in the gaps 122zR, 122zG, 122zB.

[Banks 122]

As illustrated in FIG. 2, banks made of an insulating material cover edges of the pixel electrodes 119 and the hole injection layers 120. The banks include the column banks 122Y that extend in the column direction and are arranged side-by-side in the row direction and the row banks 122X that extend in the row direction and are arranged side-by-side in the column direction.

The column banks 122Y each have a line-like shape extending in the column direction, and in a cross-section taken parallel to the row direction the column banks 122Y each have a tapered trapezoid shape that tapers upwards. The column banks 122Y define outer edges in the row direction of the light-emitting layers 123 formed as ink containing organic compounds that are materials of the light-emitting layers 123 is blocked by the column banks 122Y from flowing in the row direction. Further, base portions in the row direction of the column banks 122Y define edges of the self-luminous areas 100a of the sub-pixels 100se in the row direction.

The row banks 122X each have a line-like shape extending in the row direction, and in a cross-section taken parallel to the column direction the row banks 122X each have a tapered trapezoid shape that tapers upwards. The row banks 122X extend through the column banks 122Y, and each has a top surface that is lower in height than a top surface 122Yb of the column banks 122Y Thus, the row banks 122X and the column banks 122Y form openings that correspond to the self-luminous areas 100a.

[Hole Transport Layers 121]

As illustrated in FIG. 2 and FIG. 3, the hole transport layers 121 are laminated on the hole injection layers 120 in the gaps 122zR, 122zG, 122zB. The hole transport layers 121 also cover the hole injection layers 120 over the row banks 122X. The hole transport layers 121 are in direct contact with the hole injection layers 120. The hole transport layers 121 have a function of transporting holes injected from the hole injection layers 120 to the light emitting layers 123. According to at least one embodiment, the hole transport layers 121R, 121G, 121B (also referred to as "hole transport layers 121") of the RGB sub-pixels have different film thicknesses according to the color of sub-pixel.

According to the present embodiment, the hole transport layers 121 extend in the column direction along the gaps 122z.

[Light-Emitting Layers 123]

The light-emitting layers 123 are laminated on the hole transport layers 121, as illustrated in FIG. 2 and FIG. 3. The light-emitting layers 123 are made of organic compounds, and have a function of emitting light due to internal recombination of holes and electrons. In the gaps 122zR, 122zG, 122zB defined by the column banks 122Y, the light emitting layers 123R, 123G, 123B each have a line-like shape extending in the column direction.

In the different colors of the sub-pixels 100se are different colors of the light-emitting layers 123 between the pixel electrodes 119 and the counter electrode 125, forming optical resonator structures in which light from the light-emitting layers 123 resonates and is emitted from the counter electrode 125 side. The optical resonator structures are structures with optical distances between the top surfaces of the light-emitting layers 123 and the top surfaces of the pixel electrodes 119 set according to wavelengths of light emitted from the light-emitting layers 123R, 123G, 123B, such that light components corresponding to these colors are strengthened by constructive interference.

Only portions of the light-emitting layers 123 to which carriers are supplied from the pixel electrodes 119 emit light, and therefore electroluminescence of organic compounds does not occur in the non-self-luminous areas 100b where the row banks 122X are present, as the row banks 122X are inter-layer insulators. Thus, areas of the light-emitting layers 123 where the row banks 122X are not present are the self-luminous areas 100a, and areas above side and top surfaces 122Xb of the row banks 122X are the non-self-luminous areas 100b.

As previously described, in the different colors of the sub-pixels 100se are different colors of the light-emitting layers 123 between the pixel electrodes 119 and the counter electrode 125, forming optical resonator structures in which light from the light-emitting layers 123 resonates and is emitted from the counter electrode 125 side. In other words, light emitted from each of the light-emitting layers 123R, 123G, 123B, reflected by the pixel electrodes 119, and emitted upwards through the counter electrode 125 constructively interferes with light emitted from each of the light-emitting layers 123R, 123G, 123B directly upwards through the counter electrode 125 to be mutually strengthened. Thus, in order to set the optical distances between the top surfaces of the light-emitting layers 123 and the top surfaces of the pixel electrodes 119 according to wavelengths of light emitted from the light-emitting layers 123R, 123G, 123B to achieve constructive interference of light components of corresponding colors, film thicknesses of the light-emitting layers 123R, 123G, 123B and the hole transport layers 121R, 121G, 121B are made to be different for each color of sub-pixel.

The light-emitting layers 123 extend continuously not just in the self-luminous areas 100a, but also in the non-self-luminous areas 100b that are adjacent. When the light-emitting layers 123 are formed, ink applied to the self-luminous areas 100a can flow in the column direction via ink applied to the non-self-luminous areas 100b, which can even out film thickness among pixels in the column direction. However, in the non-self-luminous areas 100b, the row banks 122X suppress ink flow by an appropriate amount. Accordingly, a large amount of unevenness in film thickness is unlikely to occur, improving evenness of luminance for the pixels.

[Electron Transport Layer 124]

As illustrated in FIG. 2 and FIG. 3, the electron transport layer 124 covers the column banks 122Y and the light-emitting layers 123 in the gaps 122z defined by the column banks 122Y The electron transport layer 124 is continuous across at least an entire display area of the display panel 10.

The electron transport layer 124 has a function of transporting electrons from the counter electrode 125 to the light emitting layers 123 and a function of restricting injection of electrons into the light emitting layers 123.

[Counter Electrode 125]

As illustrated in FIG. 2 and FIG. 3, the counter electrode 123 is formed on the electron transport layer 124. The counter electrode 125 is an electrode common to all of the light-emitting layers 123. The counter electrode 125 is paired with the pixel electrodes 119 to form energization paths sandwiching the light emitting layers 123. The counter electrode 125 supplies carriers to the light emitting layers 123, for example, when functioning as a cathode, the counter electrode 125 supplies electrons to the light emitting layers 123.

[Sealing Layer 126]

The sealing layer 126 is laminated on the counter electrode 125 so as to cover the counter electrode 125. The sealing layer 126 is for preventing the light emitting layers 123 from deteriorating due to contact with moisture, air, or the like. The sealing layer 126 is disposed to cover the top surface of the counter electrode 125. The sealing layer must be highly light-transmissive in order to secure good light extraction as a display.

(Materials of Light-Emitting Element Section)

Examples of materials of each of the light-emitting element sections are provided below.

[Substrate 100x (TFT Substrate)]

As the base, for example, a glass substrate, a quartz substrate, a silicon substrate, a metal substrate such as molybdenum sulfide, copper, zinc, aluminum, stainless steel, magnesium, iron, nickel, gold, silver, or the like, a semiconductor substrate such as gallium arsenide, a plastic substrate, or the like can be used.

The TFT layer includes TFT circuits formed on the base, an inorganic insulating layer (not illustrated) formed on the TFT circuits, and the planarization layer 118. Each TFT circuit has a multilayer structure including an electrode, a semiconductor layer, and an insulating layer formed on a top surface of the base.

Known materials can be used for gate electrodes, gate insulating layers, channel layers, channel protective layers, source electrodes, drain electrodes, and the like that are included in the TFT layer.

As a material of the planarizing layer 118, an organic compound such as a polyimide resin, an acrylic resin, a siloxane resin, a novolac resin, or the like can be used.

[Pixel Electrodes 119]

The pixel electrodes 119 are made of a metal material. In the case of a top-emission type of display panel, such as the display panel 10 pertaining to the present embodiment, chromaticity is adjusted and brightness is increased for emitted light due to adoption of the optical resonator structure in which film thicknesses are appropriately set, and therefore surface portions of the pixel electrodes 119 have high reflectivity. According to the display panel 10 pertaining to the present embodiment, the pixel electrodes 119 each have a structure comprising multiple layers selected from metal layers, composite layers, and light-transmissive electrically conductive layers. According to at least one embodiment, a metal layer is made of a material having a small sheet resistance and high light reflectivity, for example, a metal material including aluminum (Al). An aluminum (Al) alloy has a high reflectance of 80% to 95% and a low electrical resistivity of $2.82 \times 10^{-8}$ (10 nΩm), and is suitable as a material of the pixel electrode 119. Further, in view of cost, a metal layer or alloy layer according to at least one embodiment includes aluminum as a main component.

Aside from aluminum, in view of high reflectance, a metal layer or alloy layer according to at least one embodiment is made of silver or an alloy including silver.

[Hole Injection Layers 120]

The hole injection layers 120 include, for example, an oxide of silver (Ag), molybdenum (Mo), chromium (Cr), vanadium (V), tungsten (W), nickel (Ni), iridium (Ir), or the like. If the hole injection layers 120 are made of a transition metal oxide, multiple valences are taken, achieving a plurality of energy levels, and as a result, hole injection can be facilitated and drive voltage can be reduced.

According to at least one embodiment, the hole injection layers 120 are each a tungsten oxide layer having a film thickness from 2 nm to 30 nm. According to the present embodiment, the film thickness is 10 nm. According to at least one embodiment, the hole injection layers 120 are made of tungsten oxide, but also contain a trace amount of impurities.

According to at least one embodiment, the hole injection layers 120 are made from a coating applied as an organic polymer solution of a conductive polymer material such as poly(3,4-ethylenedioxythiophene) polystyrene sulfonate (PEDOT:PSS).

[Banks 122]

According to at least one embodiment, the banks 122 are made using an organic material such as a resin and are electrical insulators. Examples of the organic material used in forming the banks 122 include acrylic resin, polyimide resin, novolac phenolic resin, or the like. According to at least one embodiment, the banks 122 have organic solvent resistance. According to at least one embodiment, acrylic resin is used. Acrylic resin has a low refractive index and is suitable as a reflector.

Alternatively, when an inorganic material is used for the banks 122, according to at least one embodiment, silicon oxide (SiO) is used in view of the refractive index. According to at least one embodiment, silicon nitride (SiN), silicon oxynitride (SiON), or the like is used as an inorganic material.

Further, according to at least one embodiment, surfaces are treated with fluorine to impart water repellency. According to at least one embodiment, a material containing fluoride is used in forming the banks 122. Further, in order to reduce water repellency on a surface of the banks 122, according to at least one embodiment, the banks 122 are irradiated with ultraviolet light and baked at a low temperature.

[Hole Transport Layers 121]

For the hole transport layers 121, for example, a polyfluorene or a derivative thereof, a polymer compound such as a polyarylamine, which is an amine organic polymer, or a derivative thereof, poly(9,9-di-n-octylfluorene-alt-(1,4-phenylene-((4-sec-butylphenyl)imino)-1,4-phenylene) (TFB), or the like can be used.

[Light-Emitting Layers 123]

Each of the light emitting layers 123 has a function of emitting light generated by an excited state caused by recombination of injected holes and electrons when a voltage is applied. As a material of the light-emitting layers 123, a light-emitting organic material that can be formed into a film by a wet printing method is required.

In particular, for example as disclosed in JP H5-163488 and according to at least one embodiment, the light emitting layers 122 are formed by using a fluorescent substance such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, rare earth metal complex, or the like.

[Electron Transport Layer 124]

According to at least one embodiment, an organic material having a high electron transport property is used for the electron transport layer 124. According to at least one embodiment, the electron transport layer 124 includes a layer made of sodium fluoride. An example of an organic material used for the electron transport layer 124 is a π electron low molecular weight organic material such as an oxadiazole derivative (OXD), a triazole derivative (TAZ), a phenanthroline derivative (BCP, Bphen), or the like.

Further, according to at least one embodiment, the electron transport layer 124 includes a layer of the organic material doped with a metal dopant selected from alkali metals or alkaline earth metals.

[Counter Electrode 125]

The counter electrode 125 is formed by using silver (Ag), aluminum (Al), or the like as a thin film electrode.

A light-transmissive electrically-conductive material is used for the counter electrode 125. For example, indium tin oxide (ITO) or indium zinc oxide (IZO) is used.

[Sealing Layer 126]

In the case of a top-emission type of display, the sealing layer 126 is made of a light-transmissive material. According to at least one embodiment, silicon nitride (SiN), silicon oxynitride (SiON), or the like is used as the light-transmissive material. Further, according to at least one embodiment, a sealing resin layer made of a resin material such as acrylic resin, silicone resin, or the like is provided on the layer made using silicon nitride (SiN), silicon oxynitride (SiON), or the like.

(Components of Front Plate 131)

[Upper Substrate 130]

The front plate 131, which includes the upper substrate 130 and the color filter layer 132, is disposed on and joined to the joining layer 127. In a top-emission type of display panel, for example, a light-transmissive material such as cover glass, light-transmissive resin film, or the like is used for the upper substrate 130. Further, the upper substrate 130 can improve rigidity of the display panel 10, and help prevent intrusion of moisture, air, and the like. As the upper substrate 130, according to at least one embodiment, a light-transmissive material such as a glass substrate, a quartz substrate, a plastic substrate or the like is used.

[Color Filter Layer 132]

The color filter layer 132 is formed on the upper substrate 130 at positions corresponding to each of the self-luminous areas 100a of sub-pixels. The color filter layer 132 is a light-transmissive layer that allows transmission of visible light of wavelengths corresponding to R, G, and B and has a function of transmitting light emitted from each color pixel to correct chromaticity of the transmitted light. According to the present embodiment, materials 132R, 132G, 132B of the color filter layer for red, green, and blue are formed above the self-luminous area 100aR in the red gaps 122zR, above the self-luminous area 100aG in the green gaps 122zG, and above the self-luminous area 100aB in the blue gaps 122zB. As the color filter layer 132, a known resin material (as a commercially available product example, color resists manufactured by JSR Corporation) or the like can be used. According to at least one embodiment, film thickness of the color filter layer 132 is from 1 μm to 4 μm. More specifically, for example, the color filter layer 132 is formed by applying inks each containing a color filter layer material and a solvent to a plurality of openings, on the upper substrate 130, in order to form the color filter layer 132 as a matrix of sub-pixel units.

[Light-Shielding Film 133]

As illustrated in FIG. 2 and FIG. 3, the openings 133a are provided at positions corresponding to the self-luminous areas 100a of sub-pixels, and the light-shielding film 133 is formed on the upper substrate 130 to cover positions above the column banks 122Y corresponding to boundaries in the row direction between the self-luminous areas 100a of sub-pixels, and to cover positions above the row banks 122X corresponding to boundaries in the column direction between the self-luminous areas 100a of sub-pixels.

The light-shielding film 133 is a black resin layer provided to prevent transmission of visible light of wavelengths corresponding to R, G, and B. According to at least one embodiment, the light-shielding film 133 is made of a resin material including black pigment with excellent light absorption and light-shielding properties. According to at least one embodiment, the light-shielding film 133 is made of a resin material that is primarily an ultraviolet curable resin (for example, ultraviolet curable acrylic resin) material to which a light-shielding black pigment is added, such as carbon black pigment, titanium black pigment, metal oxide pigment, organic pigment, or the like.

In the display panel 10, a position in an emission direction of an upper end of an edge of an opening of the light-shielding film 133 corresponding to a light-emitting element 100 is different, depending on an emission color of the light-emitting element 100. Thus, in the display panel 10, an optical distance between a light emission reference point of the light-emitting element 100 and an upper end of the light-shielding film 133 corresponding to the light-emitting element 100 is different depending on a light emission color of the light-emitting element 100. According to at least one embodiment, the optical distance is a maximum distance in the emission direction between the light emission reference point of the light-emitting element 100 and an edge of the opening 133a of the light-shielding film 133 corresponding to the light-emitting element 100.

According to at least one embodiment, the light emission reference point of the light-emitting element 100 is any reference point of a functional layer that allows the light-emitting elements 100R, 100G, 100B to be compared based on the same reference point. According to the present embodiment, the light emission reference point is an edge between the hole injection layer 120 formed by a vapor phase growth method and the hole transport layer 121 formed by an application method. However, the light emission reference point may be, for example, any of a boundary between the hole injection layer 120 and the pixel electrode 119, a boundary between the hole injection layer 120 and the hole transport layer 121, and a boundary between the hole transport layer 121 and the light-emitting layer 123. According to at least one embodiment, the light emission reference point is a center position in the thickness direction of the light-emitting layer 123, or a position where luminance in the thickness direction of the light-emitting layer 123 is maximum (a light emission center).

More specifically, in the display panel 10, the light-shielding film 133 is provided with thickened portions 1331 around the openings 133a of base portions 1330 corresponding to the light-emitting elements 100B. As a result, in the display panel 10, the optical distance between the light emission reference points of the light-emitting elements 100B and the light-shielding film 133 corresponding to the light-emitting elements 100B is larger than the optical distance between the light emission reference points of the light-emitting elements 100R, 100G and the light-shielding film 133 corresponding to the light-emitting elements 100R, 100G. More specifically, in the display panel 10, in the emission direction, a maximum distance LB is larger than maximum distances LR, LG, where the maximum distance LB is between a boundary between the hole injection layer 120 and the hole transport layer 121 of any one of the light-emitting elements 100B and an edge of the opening 133a of the light-shielding film 133 (thickened portion 1331) corresponding to the light-emitting element 100B, and each of the maximum distances LR, LG is between a boundary between the hole injection layer 120 and the hole transport layer 121 of any one of the light-emitting elements 100R, 100G, respectively, and an edge of the opening 133a of the light-shielding film 133 (base portion 1330) corresponding to the light-emitting element 100R, 100G.

According to at least one embodiment, film thickness of the light shielding film 133 and film thickness of the thickened portion 1331 are each from 1 μm to 2 μm.

[Joining Layer 127]

Above the sealing layer 126 in the Z axis direction is the front plate 131 including the upper substrate 130 and the color filter layer 132 disposed below the upper substrate 130. The front plate 131 is joined to the sealing layer 126 by the joining layer 127. The joining layer 127 has a function of joining the front plate 131 to the layers from the substrate 100x to the sealing layer 126, and has a function of preventing each layer from being exposed to moisture and air. According to at least one embodiment, the joining layer 127 is made of a resin adhesive. According to at least one embodiment, the joining layer 127 is made of a light-transmissive resin material such as acrylic resin, silicone resin, epoxy resin, or the like.

<Method of Manufacturing Display Panel 10>

The following describes a method of manufacturing the display panel 10, with reference to FIG. 4 to FIG. 10B. FIG. 4 is a flowchart of a method of manufacturing the organic EL display panel 10 according to at least one embodiment. Each of the drawings in FIG. 5A to FIG. 10B is a schematic diagram of a cross section taken at a position corresponding to A1-A1 in FIG. 1, illustrating a state in the method of manufacturing the display panel 10.

[Preparing Substrate 100x]

The substrate 100x is prepared, on which TFTs and wiring are formed. The substrate 100x can be manufactured by a known method of manufacturing TFTs (step S1 in FIG. 4; FIG. 5A).

[Forming Planarizing Layer 118]

The planarizing layer 118 is formed by coating the substrate 100x with a component material (photosensitive resin material) of the planarizing layer 118 as a photoresist, and by planarizing the coated surface (step S2 in FIG. 4; FIG. 5B). More specifically, a resin material having a certain fluidity is applied by, for example, a die coating method along a top surface of the substrate 100x so as to fill unevenness of the substrate 100x caused by the TFT layer. Thus, the top surface of the planarizing layer 118 is planarized.

Contact holes (not illustrated) are formed by dry etching of the planarizing layer 118 at locations corresponding to TFT elements, for example above source electrodes. The contact holes are formed by using patterning or the like, so that the bottoms of the contact holes expose top surfaces of the source electrodes.

Subsequently, connecting electrode layers are formed along inner walls of the contact holes. A portion of each of the connecting electrodes is disposed on the planarizing layer 118.

[Forming Pixel Electrodes 119, Hole Injection Layers 120]

The following describes forming of the pixel electrodes 119 and the hole injection layers 120 (FIG. 4, step S3).

After forming the planarizing layer 118, a surface of the planarizing layer 118 is dry-etched to perform pre-film forming cleaning.

Next, after pre-film forming cleaning of the planarizing layer 118, a pixel electrode metal film 119x for forming the pixel electrodes 119 is formed on the top surface of the planarizing layer 118 by a vapor phase growth method such as a sputtering method or vacuum deposition method (FIG. 5C). According to the present embodiment, the metal film 119x is made of aluminum or an alloy that is primarily aluminum by using a sputtering method.

Further, after pre-film forming cleaning of a surface of the metal film 119x, a hole injection layer metal film 120' for forming the hole injection layers 120 is formed on the surface of the metal film 119x by a vapor deposition method in a vacuum environment (FIG. 5D). According to the present embodiment, the metal film 120' is formed by sputtering tungsten.

Figure 6A:
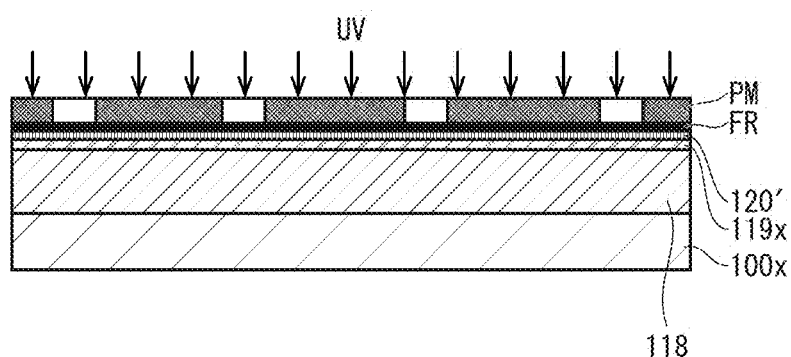
FIGS. 6A, 6B, 6C, and 6D are schematic diagrams of cross-sections taken from the same location as A1-A1 in FIG. 1, illustrating states in manufacturing of the organic EL display panel 10, according to at least one embodiment.

Subsequently, after applying a photoresist layer FR made of a photosensitive resin or the like, a photomask PM provided with defined openings is disposed thereon and irradiated with ultraviolet light to expose the photoresist and transfer the pattern of the photomask to the photoresist (FIG. 6A). Next, the photoresist layer FR is patterned by developing.

Next, through the patterned photoresist layer FR, the metal film 120' is subjected to dry etching processing to perform patterning, forming the hole injection layers 120.

Next, through the patterned photoresist layer FR, the metal film 119x is subjected to wet etching processing to perform patterning, forming the pixel electrodes 119.

According to at least one embodiment, the hole injection layers 120 and the pixel electrodes 119 are processed at the same time by dry etching.

Figure 6B:
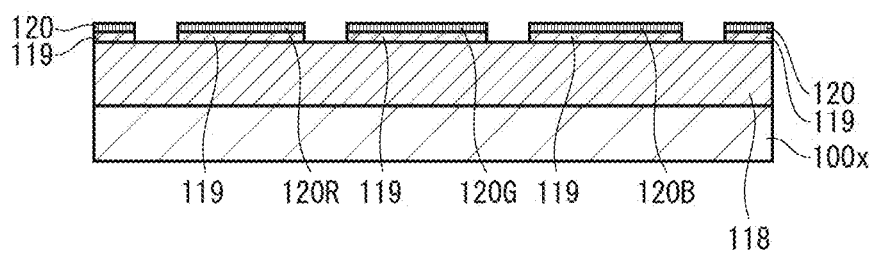

Finally, the photoresist layer FR is peeled off to leave behind laminated layers of the pixel electrodes 119 and the hole injection layers 120 (FIG. 6B).

[Forming the Banks 122]

Figure 6C:
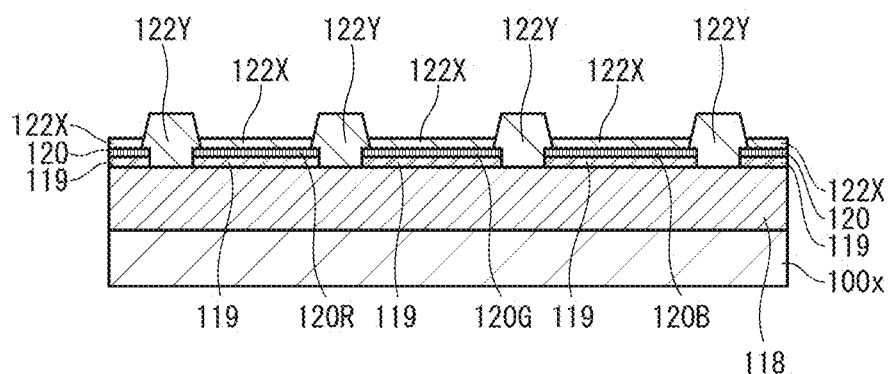

After forming the hole injection layers 120, the banks 122 are formed covering the hole injection layers 120. In forming the banks 122, the row banks 122X are formed first, and subsequently the column banks 122Y are formed so as to define the gaps 122z (FIG. 4, step S4; FIG. 6C).

In forming the row banks 122X, a film made of a material of the row banks 122X (for example, a photosensitive resin material) is laminated on the hole injection layers 120 and the planarizing layer 118 by using a spin coating method or the like. The film is then patterned to form the row banks 122X.

The patterning of the row banks 122X is achieved by exposure using a photomask above the film, then performing developing and baking steps (at approximately 230° C. for approximately 60 minutes).

In forming the column banks 122Y, a film made of a material of the column banks 122Y (for example, a photosensitive resin material) is laminated on the hole injection layers 120, the row banks 122X, and the planarizing layer 118 by using a spin coating method or the like. Then the column banks 122Y are formed by exposure using a photomask above the film, then developing to form the column banks 122Yz.

More specifically, according to at least one embodiment, the method of forming the column banks 122Y is first to form a photosensitive resin film made of an organic photosensitive resin material such as acrylic resin, polyimide resin, novolac phenolic resin, or the like, then drying the resin film, and after a solvent of the resin film is evaporated to a defined extent, a photomask provided with defined openings is overlaid, and the photomask and photoresist made of the photosensitive resin are irradiated with ultraviolet light, transferring the pattern of the photomask to the photoresist.

Next, the photosensitive resin is developed and a resulting patterned insulating layer is baked (at approximately 230° C. for approximately 60 minutes) to form the column banks 122Y.

As described above, the hole injection layers 120 are formed by forming a film made of metal (for example, tungsten) by using a vapor phase growth method such as sputtering or vacuum deposition then using photolithography and etching to pattern each pixel unit, but in the baking process for the row banks 122X and the column banks 122Y, the metal of the hole injection layers 120 is oxidized and the hole injection layers 120 are actually completed.

[Forming Organic Functional Layers]

Figure 6D:
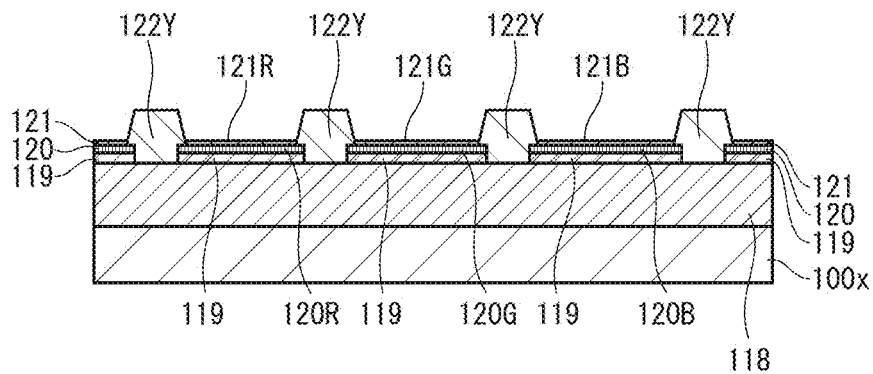
Figure 7A:
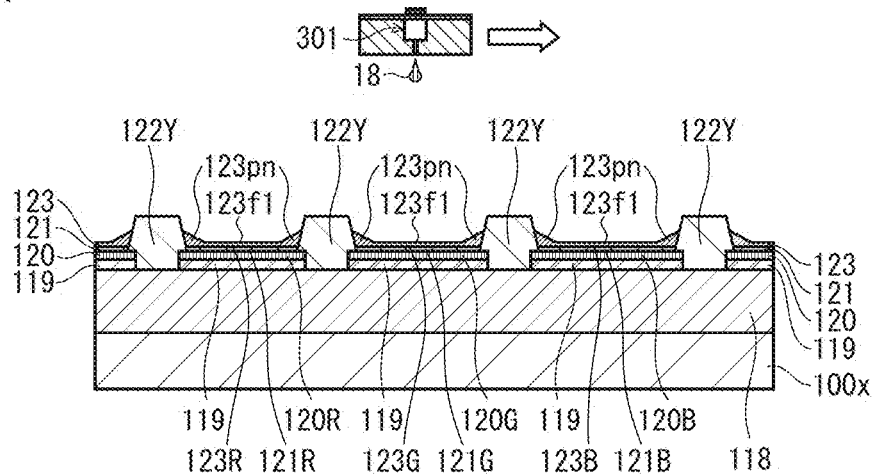
FIGS. 7A, 7B, 7C, and 7D are schematic diagrams of cross-sections taken from the same location as A1-A1 in FIG. 1, illustrating states in manufacturing of the organic EL display panel 10, according to at least one embodiment.

The hole transport layers 121 and the light emitting layers 123 are laminated in this order on the hole injection layers 120 formed in the gaps 122z defined by the column banks 122Y, including on the row banks 122X (FIG. 4, steps S6, S7; FIG. 6D and FIG. 7A).

Using an inkjet method, inks containing an electrically conductive polymer material such as poly(3,4-ethylenedioxythiophene) polystyrene sulfonate (PEDOT:PSS) are applied to upper surfaces of the hole injection layers 120 in the gaps 122z defined by the column banks 122Y, then a solvent is volatized or baked. Subsequently, according to at least one embodiment, photolithography and etching is used to pattern pixel units to form upper layers of the hole transport layers 121.

The hole transport layers 121 are formed by using a wet process such an inkjet method or gravure printing method to apply ink including a material of the hole transport layers 121 into the gaps 122z defined by the column banks 122Y, then removing a solvent of the ink by volatilization or by baking.

The light emitting layers 123 are formed by using an inkjet method to apply inks including materials of the light emitting layers 123 into the gaps 122z defined by the column banks 122Y, then baking (FIG. 4, step S6; FIG. 7A). More specifically, the substrate 100x is placed on an operation table of a droplet discharge device such that the column banks 122Y are aligned along the Y direction, and an inkjet head 301 in which nozzle holes are lined up along the Y direction (Y axis in FIG. 7A) is moved relative to the substrate 100x in the X direction while ink droplets 18 are discharged from the nozzle holes aimed at landing targets set within the gaps 122z between the column banks 122Y.

In this process, inks 123RI, 123GI, 123BI each containing a corresponding organic light-emitting layer material for red, green, or blue is discharged into corresponding ones of the gaps 122z, the inks are baked under low pressure, and the light-emitting layers 123R, 123G, 123B are formed by the baking. In applying the inks of the light-emitting layers 123, first, an ink for forming the light-emitting layers 123 is applied using the droplet discharge device.

Upon completion of application of ink for forming any one of the red light emitting layers, the green light emitting layers, and the blue light emitting layers with respect to the substrate 100x, another color of ink is applied with respect to the substrate 100x, then the third color of ink is applied. By repeating this process, three colors of ink are applied in order. As a result, red light-emitting layers, green light-emitting layers, and blue light-emitting layers are formed on the substrate 100x by repetition in the X axis direction.

Note that the method for forming the hole transport layers 121 and the light emitting layers 123 is not limited to a method described above, and known methods such as a dispenser method, a nozzle coating method, a spin coating method, intaglio printing, relief printing, and the like may be used to drop and/or apply ink.

[Forming Electron Transport Layer 124]

Figure 7B:
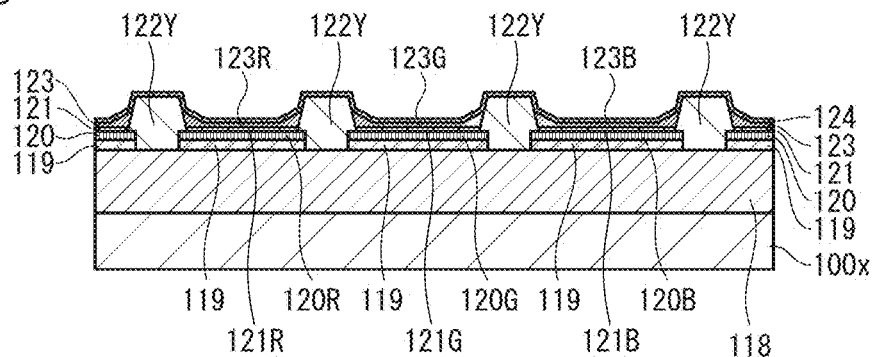

After forming the light-emitting layers 123, the electron transport layer 124 is formed across an entire light-emission area (display area) of the display panel 10 by a vacuum deposition method or the like (FIG. 4, step S8; FIG. 7B). Reasons for using vacuum deposition are to avoid damage to the light emitting layers 123, which are organic, and because, in a vacuum deposition method performed under high vacuum, molecules to form a film proceed directly in a direction normal to the substrate. The electron transport layer 124 is formed by depositing a metal oxide or fluoride on the light emitting layers 123 by a vacuum deposition method or the like, and further depositing an organic material and a metal material by a co-evaporation deposition method. Note that film thickness of the electron transport layer 124 is set to be a film thickness most appropriate for optical light extraction.

[Forming Counter Electrode 125]

Figure 7C:
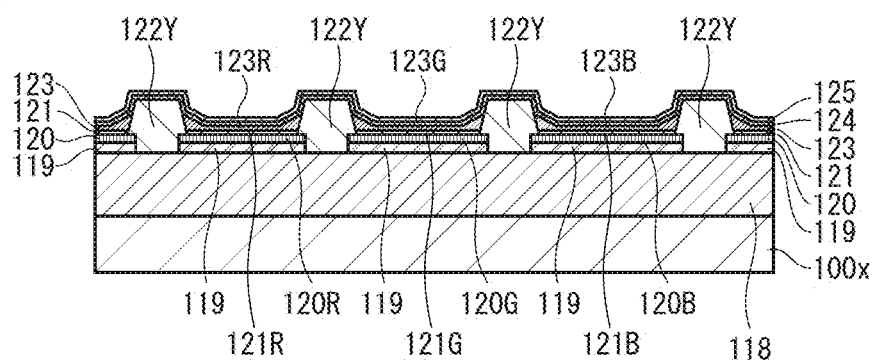

After forming the electron transport layer 124, the counter electrode 125 is formed so as to cover the electron transport layer 124 (FIG. 4, step S9; FIG. 7C).

The counter electrode 125 is formed by a chemical vapor deposition (CVD) method, a sputtering method, or a vacuum deposition method to cover the electron transport layer 124. According to the present embodiment, the counter electrode 125 is formed by deposition of silver by a vacuum deposition method.

Next, a light-transmissive electrically conductive layer of ITO, IZO, or the like is formed by using a sputtering method.

[Forming Sealing Layer 126]

Figure 7D:
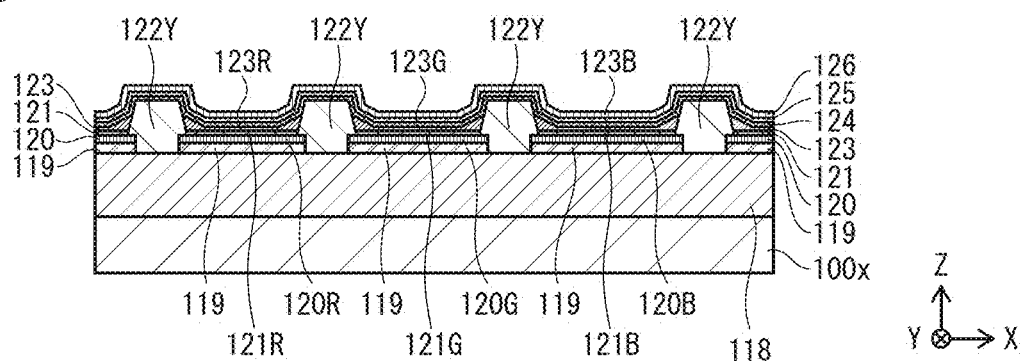

The sealing layer 126 is formed so as to cover the counter electrode 125 (FIG. 4, step S10; FIG. 7D). According to at least one embodiment, the sealing layer 126 is formed by using a CVD method, a sputtering method, or the like.

[Forming Front Plate 131]

The following describes the method of manufacturing the front plate 131 referred to as step S10 in FIG. 4. FIG. 8A, 8B, 8C, 8D, 8D, 9A, 9B, 9C, 9D are schematic diagrams of cross-sections taken from the same location as A1-A1 in FIG. 1, illustrating states in manufacturing of the organic EL display panel 10, according to at least one embodiment.

Figure 8A:
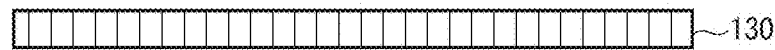
FIGS. 8A, 8B, 8C, 8D, and 8E are schematic diagrams of cross-sections taken from the same location as A1-A1 in FIG. 1, illustrating states in manufacturing of the organic EL display panel 10, according to at least one embodiment.
Figure 8B:
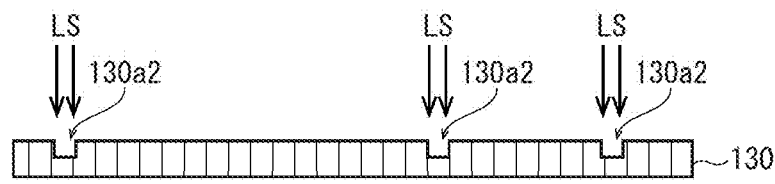

First, a light-transmissive upper substrate 130 is prepared (FIG. 8A), then a top surface of the upper substrate 130 is irradiated by a laser LS at positions where the thickened portions 1331 of the light-shielding film 133 are to be formed, forming recesses 133a in the top surface of the upper substrate 130 (FIG. 8B).

Figure 8C:

Next, a light-shielding film material (133') including an ultraviolet light curable resin (for example an ultraviolet light curable acrylic resin) as a main component and a black pigment is applied to a surface of the upper substrate 130 (FIG. 8C).

Figure 8D:
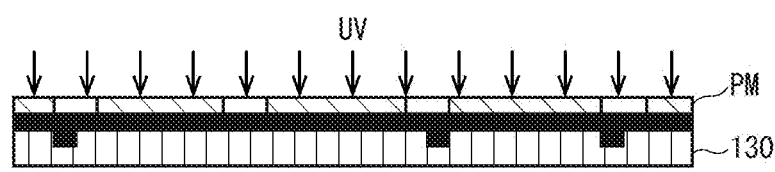

A pattern mask PM having defined openings is overlaid on an upper surface of the light shielding film material 133' and is irradiated from above with ultraviolet light (FIG. 8D).

Figure 8E:
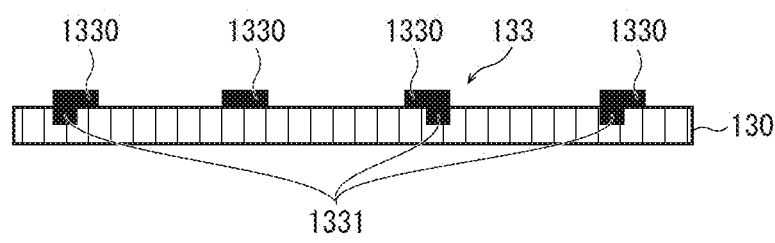

Then, by removing the pattern mask PM and uncured portions of the light shielding layer material film 133', developing, and curing, the light shielding layer 133 is completed (FIG. 8E). The light shielding film 133 is patterned to correspond to boundaries in the row and column directions between the self-luminous areas 100a of sub-pixels above the banks 122 formed on the substrate 100x, when the light shielding film 133 faces the substrate 100x. The light-shielding film 133 includes the base portions 1330 formed on the top surface of the upper substrate 130 and the thickened portions 1331 formed in the recesses. The thickened portions 1331 are disposed to correspond to peripheries of the openings 133a corresponding to the light-emitting elements 100n.

Next, for example, the material 132G of the color filter layer 132 with ultraviolet light curable resin as a main component is applied on a surface of the upper substrate 130 on which the light shielding layer 133 is formed (FIG. 9A), then a defined pattern mask PM is placed and ultraviolet light irradiation is performed (FIG. 9B).

Subsequently, curing is performed, and the pattern mask PM and uncured portions of the material 132G are removed by developing to form the color filter layer 132(G) (FIG. 9C).

By repeating this process for each color of color filter material, the color filter layer 132(R)(B) is formed (FIG. 9D). Each portion of the color filter layer 132B is disposed inside of the thickened portions 1331 of the light-shielding film 133. In this way, the front plate 131 is completed.

[Joining Front Plate 131 and Back Panel]

Figure 10A:
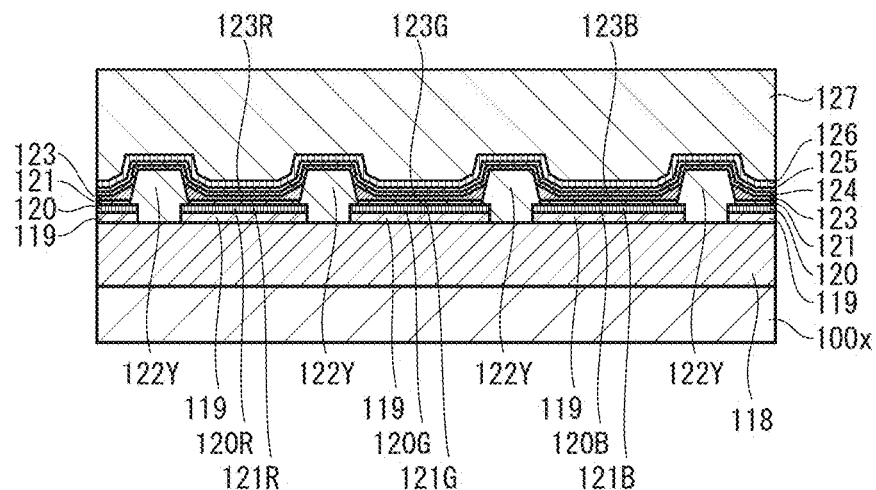
FIGS. 10A and 10B are schematic diagrams of cross-sections taken from the same location as A1-A1 in FIG. 1, illustrating states in manufacturing of the organic EL display panel 10, according to at least one embodiment.

Next, a material of the joining layer 127 that includes an ultraviolet light curable resin as a main component, such as acrylic resin, silicone resin, epoxy resin, or the like, is applied to a back panel that includes every layer from the substrate 100x to the sealing layer 126 (FIG. 10A).

Figure 10B:
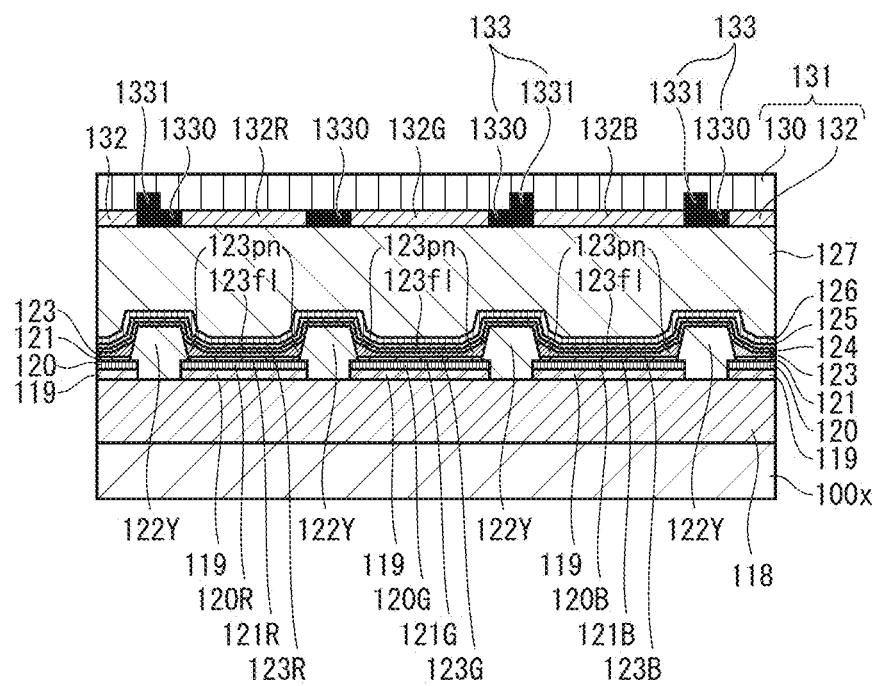

Next, the applied material is irradiated with ultraviolet light, and the back panel and the front panel 131 are joined while matching positions relative to each other. Care is taken that gas does not enter between the back panel and the front panel 131. Subsequently, when both panels are baked and a sealing process is completed, the display panel 10 is completed (FIG. 10B).

The light shielding film 133 on the front plate 131 is aligned to correspond to boundaries in the row and column directions between the self-luminous areas 100a of sub-pixels above the banks 122 formed on the substrate 100x.

Effects

The following describes effects of the display panel 10.

Figure 12A:
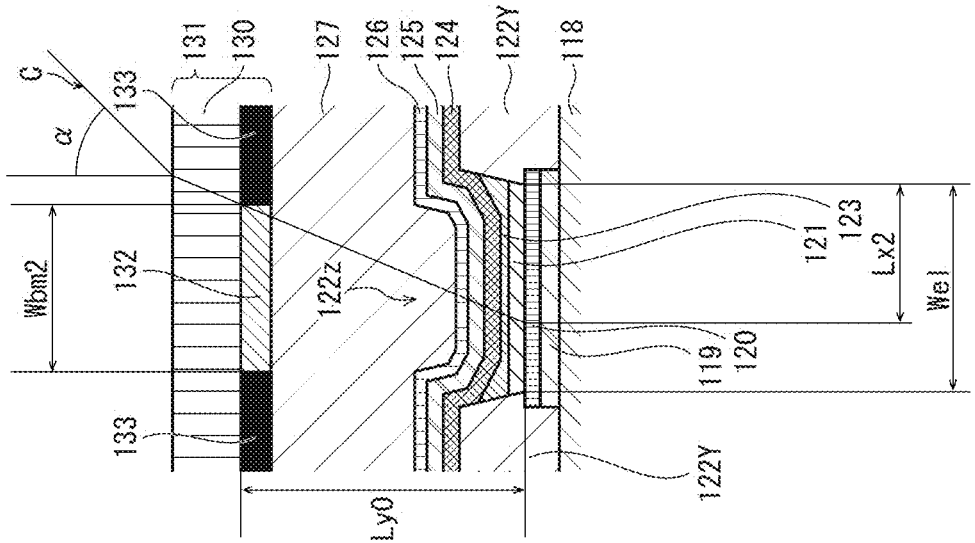
FIGS. 12A and 12B are enlarged schematic diagrams of cross-sections of light-emitting elements of reference examples in which widths of openings 133a of a light shielding film 133 are different.
Figure 12B:
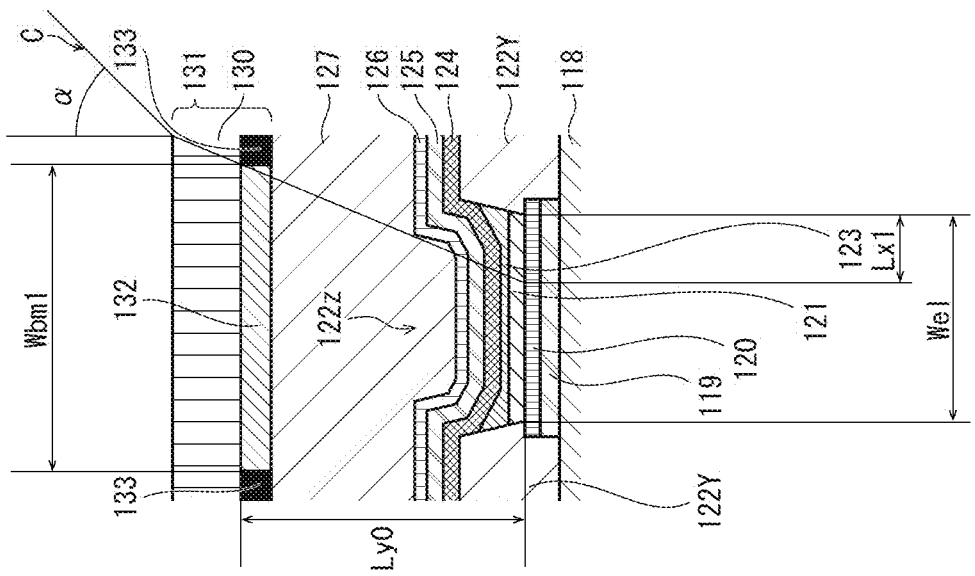

FIGS. 11A, 11B, and 11C are diagrams of cross-sections of light-emitting elements 100 in the organic EL display panel 10, in which optical distances between light emission reference points and the light shielding film 133 are different. FIGS. 12A and 12B are enlarged schematic diagrams of cross-sections of light-emitting elements of reference examples in which widths of the openings 133a of the light-shielding film 133 are different. As described above, the reference points are edge portions of the hole transport layers 120 and the hole transport layer 121.

First, as illustrated in FIG. 11A, in the display panel 10, when a light-emitting element width is Wel, a width of the opening 133a of the light-shielding film 133 is Wbm0, and an optical distance between the light emission reference point and the light-shielding film 133 is Ly0, a light-shielding width when viewed from a direction of a line of sight C at a viewing angle α is Lx0, and a light-shielding ratio with respect to the light-emitting element width Wel is Lx0/Wel.

The display panel 10 illustrated in FIG. 11A can be compared with a reference example in which the width Wbm0 of the opening 133a of the light-shielding film 133 is changed in order to change the light-shielding width Lx0 and the light-shielding ratio Lx0/Wel.

For example, as illustrated in FIG. 12A, when the width Wbm0 of the opening 133a of the light shielding film 133 is increased to the width Wbm1, the shielding width Lx0 when viewed from the viewing angle α becomes Lx1, which is smaller, and the light shielding ratio becomes Lx1/Wel, which is smaller than Lx0/Wel. When the width Wbm1 of the opening 133a of the light-shielding film 133 is increased with respect to the light-emitting element width Wel, there is a risk that the column bank 122Y is exposed via the opening 133a and external light reflection increases. Alternatively, an increase in the opening width Wbm1 may be limited to secure a minimum line width of the light-shielding film 133, such that the light-shielding width and the light-shielding ratio are not sufficiently increased.

As illustrated in FIG. 12B, when the width Wbm0 of the opening 133a of the light shielding film 133 is decreased to the width Wbm2, the shielding width Lx0 when viewed from the viewing angle α becomes Lx2, which is larger, and the light shielding ratio becomes Lx2/Wel, which is larger than Lx0/Wel. When the width Wbm2 of the opening 133a of the light-shielding film 133 is decreased with respect to the light-emitting element width Wel, the opening ratio of the light-emitting element 100 decreases, and there is a risk that when joining the front plate 131 to the back panel, the margin for error in alignment of light-shielding film 133 on the front plate 131 to the sub-pixels 100se of the back panel becomes small, which makes manufacture difficult.

In contrast, in the display panel 10 as illustrated in FIG. 11B, the light-shielding film 133 is provided below the color filter layer 132, moving the position of the light-shielding film 133 downwards such that the optical distance between the light emission reference point and the light-shielding film 133 is Ly1, which is shorter than Ly0, and therefore the light-shielding width when viewed from the viewing angle α becomes Lx1, which is smaller than Lx0, and the light-shielding ratio becomes Lx1/Wel, which is smaller than Lx0/Wel. In this case, the light-emitting element width Wel, the width Wbm0 of the opening 133a of the light-shielding film 133, and the relative positions of the light-emitting element 100 and the opening 133a of the light-shielding film 133 do not change.

Further, as illustrated in FIG. 11C, in the display panel 10, a portion of the light-shielding film (thickened portion 1331) is provided in the upper substrate 130 to move a position of the light-shielding film 133 upwards, such that the optical distance between the light emission reference point and the light-shielding film 133 is Ly2, which is longer than Ly0, and therefore the light-shielding width when viewed from the viewing angle α becomes Lx2, which is larger than Lx0, and the light-shielding ratio becomes Lx2/Wel, which is larger than Lx0/Wel. In this case also, the light-emitting element width Wel, the width Wbm0 of the opening 133a of the light-shielding film 133, and the relative positions of the light-emitting element 100 and the opening 133a of the light-shielding film 133 do not change.

According to the present embodiment, as described above, the lengths 119x(B), (G), (R) in the row direction of the pixel electrodes 119 of the light-emitting elements 100B, 100G, 100R are configured from longest (B) to shortest (R). When viewing the display panel 10X from the direction of the line of sight C at the viewing angle α, the light-shielding widths Lx and the light shielding ratios Lx/Wel with respect to the widths Wel go from largest to smallest in the order of 100B, 100G, 100R. Thus, a reduction rate in luminance visually recognized by a viewer from the light-emitting elements 100 goes from most to least in the order 100R, 100G, 100B, and therefore luminance balance from the light-emitting elements 100R, 100G, 100B changes and visually recognized chromaticity changes, and this is visually recognized as a chromaticity shift in grays and midtones when viewing from an oblique angle.

In contrast, according to the display panel 10, as described above, the base portions 1330 of the light-shielding film 133 are provided with the thickened portions 1331 around the openings 133a corresponding to the light-emitting elements 100B, and as a result, the optical distance between the light emission reference points of the light-emitting elements 100B and the light-shielding film 133 corresponding to the light-emitting elements 100B is larger than the optical distances between the light emission reference points of the light-emitting elements 100R, 100G and the light-shielding film 133 corresponding to the light-emitting elements 100R, 100G. Thus, by implementing changes in a direction that cancels out differences in light shielding ratio of the light-emitting elements 100B, 100G, 100R, the differences in light shielding ratio can be compensated for, and changes in visual recognition of chromaticity when viewed from an oblique angle can thereby be reduced.

According to the display panel 10, even when the light-shielding width Lx and the light-shielding ratio Lx/Wel are different depending on light emission color of the light-emitting elements 100, the light-emitting element width Wel, the width Wbm0 of the openings 133a of the light-shielding film 133, and the relative positions of the light-emitting elements 100 and the openings 133a of the light-shielding film 133 do not change. That is, the light-shielding width Lx and the light-shielding ratio Lx/Wel can be controlled independently of the relative positions of the light-emitting elements 100 and the openings 133a of the light-shielding film 133. Accordingly, even when the light-shielding widths Lx and the light-shielding ratios Lx/Wel are different depending on light emission color of the light-emitting elements 100, when joining the front plate 131 to the back panel, the margin for error in alignment between the light-shielding film 133 on the front plate 131 and the sub-pixels 100se on the substrate 100x does not change.

As a result, in a high definition organic EL display panel, even when pixel density is increased and unit areas of the light-emitting elements 100 are decreased, a self-luminous display panel structure can be realized that reduces changes in chromaticity of emitted light when a display image is viewed from an oblique angle of 45° or more from the front.

Review

As described above, the display panel 10 according to at least one embodiment, is a self-luminous display panel in which the pixels 100e composed of the sub-pixels 100se are arranged, including the light-emitting elements 100 and the light-shielding film 133. The light-shielding film 133 is provided with the opening 133a at positions corresponding to the light-emitting elements 100 in plan view, downstream in a light emission direction of the light-emitting elements 100. The optical distances between the light-shielding film 133 and light emission reference points of the light-emitting elements 100 are different, depending on light emission color (R, G, B) of the light-emitting elements 100. Further, according to at least one embodiment, the optical distances are each a maximum distance in the light emission direction between an edge of one of the openings 133a of the light-shielding film 133, and one of the light emission reference points of a corresponding one of the light-emitting elements 100. Further, according to at least one embodiment, positions in the light emission direction of top edges of the openings 133a of the light-shielding film 133 corresponding to the light-emitting elements 100 are different, depending on the light emission color of the light-emitting elements 100.

According to this structure, in a high definition organic EL display panel, even when pixel density is increased and unit areas of the light-emitting elements 100 are decreased, a self-luminous display panel structure can be realized that reduces changes in chromaticity of emitted light when a display image is viewed from an oblique angle.

<<Circuit Structure of Organic EL Display Device 1>>

Figure 13:
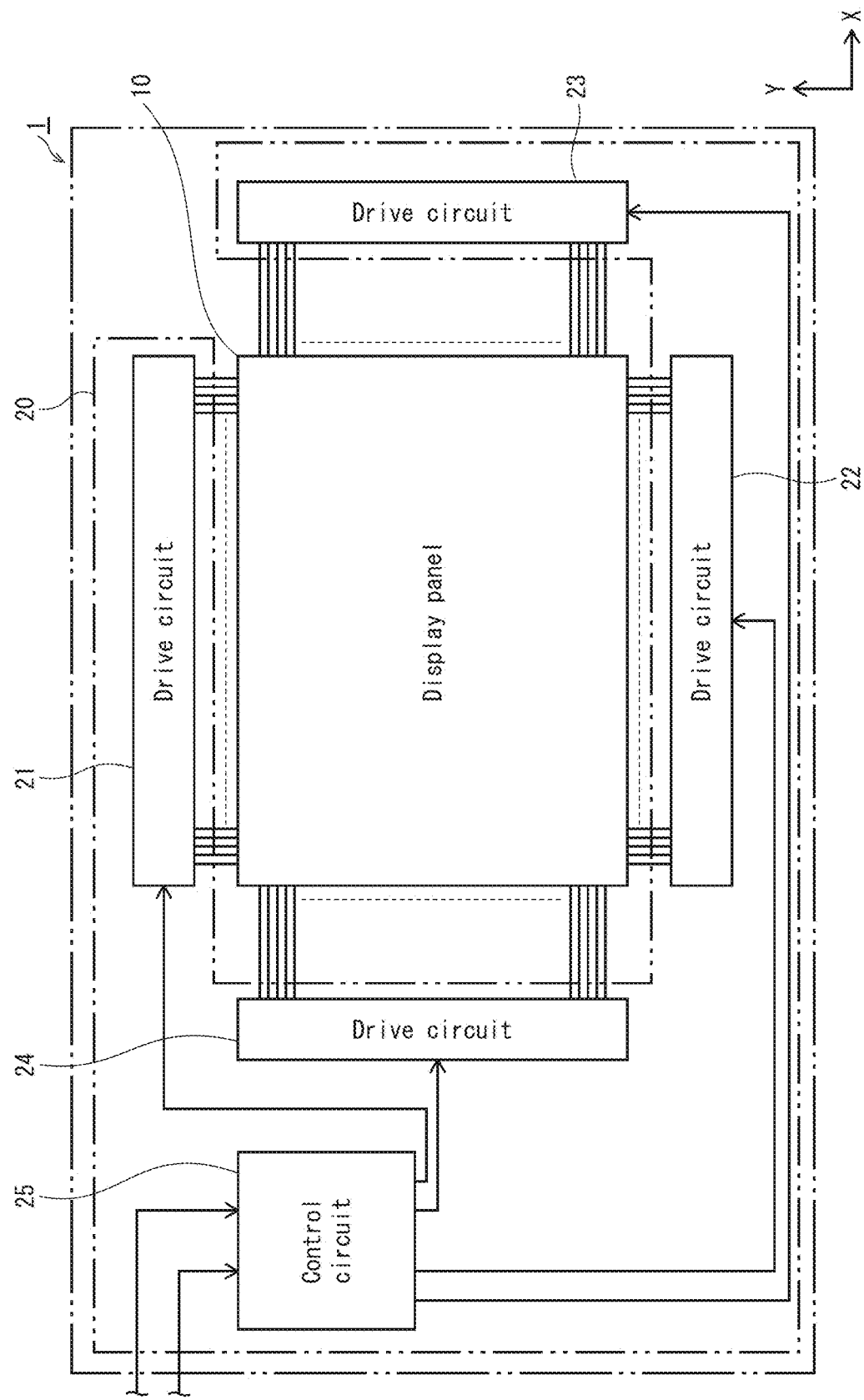
FIG. 13 is a schematic block diagram illustrating circuit structure of an organic EL display device according to at least one embodiment.

The following describes circuit structure of an organic EL display device 1 (also referred to as "display device 1") that uses the display panel 10 pertaining to at least one embodiment, with reference to FIG. 13.

As illustrated in FIG. 13, the display device 1 includes the display panel 10 and drive control circuitry 20 connected to the display panel 10.

The display panel 10 includes a plurality of organic EL elements arranged in a matrix, for example. The drive control circuitry 20 includes four drive circuits 21, 22, 23, 24 and a control circuit 25.

In the display panel 10, the pixels 100e are arranged in a matrix, forming a display area. Each of the unit pixels 100e is composed of three organic EL elements, or in other words three sub-pixels 100se that emit light in three different colors, red (R), green (G), and blue (B). Circuit structure of each of the sub-pixels 100se is described below, with reference to FIG. 14.

Figure 14:
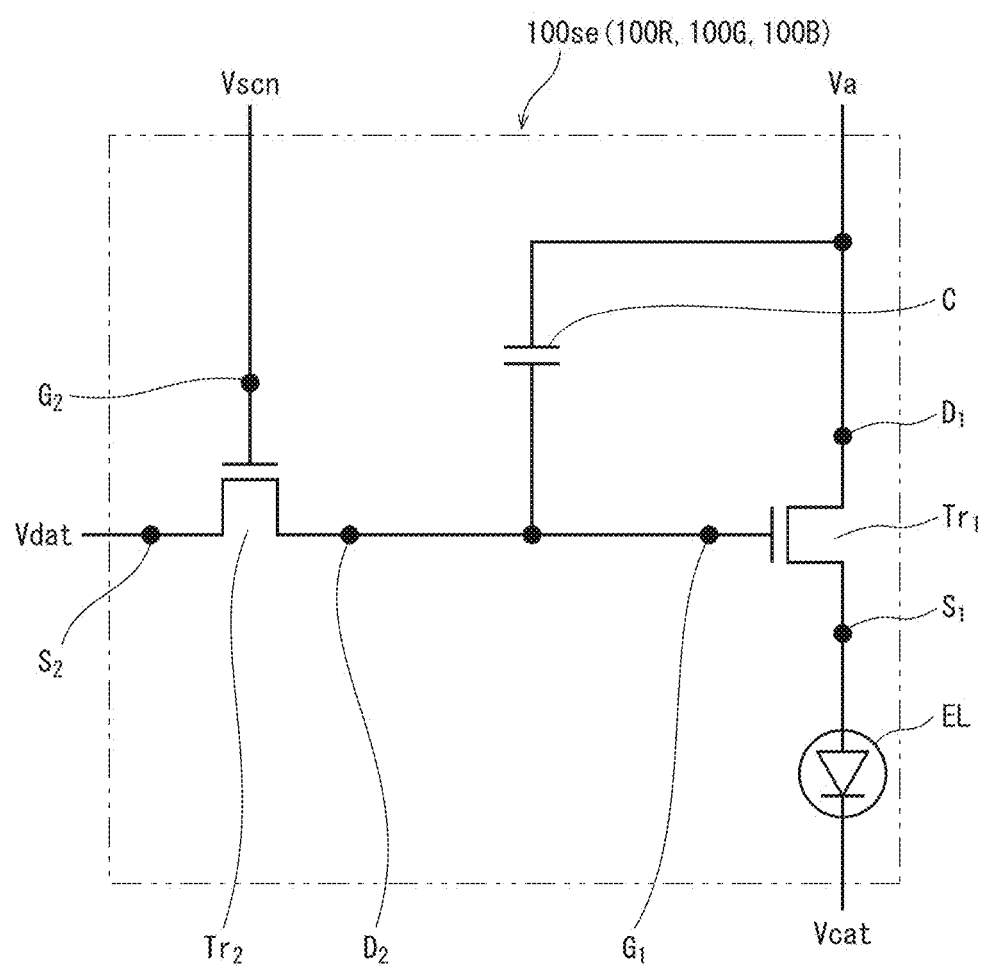
FIG. 14 is a schematic circuit diagram illustrating circuit structure of a sub-pixel 100se of the organic EL display panel 10 used in an organic EL display device according to at least one embodiment.

FIG. 14 is a schematic circuit diagram illustrating circuit structure in each of the light-emitting elements 100 corresponding to the sub-pixels 100se of the display panel 10 in the display device 1.

As illustrated in FIG. 14, according to the display panel 10 pertaining to the present embodiment, each of the sub-pixels 100se includes two transistors $Tr_1$, $Tr_2$, a capacitor C, and an organic EL element EL as a light-emitting element. The transistor $Tr_1$ is a drive transistor and the transistor $Tr_2$ is a switching transistor.

A gate $G_2$ of the switching transistor $Tr_2$ is connected to a scan line Vscn, and a source $S_2$ is connected to a data line Vdat. A drain $D_2$ of the switching transistor $Tr_2$ is connected to a gate $G_1$ of the drive transistor $Tr_1$.

A drain $D_1$ of the drive transistor $Tr_1$ is connected to a power source line Va, and a source $S_1$ is connected to a pixel electrode (anode) of the organic EL element EL. A counter electrode (cathode) of the organic EL element EL is connected to a ground line Vcat.

A first end of the capacitor C is connected to the drain $D_2$ of the switching transistor $Tr_2$ and the gate $G_1$ of the drive transistor $Tr_1$, and a second end of the capacitor C is connected to the power source line Va.

In the display panel 10, a plurality of adjacent sub-pixels 100se (for example, three sub-pixels 100se with light emission colors red (R), green (G), and blue (B)) are combined to form one unit pixel 100e, and the unit pixels 100e are distributed to form a pixel area. For each of the sub-pixels 100se, a gate line leads out from the gate $G_2$ and is connected to scan line Vscn connected from outside the display panel 10. Similarly, for each of the sub-pixels 100se, a source line leads out from the source $S_2$ and is connected to the data line Vdat connected from outside the display panel 10.

Further, power source lines Va and ground lines Vcat of the sub-pixels 100se are aggregated and connected to a power source line and a ground line of the display device 1.

MODIFICATIONS

The display panel 10 pertaining to at least one embodiment has been described, but the present disclosure is not limited to the embodiments described above. For example, various modifications achievable by a person having ordinary skill in the art, and any combination of elements and functions of embodiments and modifications that do not depart from the spirit of the present invention are also included in the present disclosure. The following describes modifications of the organic EL display panel as examples of such embodiments.

Modification 1

According to the display panel 10 pertaining to at least one embodiment, by providing the thickened portions 1331 inside the upper substrate 130, the optical distances to the light-shielding film 133 are different depending on the light emission color of the light-emitting elements 100. According to an organic EL display panel 10A pertaining to Modification 1, a light-shielding film 133A that has different thicknesses corresponding to different light-emitting elements 100 is provided inside the upper substrate 130, and therefore the optical distances to the light-shielding film 133A are different depending on the light emission color of the light-emitting elements 100.

Figure 15:
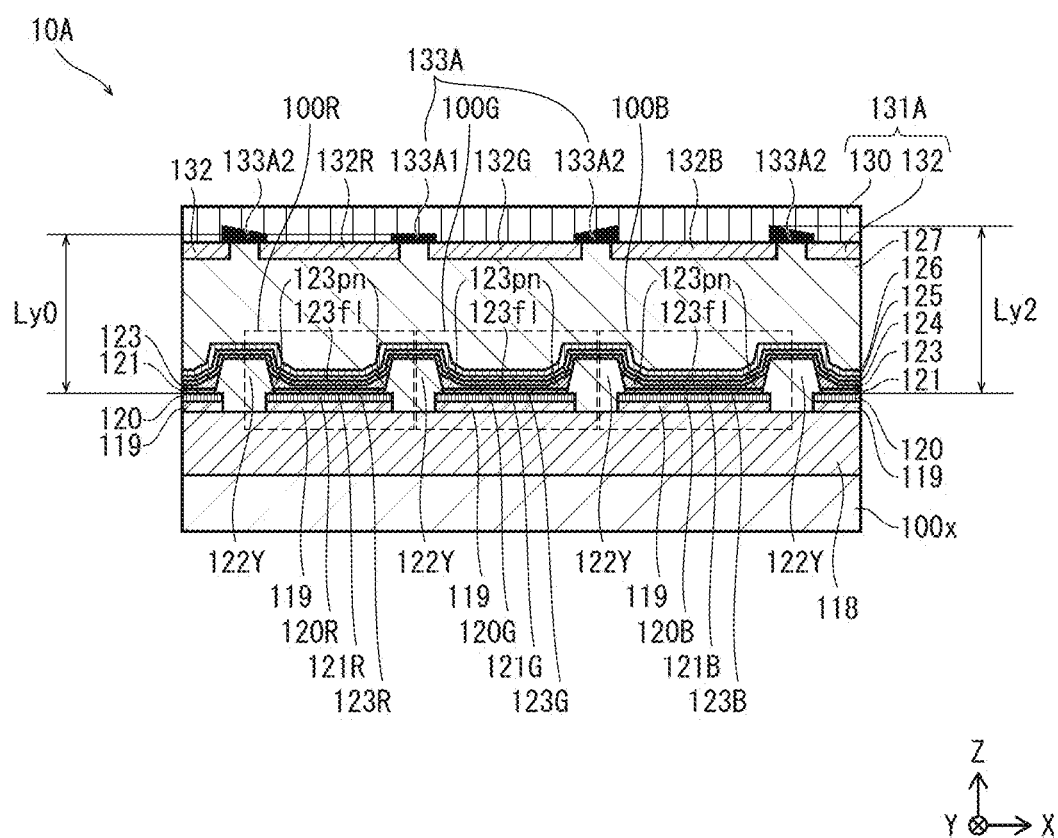
FIG. 15 is a schematic diagram of a cross-section taken from the same location as line A1-A1 in FIG. 1 from an organic EL display panel 10A according to Modification 1.

FIG. 15 is a schematic cross section diagram taken along a same position as A1-A1 in FIG. 1, illustrating the display panel 10A pertaining to Modification 1. As illustrated in FIG. 15, the display panel 10A includes a front plate 131A in which a light-shielding film 133A is provided inside the upper substrate 130. Thickness of the light-shielding film 133A is such that edge portions adjacent to openings corresponding to the light-emitting elements 100B (tall portions of light-shielding film portions 133A2) are thicker than edge portions adjacent to openings corresponding to the light-emitting elements 100G, 100R (light-shielding film portions 133A1 and low portions of the light-shielding film portions 133A2).

Thus, according to the display panel 10A, a structure is adopted in which a maximum distance Ly2 in the emission direction is larger than a maximum distance Ly0 in the emission direction, where the maximum distance Ly2 is between the boundary between the hole injection layer 120 and the hole transport layer 121 in any one of the light-emitting elements 100B and the light-shielding film portions 133A2 corresponding to the light-emitting element 100B, and the maximum distance Ly0 is between the boundary between the hole injection layer 120 and the hole transport layer 121 in any one of the light-emitting elements 100R, 100G and the light-shielding film portions 133A1 corresponding to the light-emitting elements 100R, 100G.

The following describes manufacture of the front plate 131A of the display panel 10A FIGS. 16A, 16B, 16C, 16D, 16E, 16F, and 16G are schematic diagrams of cross-sections taken from the same location as line A1-A1 in FIG. 1, illustrating states in manufacture of the front plate 131A of the organic EL display panel 10A according to Modification 1.

Figure 16A:
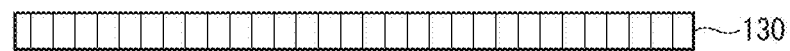
FIGS. 16A, 16B, 16C, 16D, 16E, 16F, and 16G are schematic diagrams of cross-sections taken from the same location as line A1-A1 in FIG. 1, illustrating states in manufacture of a front plate of the organic EL display panel 10A according to Modification 1.
Figure 16B:
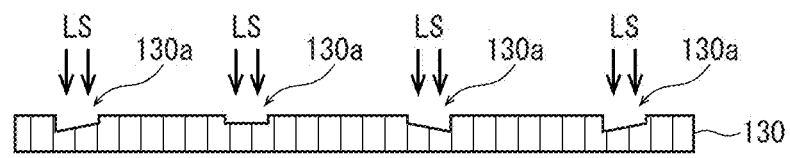

First, the upper substrate 130 is prepared, which is light-transmissive (FIG. 16A), then a top surface of the upper substrate 130 is irradiated by a laser LS at positions where the light-shielding film 133A is to be formed, forming recesses 133a in the top surface of the upper substrate 130 (FIG. 16B). The recesses 133a are such that edge portions adjacent to openings corresponding to the light-emitting elements 100B (corresponding to tall portions of the light-shielding film portions 133A2) are thicker than edge portions adjacent to openings corresponding to the light-emitting elements 100G, 100R (corresponding to light-shielding film portions 133A1 and low portions of the light-shielding film portions 133A2).

Figure 16C:
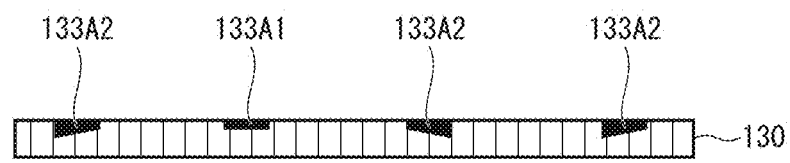
Figure 16D:
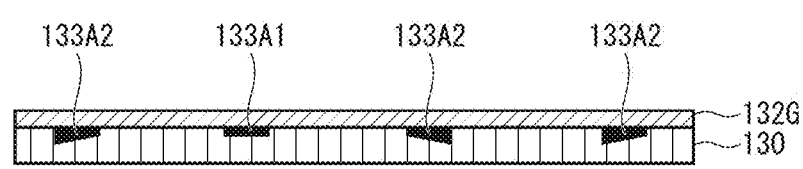

Next, a light-shielding film material (133') including an ultraviolet light curable resin (for example an ultraviolet light curable acrylic resin) as a main component and a black pigment is applied to a surface of the upper substrate 1330 (FIG. 16C). Thus, the light-shielding film 133A is formed in the recesses 133a provided in the upper substrate 130 such that portions adjacent to openings corresponding to the light-emitting elements 100B (tall portions of the light-shielding film portions 133A2) are thicker than portions adjacent to openings corresponding to the light-emitting elements 100G, 100R (the light-shielding film portions 133A1, low portions of the light-shielding film portions 133A2).

Figure 16E:
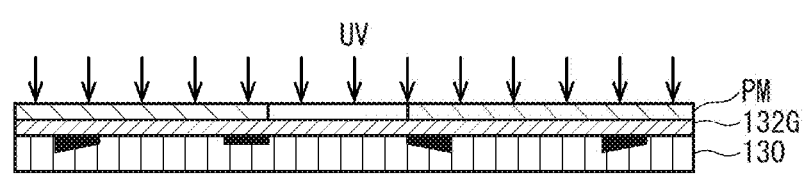

Next, for example, the material 132G of the color filter layer 132 with ultraviolet light curable resin as a main component is applied on a surface of the upper substrate 130 on which the light-shielding film 133A is formed (FIG. 16D), then a defined pattern mask PM is placed and ultraviolet light irradiation is performed (FIG. 16E).

Figure 16F:
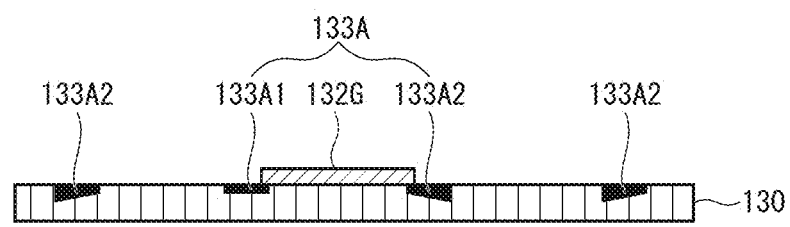

Subsequently, curing is performed, and the pattern mask PM and uncured portions of the material 132G are removed by developing to form the color filter layer 132(G) (FIG. 16F).

Figure 16G:
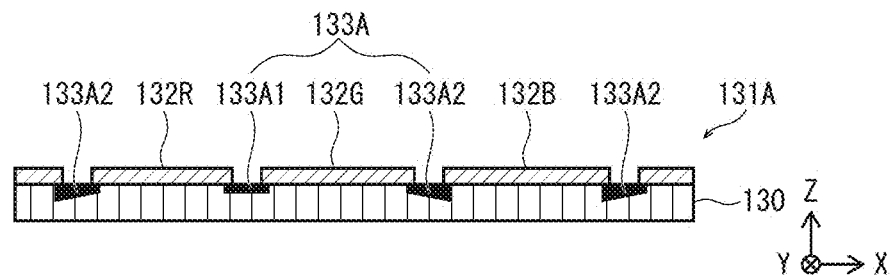

By repeating this process for each color of color filter material, the color filter layer 132(R)(B) is formed (FIG. 16G). In this way, the front plate 131A is completed.

As described above, according to the display panel 10A, optical distance between the light emission reference points of the light-emitting elements 100B and the portions of the light-shielding film 133A adjacent to the openings corresponding to the light-emitting elements 100B is larger than optical distance between the light emission reference points of the light-emitting elements 100R, 100G and the portions of the light-shielding film 133A adjacent to the openings corresponding to the light-emitting elements 100R, 100G.

Thus, according to the display panel 10A, similarly to the display panel 10, by implementing changes in a direction that cancels out differences in light shielding ratios of the light-emitting elements 100B, 100G, 100R, the differences in light shielding ratio can be compensated for, and changes in visual recognition of chromaticity when viewed from an oblique angle can thereby be reduced.

Modification 2

According to the display panel 10 pertaining to at least one embodiment, by providing the thickened portions 1331 inside grooves in the upper substrate 130, the optical distance to the light-shielding film 133 is different depending on the light emission color of the light-emitting elements 100. According to the organic EL display panel 10B pertaining to Modification 2, after providing thickened portions 133B1 on the upper substrate 130, a resin film 130B1 that covers portions of the upper substrate 130 other than those covered by the thickened portions 133B1 is provided, and further, base portions 133B0 of a light-shielding film 133B are provided on upper surfaces of the resin film 130B1, thereby providing the light-shielding film 133B having different thicknesses corresponding to different ones of the light-emitting elements 100, such that optical distances to the light-shielding film 133B are different depending on light emission colors of the light-emitting elements 100.

Figure 17:
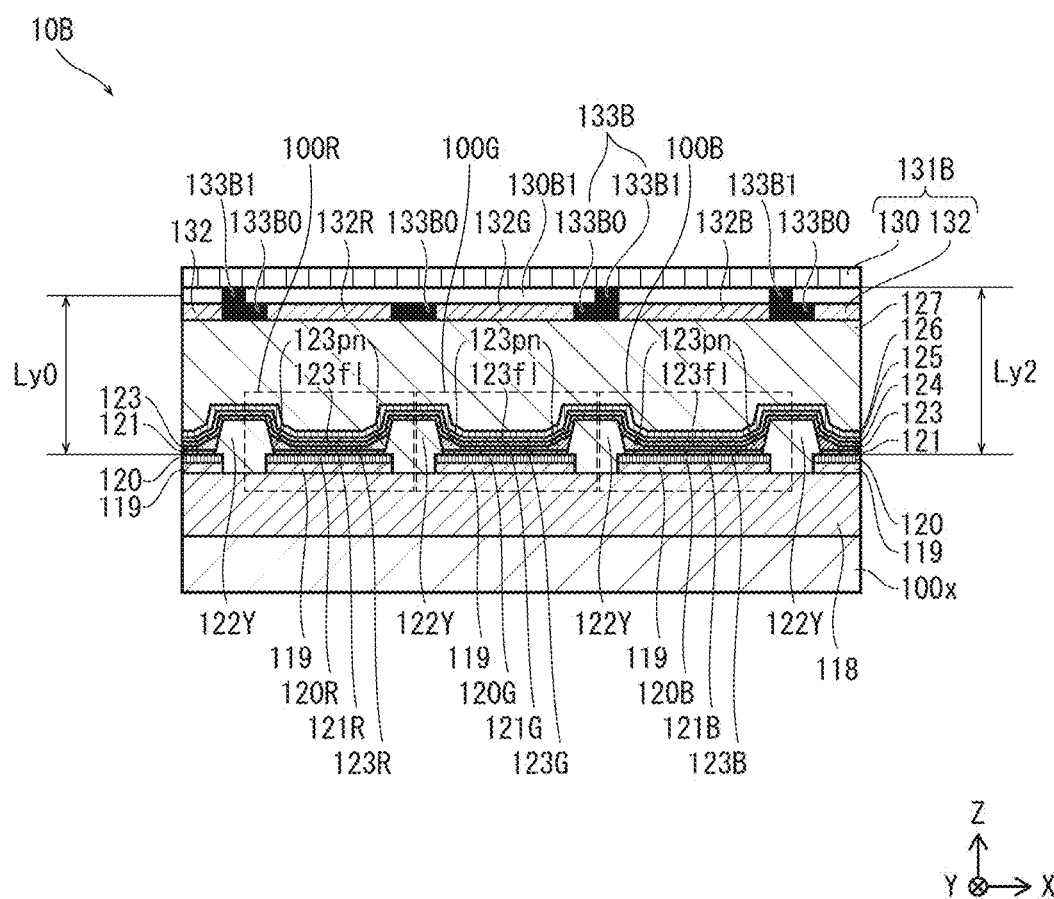
FIG. 17 is a schematic diagram of a cross-section taken from the same location as line A1-A1 in FIG. 1 from an organic EL display panel 10B according to Modification 2.

FIG. 17 is a schematic diagram of a cross-section taken from the same location as line A1-A1 in FIG. 1 from the display panel 10B according to Modification 2. As illustrated in FIG. 17, according to the display panel 10B, the front plate 131B is provided with the thickened portions 133B1 adjacent to openings of the light-shielding film 133B corresponding to a specific color of the light-emitting elements 100 (for example, 100B) on the upper substrate 130, portions of the upper substrate not covered by the thickened portions 133B1 are covered with a light-transmissive resin film 130B1, the color filter layer 132(R)(G)(B) is disposed corresponding to the light-emitting elements 100 on the resin film 130B1, and the base portions 133B0 of the light-shielding film 133B are provided on portions of the resin film 130B1 other than that corresponding to the light-emitting elements 100. Thus, according to the display panel 10, a structure is adopted in which a maximum distance Ly2 in the emission direction is larger than a maximum distance Ly0 in the emission direction, where the maximum distance Ly2 is between the boundary between the hole injection layer 120 and the hole transport layer 121 in any one of the light-emitting elements 100B and the thickened portions 133B1 corresponding to the light-emitting element 100B, and the maximum distance Ly0 is between the boundary between the hole injection layer 120 and the hole transport layer 121 in any one of the light-emitting elements 100R, 100G and edges of the light-shielding film 133B corresponding to the light-emitting elements 100R, 100G.

The following describes manufacture of the front plate 131B of the display panel 10B FIGS. 18A, 18B, 18C, 18D, 18E, and 18F are schematic diagrams of cross-sections taken from the same location as line A1-A1 in FIG. 1, illustrating states in manufacture of a light shielding film of the front plate 131B of the display panel 10B according to Modification 2.

Figure 18A:
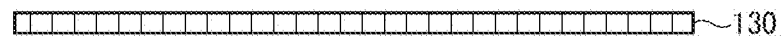
FIGS. 18A, 18B, 18C, 18D, 18E, and 18F are schematic diagrams of cross-sections taken from the same location as line A1-A1 in FIG. 1, illustrating states in manufacture of a light shielding film of a front plate of the organic EL display panel 10B according to Modification 2.
Figure 18B:
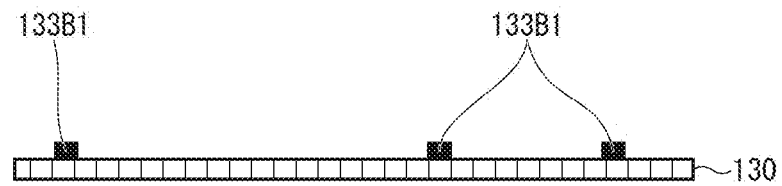
Figure 18C:
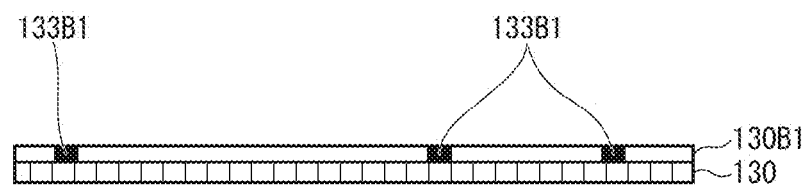
Figure 18D:
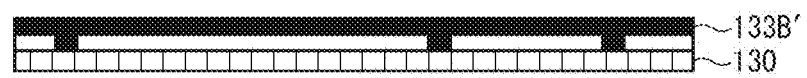
Figure 18E:
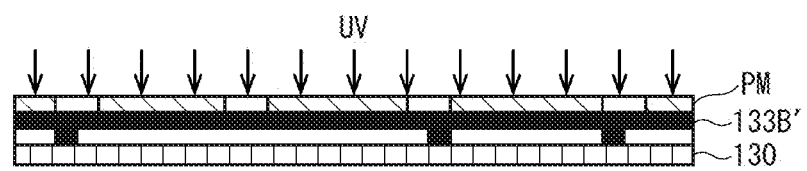

First, the upper substrate 130 is prepared, which is light-transmissive (FIG. 18A), then an ultraviolet light curable resin paste including material for forming the thickened portions 133B1 is selectively applied to a top surface of the upper substrate 130 by using an application method such as an inkjet method at positions where the light-shielding film 133B is to be formed (FIG. 18B).

Next, the resin film 130B1 made of a light-transmissive ultraviolet light curable resin is applied to areas other than those covered by the thickened portions 133B1 (FIG. 18C), and irradiated with ultraviolet light to be cured.

Figure 18F:
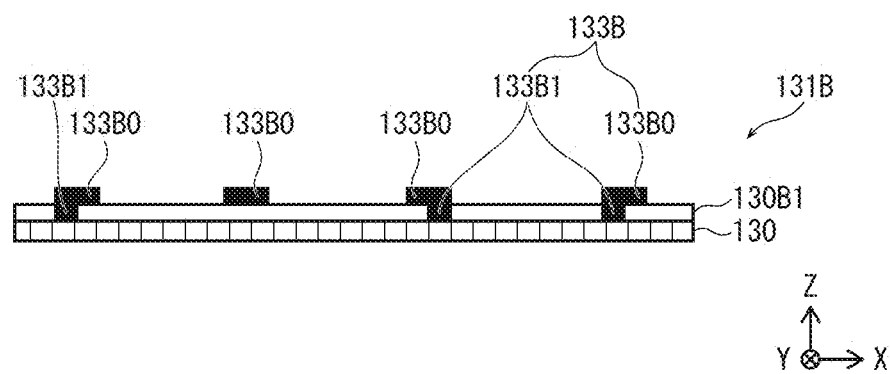

Next, a light-shielding film material 133B' including an ultraviolet light curable resin (for example an ultraviolet light curable acrylic resin) as a main component and a black pigment is applied (FIG. 18D), then irradiated with ultraviolet light via a pattern mask PM (FIG. 18E), then curing is performed, and the pattern mask PM and uncured paste is removed by developing, thereby forming the light-shielding film 133B (FIG. 18F). Thus, the light-shielding film 133B is formed on the upper substrate 130 such that the thickened portions 133B1 adjacent to the openings corresponding to the light-emitting elements 100B are thicker than the base portions 133B0 adjacent to the openings corresponding to the light-emitting elements 100G, 100R.

Next, as in the example illustrated in FIG. 9A, 9B, 9C, 9D, the material 132G of the color filter layer 132 having ultraviolet light curable resin as a main component is applied on a surface of the upper substrate 130 on which the light-shielding film 133B is formed, then a defined pattern mask PM is placed and ultraviolet light irradiation is performed. Subsequently, curing is performed, and the pattern mask PM and uncured portions of the material 132G are removed by developing to form the color filter layer 132(G). By repeating this process for each color of color filter material, the color filter layer 132(R)(B) is formed, and the front plate 131B is completed.

As described above, according to the display panel 10B, a structure is adopted such that the optical distance between the light emission reference point of the light-emitting element 100B and an edge of an opening of the light-shielding film 133B corresponding to the light-emitting element 100B is larger than the optical distances between the light emission reference points of the light-emitting elements 100R, 100G and edges of openings of the light-shielding film 133B corresponding to the light-emitting elements 100R, 100G, and therefore the light-shielding ratio of the light-emitting elements 100B is larger than the light-shielding ratio of the light-emitting elements 100R, 100G.

Thus, according to the display panel 10B, similarly to the display panel 10, by implementing changes in a direction that cancels out differences in light shielding ratios of the light-emitting elements 100B, 100G, 100R, the differences in light shielding ratio can be compensated for, and changes in visual recognition of chromaticity when viewed from an oblique angle can thereby be reduced.

Modification 3

According to the display panel 10 pertaining to at least one embodiment, the optical distance between the light emission reference point of the light-emitting elements 100B and the light-shielding film 133 is different from that of the light-emitting elements 100R, 100G, due to the provision of the thickened portions 1331 adjacent to the openings corresponding to the light-emitting elements 100n.

Figure 19:
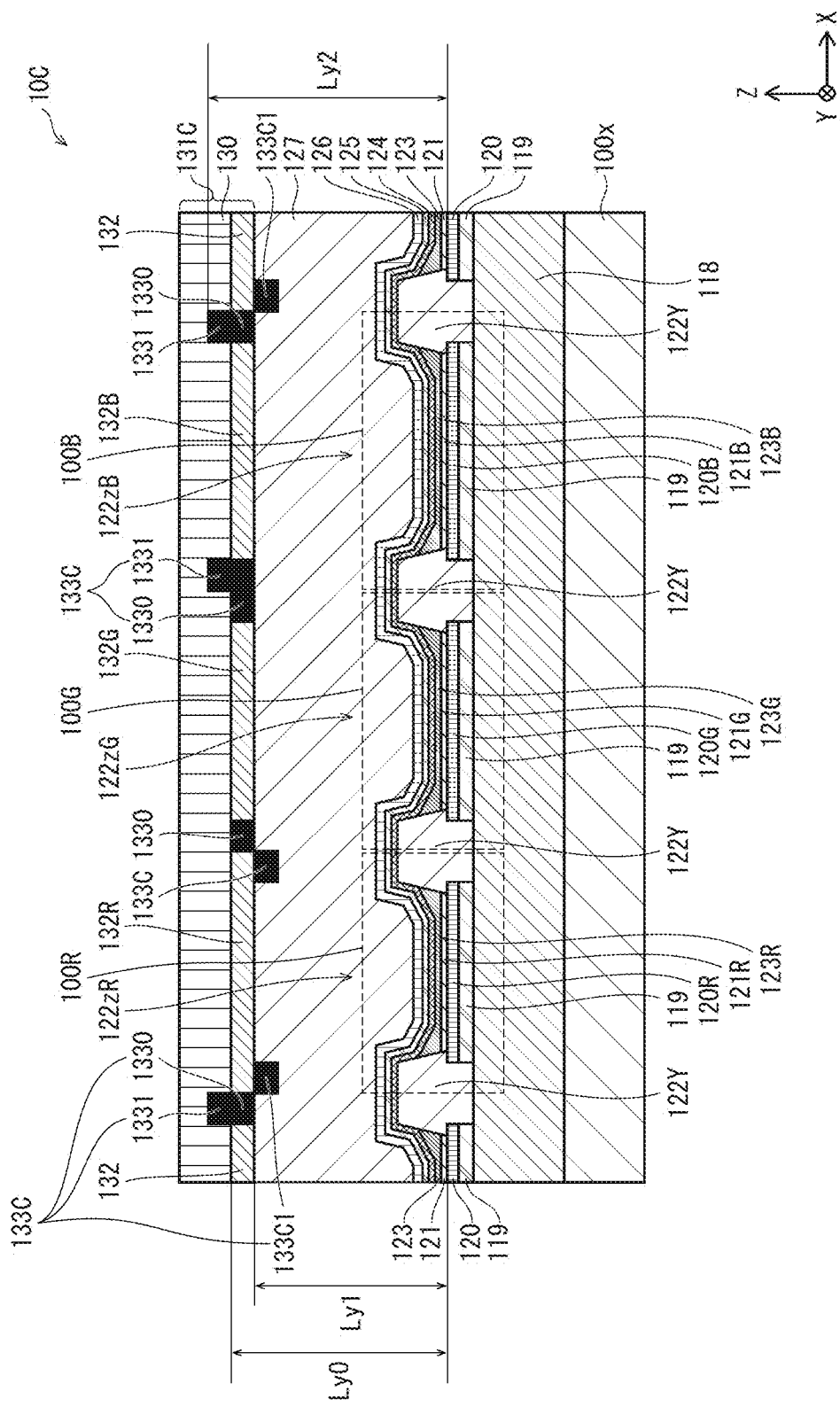
FIG. 19 is a schematic diagram of a cross-section taken from the same location as line A1-A1 in FIG. 1 from an organic EL display panel 10C according to Modification 3.

FIG. 19 is a schematic diagram of a cross-section taken from the same location as line A1-A1 in FIG. 1 from a display panel 10C according to Modification 3. As illustrated in FIG. 19, according to the display panel 10C pertaining to Modification 3, a structure is adopted in which, in addition to the structure of the display panel 10 pertaining to at least one embodiment, a light-shielding film 133C1 is provided below the color filter layer 132, below a light-shielding film 133C, for example at positions corresponding to openings corresponding to the light-emitting elements 100R. Openings are provided in the light-shielding film 133C at positions corresponding to the light-emitting elements 100R, and optical distance between the light emission reference point of the light-emitting elements 100R and the light-shielding film 133C for the light-emitting elements 100R is Ly1, which is shorter than the optical distance Ly0 for the light-emitting elements 100G.

According to this structure, in the display panel 10C, the optical distances Ly1, Ly0, Ly2 between the light emission reference points of the light-emitting elements 100R, 100G, 100B and the light-shielding film 133C are set to different lengths for the light-emitting elements 100R, 100G, 100B (in this example, Ly1<Ly0<Ly2), and light-shielding ratios for the light-emitting elements 100R, 100G, 100B are made different in three steps, for example such that 100R<100G<100B. As a result, light-shielding ratios can be more accurately compensated for among the light-emitting elements 100R, 100G, 100B.

According to the display panel 10C, a structure is implemented in which differences in light-shielding ratios of the light-emitting elements 100B, 100G, 100R can be more finely changed, and therefore visually recognized chromaticity changes when viewed from an oblique angle can be more accurately compensated for.

Modification 4

Figure 20:
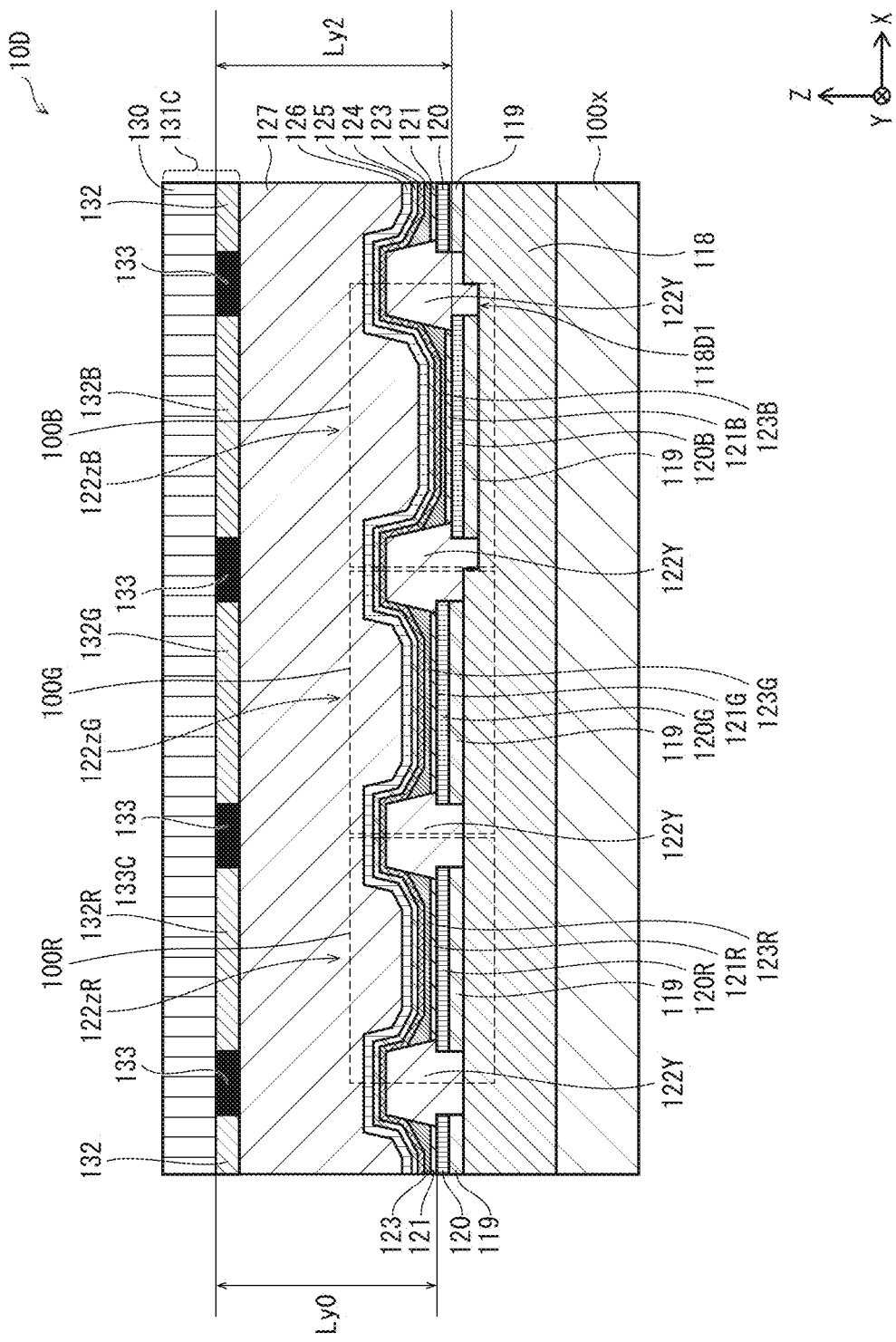
FIG. 20 is a schematic diagram of a cross-section taken from the same location as line A1-A1 in FIG. 1 from an organic EL display panel 10D according to Modification 4.

FIG. 20 is a schematic diagram of a cross-section taken from the same location as line A1-A1 in FIG. 1 from a display panel 10D according to Modification 4. According to the display panel 10D pertaining to Modification 4, a structure is adopted in which positions in the emission direction of the light emission reference points of the light-emitting elements 100 are different, depending on light emission colors of the light-emitting elements 100. More specifically, as illustrated in FIG. 20, according to the display panel 10D, a structure is adopted in which recesses 118D1 are provided in a planarizing layer 118D below the light-emitting elements 100B, such that a position in the light emission direction of the light emission reference points of the light-emitting elements 100B is lower than that of the light-emitting elements 100R, 100G. Thus, the optical distance between the light emission reference points of the light-emitting elements 100B and edges of corresponding openings is Ly2, which is longer than the optical distance Ly0 of the light-emitting elements 100R, 100G.

According to this structure of the display panel 10D, as with the structure of other embodiments, the light-shielding ratio of the light-emitting elements 100B can be made larger than the light-shielding ratio of the light-emitting elements 100R, 100G.

Thus, according to the display panel 10D, a structure can be implemented that reduces changes in chromaticity visually recognized from an oblique viewing angle, similarly to the display panel 10 according to at least one embodiment, by changing positions of the light emission reference points.

Modification 5

Figure 21:
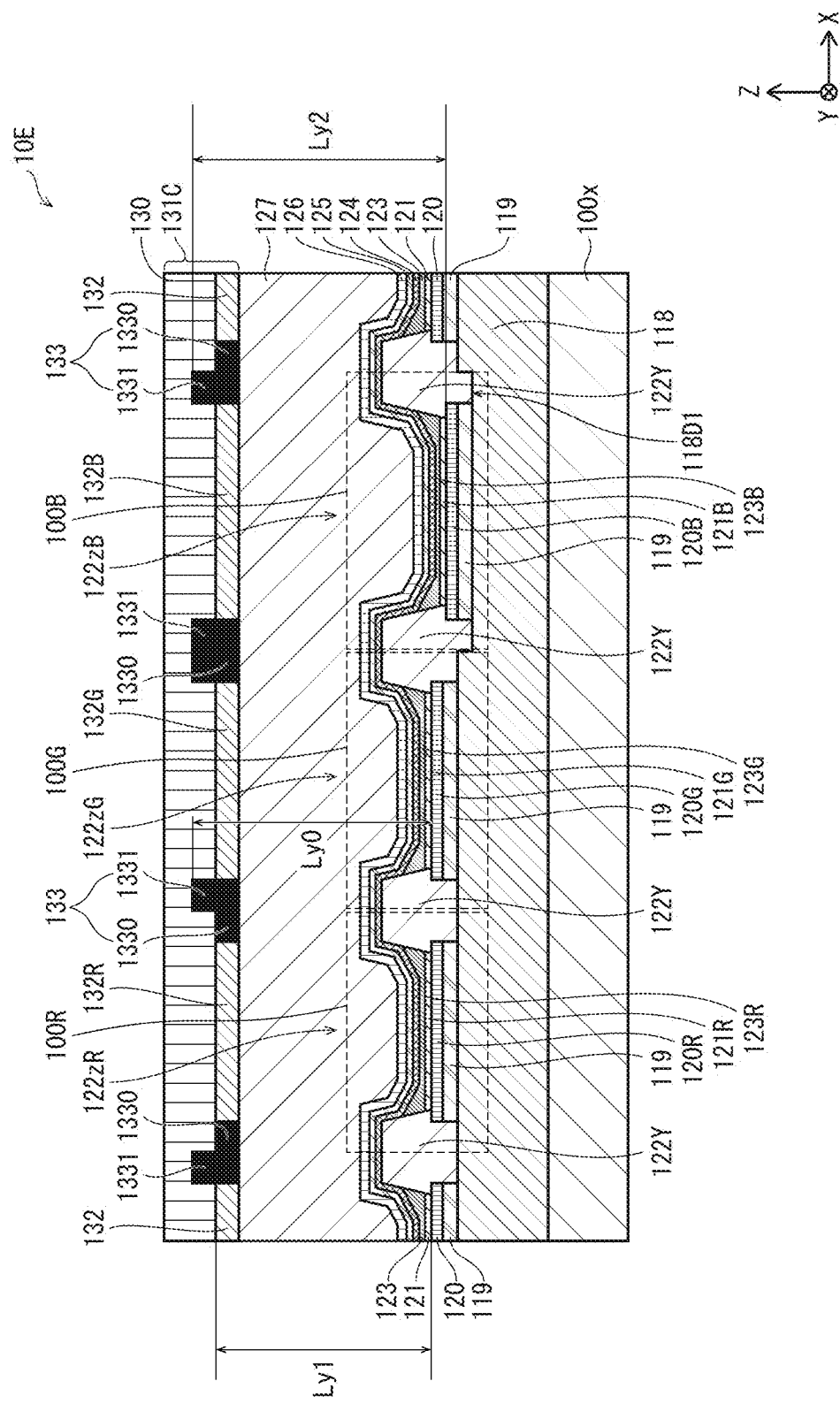
FIG. 21 is a schematic diagram of a cross-section taken from the same location as line A1-A1 in FIG. 1 from an organic EL display panel 10E according to Modification 5.

FIG. 21 is a schematic diagram of a cross-section taken from the same location as line A1-A1 in FIG. 1 from a display panel 10E according to Modification 5. According to the display panel 10E pertaining to Modification 5, a structure is adopted combining the display panel pertaining to at least one embodiment with the display panel 10D pertaining to Modification 4. That is, according to the display panel 10E, as illustrated in FIG. 21, a structure is adopted in which, in addition to the thickened portions 1331 being provided adjacent to openings corresponding to the light-emitting elements 100G, 100B, the recesses 118D1 are provided in the planarizing layer 118D below the light-emitting elements 100B, and therefore positions in the light emission direction of the light emission reference points of the light-emitting elements 100B are lower than those of the light-emitting elements 100R, 100G.

According to this structure of the display panel 10E, as with the structure of Modification 4, the optical distances Ly1, Ly0, Ly2 between the light emission reference points of the light-emitting elements 100R, 100G, 100B and the light-shielding film 133 are set to different lengths for the light-emitting elements 100R, 100G, 100B (in this example, Ly1<Ly0<Ly2), and light-shielding ratios for the light-emitting elements 100R, 100G, 100B are made different in three steps, for example such that 100R<100G<100B. As a result, light-shielding ratios can be more accurately compensated for among the light-emitting elements 100R, 100G, 100B.

According to the display panel 10E, a structure is implemented in which differences in light-shielding ratios of the light-emitting elements 100B, 100G, 100R can be more finely changed, and therefore visually recognized chromaticity changes when viewed from an oblique angle can be more accurately compensated for.

Modifications 6, 7

According to the display panel 10 pertaining to at least one embodiment, the optical distances LB in the light emission direction between the light emission reference points of the light-emitting elements 100 and the edges of the openings 133a of the light-shielding film 133 are different for the light-emitting elements 100B, 100R, 100G, according to provision of the thickened portions 1331 adjacent to the openings corresponding to the light-emitting elements 100B. However, according to embodiments of the present disclosure, it suffices that the optical distances between the light emission reference points of the light-emitting elements 100 and the light-shielding film 133 are different depending on light emission colors of the light-emitting elements 100, and therefore according to at least one embodiment, members having different refractive indexes depending on light emission colors of the light-emitting elements 100 are interposed between the light emission reference points of the light-emitting elements 100 and the light-shielding film 133.

According to the display panel 10F, 10G pertaining to the Modifications 6, 7, respectively, a light-adjusting film is disposed between the light-emitting elements 100 and the light-shielding film 133 in the light emission direction of the light-emitting elements 100, and, in plan view, different areas of the light-adjusting film have different refractive indexes depending on the light emission color of the light-emitting elements 100.

Figure 22:
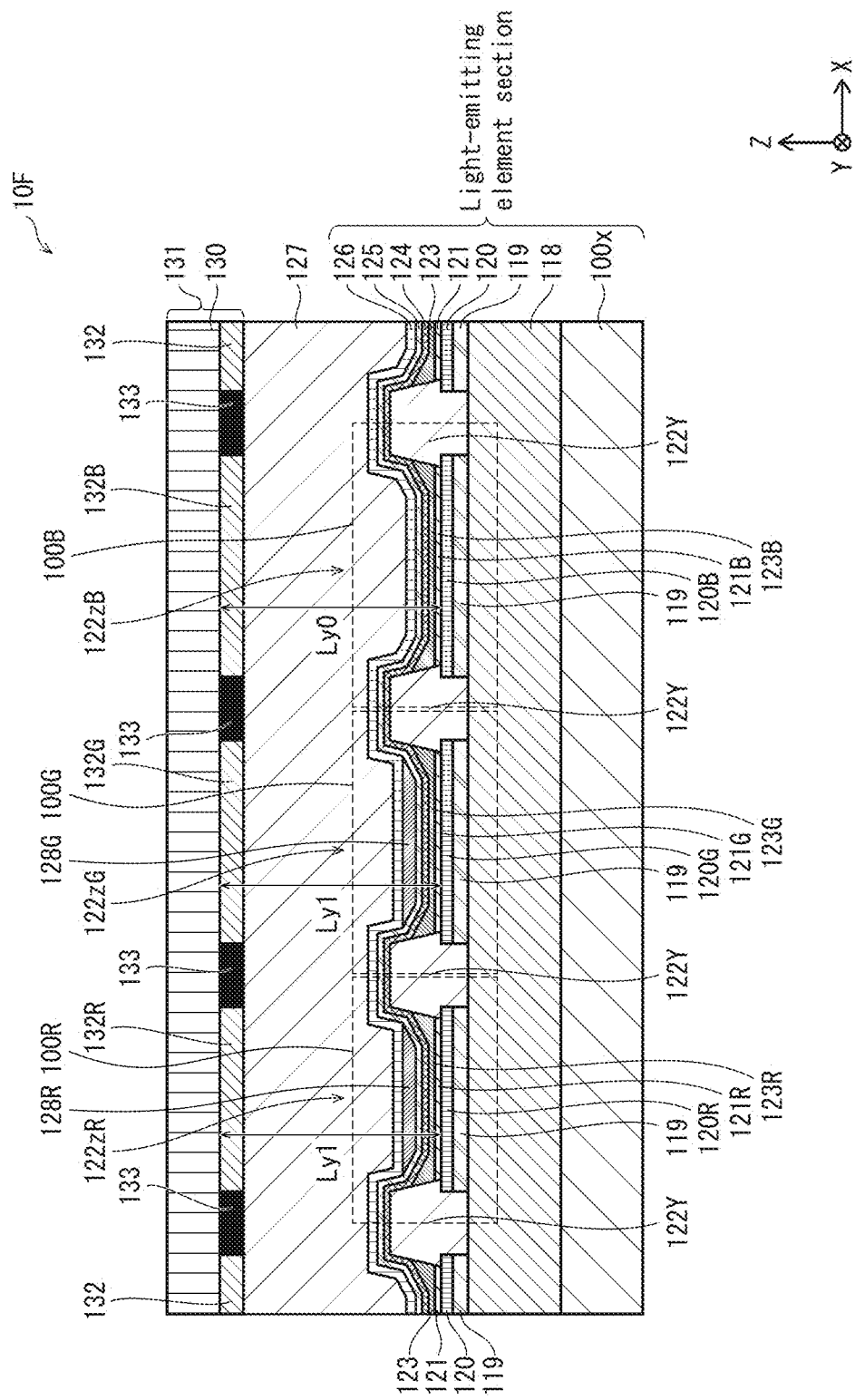
FIG. 22 is a schematic diagram of a cross-section taken from the same location as line A1-A1 in FIG. 1 from an organic EL display panel 10F according to Modification 6.

FIG. 22, 23 are schematic diagrams of cross-sections taken from the same location as line A1-A1 in FIG. 1, from a display panel 10F according to Modification 6, and a display panel 10G according to Modification 7, respectively.

As illustrated in FIG. 22, according to the display panel 10F, a light-adjusting film 128R is disposed between the counter electrode 125 and the sealing layer 126 of the light-emitting elements 100R, and a light-adjusting film 128G is disposed between the counter electrode 125 and the sealing layer 126 of the light-emitting elements 100G.

Figure 23:
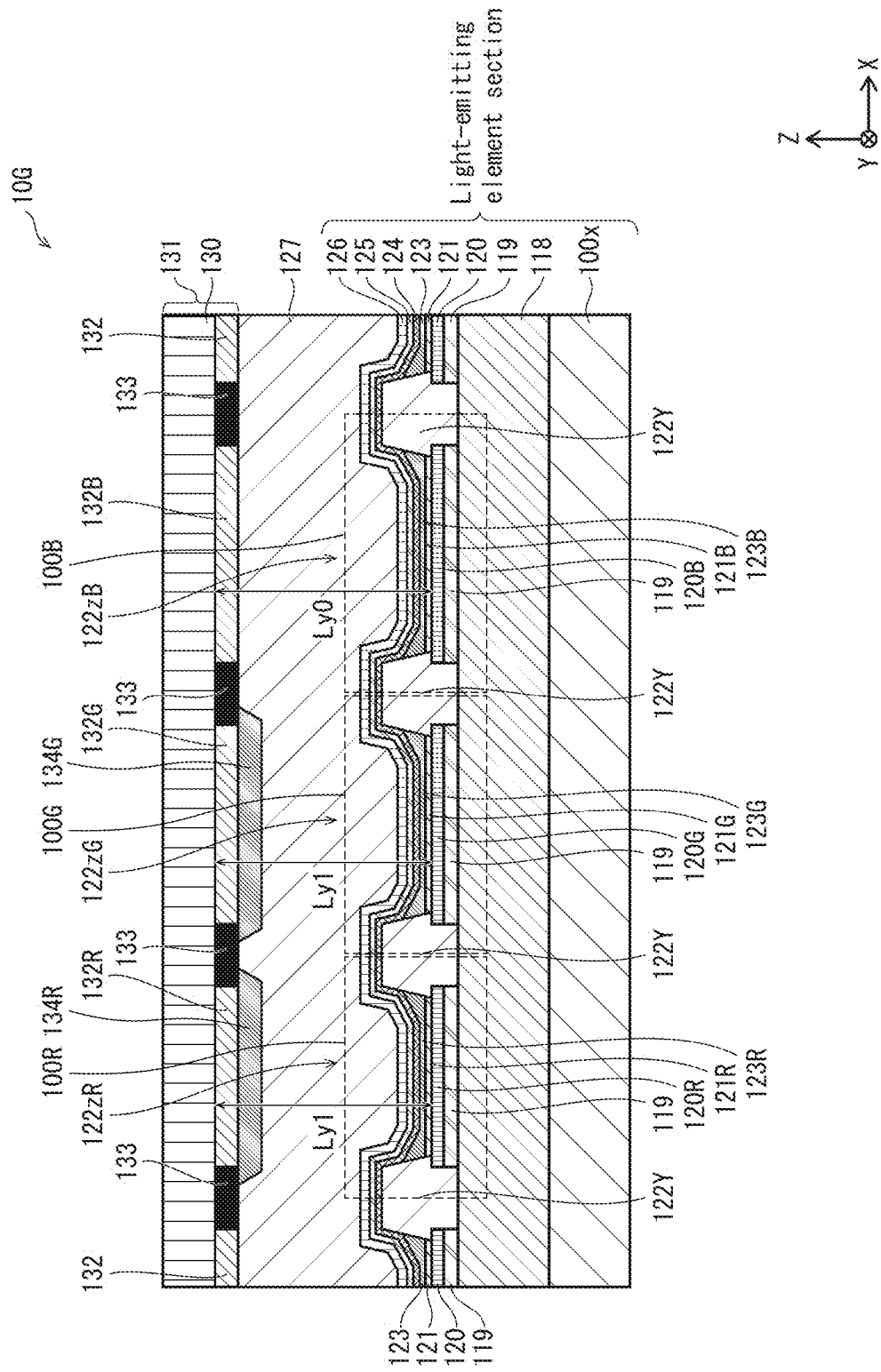
FIG. 23 is a schematic diagram of a cross-section taken from the same location as line A1-A1 in FIG. 1 from an organic EL display panel 10G according to Modification 7.

As illustrated in FIG. 23, according to the display panel 10G, a light-adjusting film 134R is disposed between the joining layer 127 and the color filter layer 132(R) above the light-emitting elements 100R, and a light-adjusting film 134G is disposed between the joining layer 127 and the color filter layer 132(G) above the light-emitting elements 100G.

The light-adjusting films 128R, 128G, 134R, 134G include, for example, a high refractive index light-transmissive resin having a refractive index of 1.6 or more, and a low refractive index light-transmissive resin having a refractive index of 1.4 or less.

The gaps 122zR, 122zB, 122zG corresponding to the light-emitting elements 100, or the color filer layer 132(R)(G)(B), are selectively filled with the resin material, which is then cured, forming the light-adjusting films 128, 134. Further, material efficiency can be improved by using an application method such as an inkjet method when manufacturing the light-adjusting film 128. Alternatively, the light-adjusting films 134R, 134G may be formed by applying a photosensitive resin material onto the color filter layer 132(R)(G), then patterning by using a photolithography method.

As described above, according to the display panels 10F, 10G, a structure can be adopted in which the optical distance between the light emission reference points of the light-emitting elements 100B and the edges of the openings of the light-shielding film corresponding to the light-emitting elements 100B is longer than the optical distance between the light emission reference points of the light-emitting elements 100R, 100G and the edge of the openings of the light-shielding film corresponding to the light-emitting elements 100R, 100G, and the light-shielding ratio of the light-emitting elements 100B is larger than the light-shielding ratios of the light-emitting elements 100R, 100G.

Further, by providing the light-adjusting film 128 having different refractive indexes for different light-emitting elements 100, the optical distances Ly1, Ly0, Ly2 between the light emission reference points of the light-emitting elements 100R, 100G, 100B and the light-shielding film 133 can have different lengths, and the light-shielding ratios of the light-emitting elements 100R, 100G, 100B can be made different in three steps. As a result, light-shielding ratios can be more accurately compensated for among the light-emitting elements 100R, 100G, 100B.

Thus, according to the display panels 10F, 10G, a structure can be implemented that reduces changes in chromaticity visually recognized from an oblique viewing angle, similarly to the display panel 10 according to at least one embodiment, by arrangement of a light-adjusting film in the light-emitting element sections or front plate.

Further, by making the refractive index of the light-adjusting film different for different light-emitting elements, the differences in light shielding ratios of the light-emitting elements 100B, 100G, 100R can be more finely compensated for, and changes in visual recognition of chromaticity when viewed from an oblique angle can thereby be more accurately reduced.

Modification 8

According to the display panel 10G pertaining to Modification 7, the light-adjusting film 134R made of a high refractive index light-transmissive resin having a refractive index of 1.6 or more is provided between the joining layer 127 and the color filter layer 132(R) above the light-emitting elements 100R, and the light-adjusting film 134G made of a low refractive index light-transmissive resin having a refractive index of 1.4 or less is provided between the joining layer 127 and the color filter layer 132(G) above the light-emitting elements 100G, and therefore the light-shielding ratio of the light-emitting elements 100B is larger than the light-shielding ratios of the light-emitting elements 100R, 100G.

However, it suffices that optical distance between the light emission reference points of the light-emitting elements 100 be different depending on wavelengths of light emitted from the light-emitting elements 100, and according to a display panel 10J pertaining to Modification 8 a structure is adopted in which a light-adjusting layer made of materials having different refractive indexes depending on wavelengths of light emitted from the light-emitting elements 100 is provided between the light emission points of the light-emitting elements 100 and the light-shielding film 133.

Structure

Figure 24:
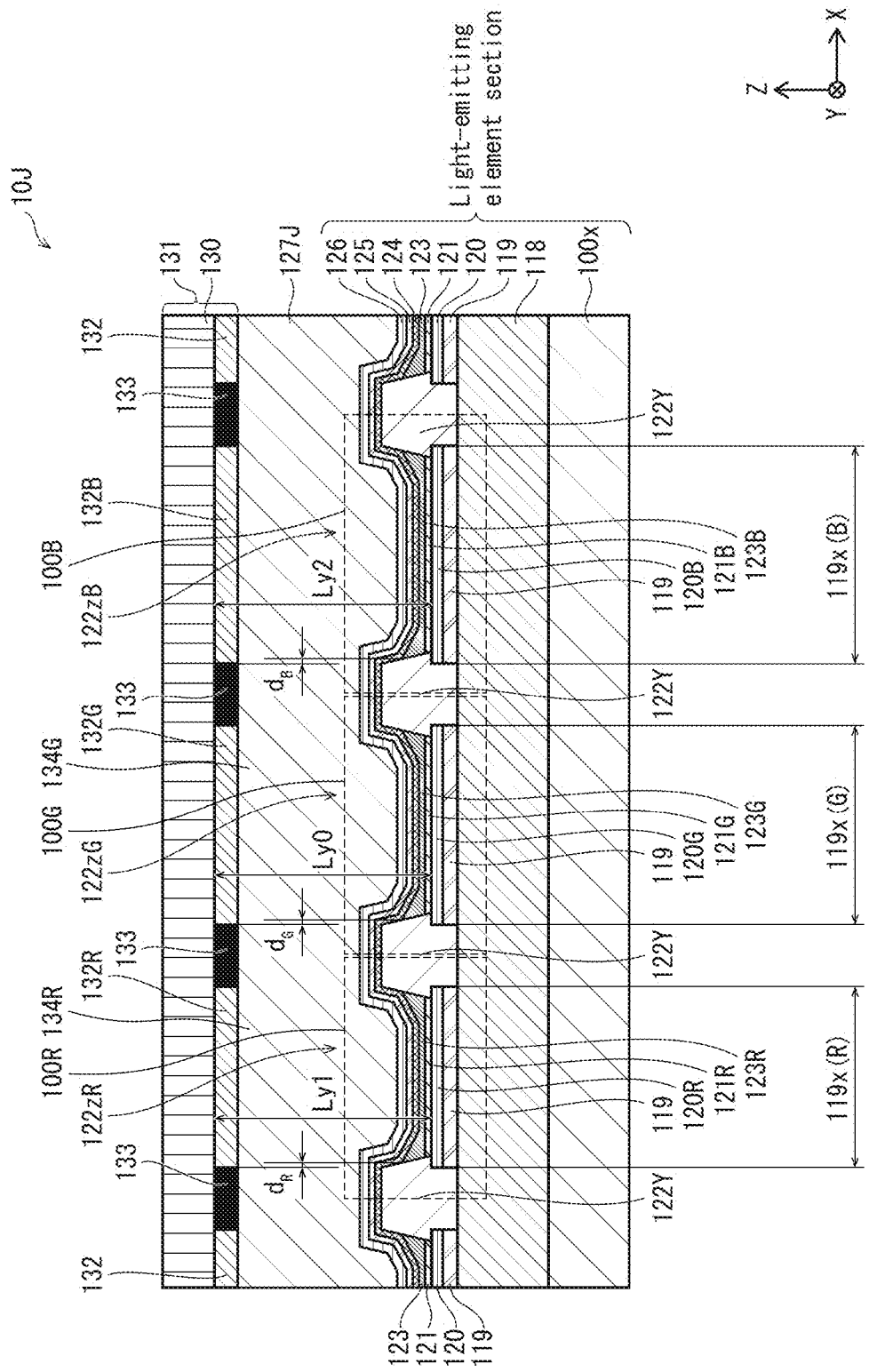
FIG. 24 is a schematic diagram of a cross-section taken from the same location as line A1-A1 in FIG. 1 from an organic EL display panel 10J according to Modification 8.

FIG. 24 is a schematic diagram of a cross-section taken from the same location as line A1-A1 in FIG. 1 from the display panel 10J according to Modification 8. In FIG. 24, structure that is the same as that of a display panel according to any of the embodiments described above has the same reference sign and description thereof is not repeated here.

As illustrated in FIG. 24, the display panel 10J includes a light-adjusting film 127J disposed between the light-emitting elements 100 and the light-shielding film 133, common to the light-emitting elements 100R, 100G, 100B that emit different colors of light. The light-adjusting film 127J is light-transmissive, has a refractive index that depends on frequency (wavelength dependency), such that the larger the wavelength of transmitted light, the smaller the refractive index.

The light-adjusting film 127J has a function of joining the front plate 131 to the layers from the substrate 100x to the sealing layer 126, and has a function of preventing each layer from being exposed to moisture and air.

Figure 25:
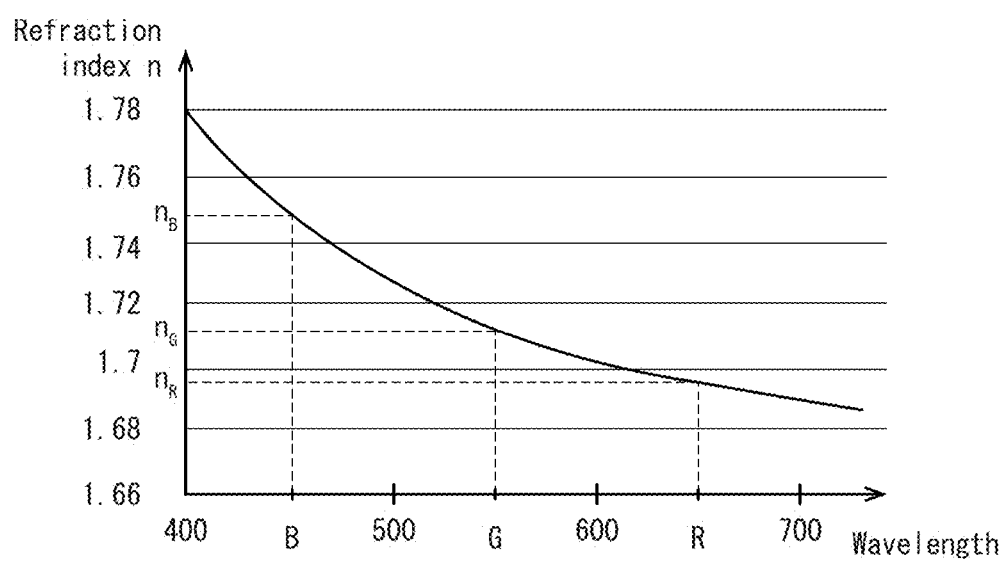
FIG. 25 is a graph illustrating a relationship between wavelength and a refractive index n for a material of a light-adjusting layer 127J.

Further, the light-adjusting film 127J is made of a material that has a refractive index that depends on frequency, such that the larger the wavelength of transmitted light, the smaller the refractive index. FIG. 25 is a graph illustrating a relationship between wavelength and refractive index n for a material of the light-adjusting layer 127J. As illustrated in FIG. 25, the refractive index n is $n_B \approx 1.75$ in a wavelength range B corresponding to light emitted from the light-emitting elements 100B, $n_G \approx 1.71$ in a wavelength range G corresponding to light emitted from the light-emitting elements 100G, and $n_R \approx 1.69$ in a wavelength range R corresponding to light emitted from the light-emitting elements 100R. Thus, according to the display panel 10J, a structure is adopted in which the refractive index of the light-adjusting film 127J with respect to light emitted from the light-emitting elements 100R, 100G, 100B is different such that 100R<100G<100B. Thus, according to wavelength dispersion, the optical distances Ly1, Ly0, Ly2 (also referred to as the optical distances Ly) between the light emission reference points of the light-emitting elements 100R, 100G, 100B and the light-shielding film 133 are different lengths for the light-emitting elements 100R, 100G, 100B, and the light-shielding ratios of the light-emitting elements 100R, 100G, 100B are mainly in three different steps. As a result, light-shielding ratios can be more accurately compensated for among the light-emitting elements 100R, 100G, 100B.

More specifically, the following conditions can be set. For example, assuming the optical distance Ly in a vertical direction (the light emission direction) from the light emission reference point to the shielding film 133 is 15 µm, and the viewing angle α is 30°, minimum distances $d_R$, $d_B$, $d_G$ in a horizontal direction from the light-emitting layers 120 to the light-shielding layer 133 for the light-emitting elements 100R, 100B, 100G, respectively, are such that the value for the light-emitting elements 100R is approximately 0.5 µm longer than the value for the light-emitting elements 100B. In this case, the optical distance and the difference in optical distance between the light-emitting elements 100R and the light-emitting elements 100B are approximately 0.5 µm. Due to the refractive index $n_B$ (≈1.75) of a wavelength band of the light-emitting elements 100B and the refractive index $n_R$ (≈1.69) of a wavelength band of the light-emitting elements 100R, the difference in optical distance between the light-emitting elements 100R, 100B caused by wavelength dispersion is 0.9 µm with respect to the optical distance Ly of approximately 15 µm from the light emission reference point to the light-shielding film 133, and differences in optical distance can be compensated for based on frequency dependence of the refractive index of the light-adjustment layer 127J. That is, among the light-emitting elements 100R, 100G, 100B, refractive indexes corresponding to wavelengths of two colors of light-emitting element (in the example above, the light-emitting elements 100R, 100B), the refractive index $n_B$ that has a larger value is 0.05 or more larger than the refractive index $n_R$ that has a smaller value.

According to at least one embodiment, the joining layer 127J is made of a resin adhesive. According to at least one embodiment, the joining layer 127J is made of a light-transmissive resin material that has a different refractive index depending on wavelength, such as epoxy resin or vinyl resin. According to at least one embodiment, a high refractive index light-transmissive resin having a refractive index of 1.6 or more and a low refractive index light-transmissive resin having a refraction index of 1.4 or less are used.

Thus, according to the display panel 10J, the refractive index of the light-adjusting film 127J with respect to light emitted from the light-emitting elements 100R, 100G, 100B is such that 100R<100G<100B, but the refractive index of the light-adjusting film 127J with respect to wavelengths of light emitted from the light-emitting elements 100 may be different in a different order. For example, according to at least one embodiment, for a light-emitting element having a large width Wel or a light-emitting element having a small spread of light emission distribution, the refractive index of the light-adjusting film 127J is relatively small for wavelengths corresponding to these light-emitting elements, in order to achieve a relatively large light-shielding ratio.

Manufacturing Method

The light-adjusting film 127J is formed by applying material of the light-adjusting film 127J, a main component of which is a light-transmissive resin material that has a different refractive index depending on wavelength, to the back panel composed of layers from the substrate 100x to the sealing layer 126, then, in a state where the back panel and the front plate 131 are positioned relative to each other, the material is irradiated by ultraviolet light, and the back panel and the front plate 131 are joined.

Brief Review

As described above, according to the display panel 10J, the light-adjusting film 127J, which is light-transmissive, is disposed between the light-emitting elements 100 and the light-shielding film 133 in the light emission direction of the light-emitting elements 100, and is common to different colors of the light-emitting elements 100. The longer the wavelength of transmitted light, the smaller the refractive index of the light-adjusting film 127J, and therefore, similarly to the display panel 10 according to at least one embodiment, a display panel can be manufactured that reduces changes in visual recognition of chromaticity when viewed from an oblique viewing angle.

Further, by making the refractive index of the light-adjusting film different for different light-emitting elements, the differences in light shielding ratios of the light-emitting elements can be more finely compensated for, and changes in visual recognition of chromaticity when viewed from an oblique angle can thereby be more accurately reduced. Further, as definition gets higher and pixel width becomes smaller, compensation based on wavelength dispersion works more effectively.

Modification 9

According to the display panel 10 pertaining to at least one embodiment, by providing the thickened portions 1331 of the light-shielding film 133 in the upper substrate 130, optical distances between the light emission reference points and the light-shielding film 133 are made different depending on light emission colors of the light-emitting elements 100. According to an organic EL display panel 10I pertaining to Modification 9, edge portions of color filter layers that are adjacent to each other in the row direction are stacked above boundaries between light-emitting elements that are adjacent in the row direction. Stacked edge portions of color filter layers constitute a light-shielding film with respect to adjacent light-emitting elements, and further, based on a stacking order of color filter layers at the edge portions, optical distances between the light-shielding film and light emission reference points can be made different between light emission color of light-emitting elements.

Structure

Figure 26:
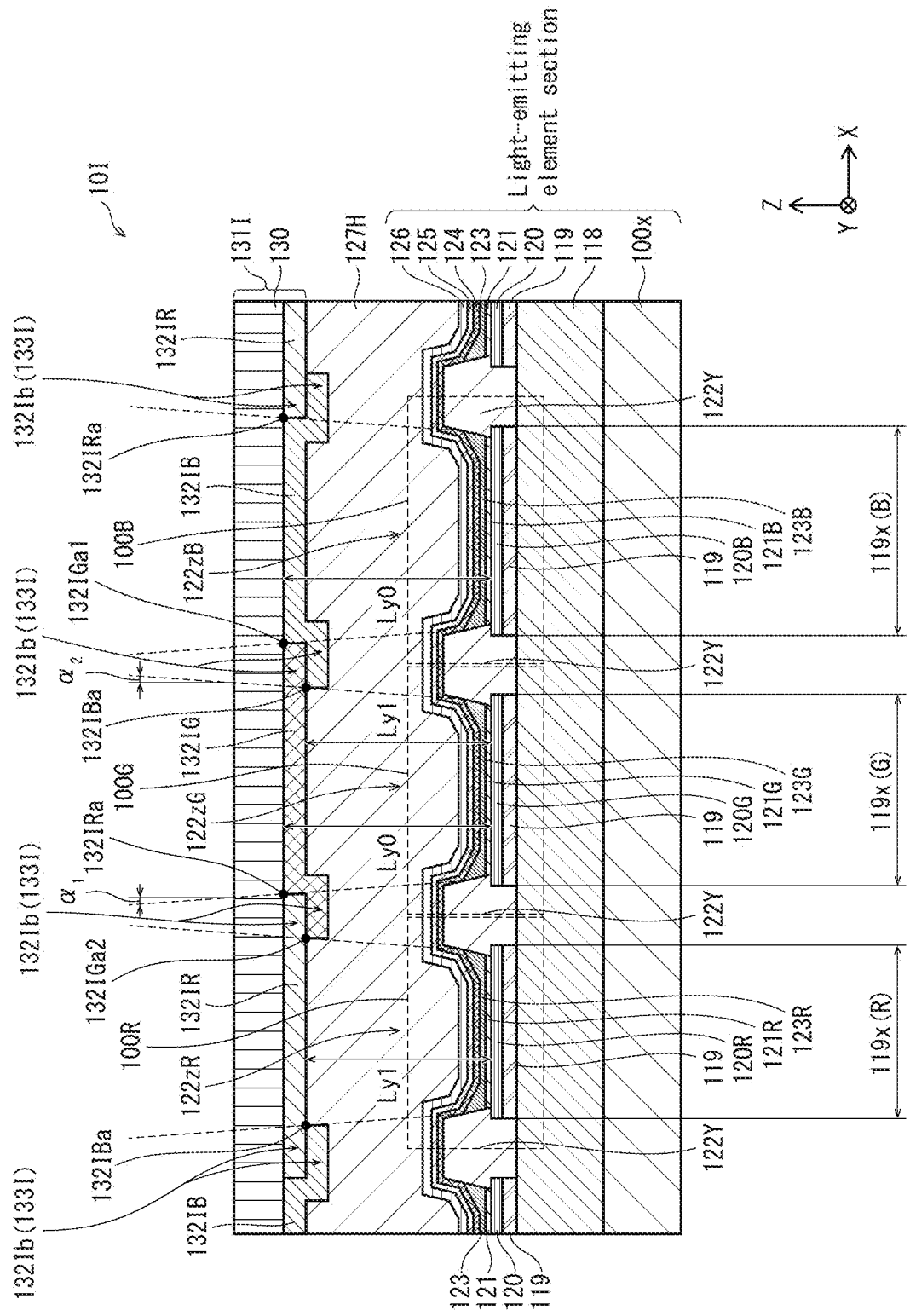
FIG. 26 is a schematic diagram of a cross-section taken from the same location as line A1-A1 in FIG. 1 from an organic EL display panel 10I according to Modification 9.

FIG. 26 is a schematic diagram of a cross-section taken from the same location as line A1-A1 in FIG. 1 from the display panel 10I according to Modification 9. In FIG. 26, structure that is the same as that of a display panel according to any of the embodiments described above has the same reference sign and description thereof is not repeated here. According to the display panel 10I, lengths 119x(B), (G), (R) in the row direction of the pixel electrodes 119 of the light-emitting elements 100B, 100G, 100R are ordered from longest (B) to shortest (R).

As illustrated in FIG. 26, the display panel 10I includes a front plate 131I, in which color filter layers 132IR, 132IG, 132IB corresponding to the light-emitting elements 100R, 100G, 100B are arranged facing the light-emitting elements 100R, 100G, 100B (and are also referred to as color filter layers 132I). Edge portions 132Ib of the color filter layers 132I are stacked above boundaries between the light-emitting elements 100 in the row direction. Light emitted by a given color of the light-emitting elements 100 (for example, R), has a small transmittance through the color filter layer 132I corresponding to an adjacent one of the light-emitting elements 100 (for example, G or B), and therefore, for example, the color filter layers 132IG or 132IB function as a light-shielding layer with respect to the light-emitting elements 100R. Thus, in the display panel 10I, each of the edge portions 132Ib of the color filters 132I constitute a light-shielding film 133I with respect to the light-emitting elements 100 adjacent in the row direction to the light-emitting elements 100 corresponding to the color filters 132I.

[Light-Emitting Element 100R]

In the example illustrated in FIG. 26, the edge portion 132Ib of the right of the color filter layer 132IB and the edge portion 132Ib of the left of the color filter layer 132IG constitute the light-shielding film 133I for the light-emitting element 100R. Here, the viewing angle α in the row direction of the light-emitting elements 100R is set to be equal.

Optical distance between the light emission reference points and the edges of the openings of the light-shielding film 133I according to the present example is a distance Ly1 in the light emission direction between a boundary between the hole injection layers 120 and the hole transport layers 121 of the light-emitting elements 100R and a top edge 1321Ba of an opening of the edge portion 132Ib of the right of the color filter 132IB, or a top edge 1321Ga2 of an opening of the edge portion 132Ib of the left of the color filter 132IG.

[Light-Emitting Element 100B]

In the example illustrated in FIG. 26, the edge portion 132Ib of the right of the color filter layer 132IG and the edge portion 132Ib of the left of the color filter layer 132IR constitute the light-shielding film 133I for the light-emitting element 100B. Here also, the viewing angle α in the row direction of the light-emitting elements 100B is set to be equal.

Optical distance between the light emission reference points and the edges of the openings of the light-shielding film 133I according to the present example is a distance Ly0 in the light emission direction that is longer than the optical distance Ly1 for the light-emitting elements 100R, between a boundary between the hole injection layers 120 and the hole transport layers 121 of the light-emitting elements 100B and a top edge 1321Ga1 of an opening of the edge portion 132Ib of the right of the color filter 1321G, or a top edge 1321Ra of an opening of the edge portion 132Ib of the left of the color filter 132IR.

[Light-Emitting Element 100G]

In the example illustrated in FIG. 26, the edge portion 132Ib of the right of the color filter layer 132IR and the edge portion 132Ib of the left of the color filter layer 132IB constitute the light-shielding film 133I for the light-emitting element 100G. Here also, viewing angles $\alpha_1$, $\alpha_2$ in the row direction of the light-emitting elements 100G are set to be equal.

The optical distances between the light emission reference points and edges of openings of the light-shielding film 133I are different depending on a stacking order of the edge portions 132Ib of the color filter layers 132IR, 132IB.

That is, according to the present example, the optical distance at a right side of the light-emitting element 100G is the optical distance Ly1 from a boundary between the hole injection layer 120 and the hole transport layer 121 of the light-emitting element 100G to the top edge 132IBa of the opening of the edge portion 132Ib of the left of the color filter 132IB, and is equal to the optical distance Ly1 for the light-emitting element 100R.

On the other hand, the optical distance at a left side of the light-emitting element 100G is the optical distance Ly0 from a boundary between the hole injection layer 120 and the hole transport layer 121 of the light-emitting element 100G to the top edge 132IRa of the opening of the edge portion 132Ib of the right of the color filter 132IR, and is longer than the optical distance Ly1.

As described above, the viewing angles $\alpha_1$, $\alpha_2$ in the row direction of the light-emitting element 100G are equal, and therefore the top edge 132IRa of the opening of the color filter 132IR of the optical distance Ly0, which is longer, is positioned farther from a center of the light-emitting element 100G in the row direction than the top edge 132IBa of the opening of the color filter 1321B of the optical distance Ly1, which is shorter. According to at least one embodiment, using the edge portion 132Ib of the left of the color filter layer 1321B corresponding to the optical distance Ly1 as a reference, the edge portion 132Ib of the right of the color filter 132IR is moved left, and the viewing angles $\alpha_1$, $\alpha_2$ are equal.

Manufacturing Method

According to the display panel 10I, in manufacture of the front plate 131IB, as illustrated in FIG. 9A, 9B, 9C, 9D, the material 132R of the color filter layer 132IR, a main component of which is an ultraviolet light curable resin component, is applied to an upper surface of the upper substrate 130, a defined pattern mask PM is placed, ultraviolet light irradiation is performed, curing is performed, and the pattern mask PM and uncured paste 132R is removed by developing to form the color filter layer 132IR. This process is repeated for each color of color filter material by using a pattern mask PM in which openings are formed such that the edge portions 133Ib overlap, thereby forming the color filter layers 132IG, 132IB and the front plate 131IB.

Brief Review

As described above, the display panel 10I includes a plurality of the color filters 132I corresponding to the plurality of different colors of the light-emitting elements 100. The light-shielding layer 133I is constituted by the edge portions 133Ib of the color filter layers 132I being stacked above the boundaries between the light-emitting elements 100 in the row direction. According to the example illustrated above, the optical distance Ly0 is configured to be longer than the optical distance Ly1, such that, in comparison with a conventional light-shielding film 33 (see FIG. 31), the light-shielding ratio for the light-emitting elements 100R is smaller.

As a result, according to the display panel 10I, similarly to the display panel 10 according to at least one embodiment, the light-shielding ratios for the light-emitting elements 100B, 100R are changed, for example to compensate for differences in light-shielding ratio due to differences in light-emitting element width Wel or light emission distribution among the light-emitting elements 100, and therefore a display panel can be manufactured that reduces changes in chromaticity visually recognized when viewed from an oblique angle.

Further, the optical distance Ly0 of the light-emitting elements 100B is longer than the optical distance Ly1 of the light-emitting elements 100G, and the viewing angles $\alpha_1$, $\alpha_2$ in the row direction of the light-emitting elements 100G are set to be equal to a reference of the edge portions 132IB of the left of the color filter layers 132IB corresponding to the optical distance Ly1 of the light-emitting elements 100B. Thus, compared with a case in which a conventional light-shielding film 33 (see FIG. 31) is provided at the same position on the upper substrate 130, the light-shielding ratio for the light-emitting elements 100G is smaller. Thus, the light-shielding ratios for the light-emitting elements 100B, 100G are changed, and therefore changes in chromaticity visually recognized when viewed from an oblique angle can be reduced.

As described above, according to the display panel 10I, a difference in light-shielding ratio due to a difference in light-emitting element width Wel or light emission distribution among the light-emitting elements 100 can be compensated for by adjusting the optical distance Ly1 for each color.

According to the display panel 10I described, among the light-emitting elements 100R, 100G, 100B, the light-emitting elements 100G have different optical distances to the left and right along the row direction. However, the light-emitting elements 100R or the light-emitting elements 100B may have different optical distance to the left and right along the row direction. In such a case, the viewing angles $\alpha_1$, $\alpha_2$ to the left and right of the light-emitting elements 100R, 100B are equal.

Modification 10

According to the display panel 10 pertaining to at least one embodiment, a maximum distance LB in a light emission direction between a light emission reference point of the light-emitting elements 100B and an edge of the openings 133a of the light-shielding film 133 is longer than a maximum distance for the light-emitting elements 100R, 100G. According to at least one embodiment, as described above, the lengths 119x(B), (G), (R) in the row direction of the pixel electrodes 119 of the light-emitting elements 100B, 100G, 100R are configured from longest (B) to shortest (R), such that the light-shielding ratio of the light-emitting elements 100B is smallest. By adopting the structure described above of the display panel 10, the light-shielding ratios are increased for the light-emitting elements that have the longest length of the pixel electrodes 119 in the row direction, effectively compensating for changes in light-shielding ratios due to light emission color.

However, there are factors other than the lengths 119x in the row direction of the pixel electrodes 119 that can cause light-shielding ratios of the light-emitting elements 100 to be different from each other.

Figure 27:
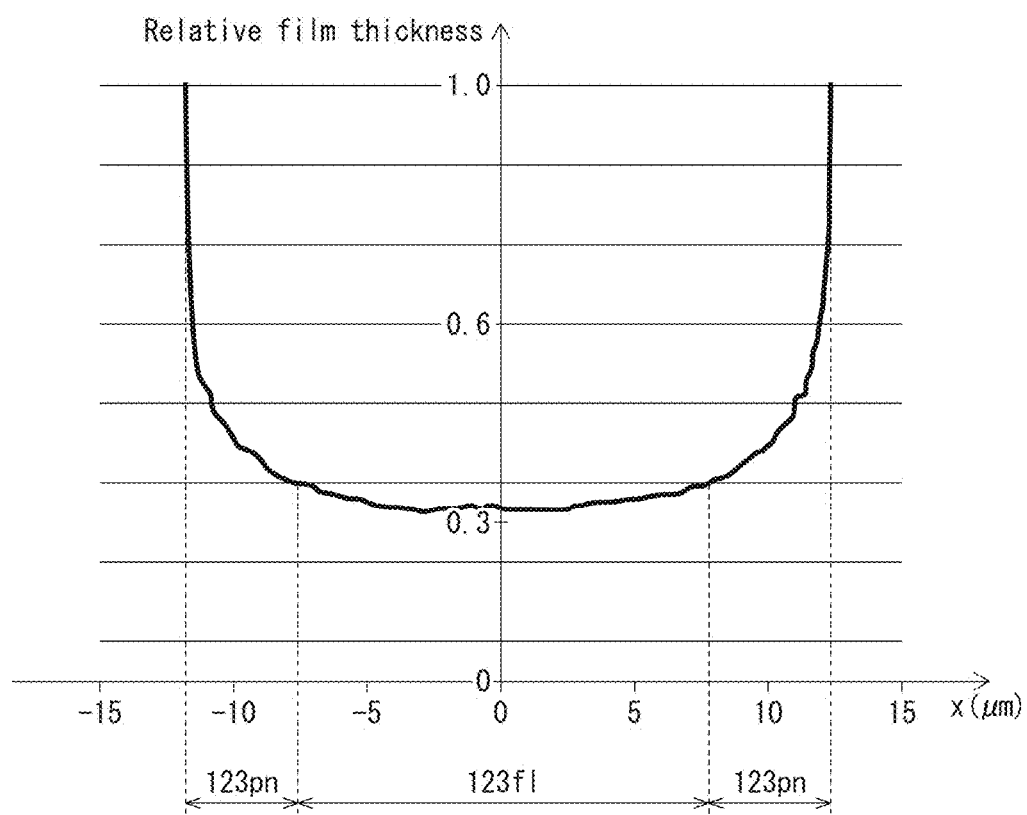
FIG. 27 is a graph of measurement results of film thickness of functional layers up to a light-emitting layer 123 in a cross-section taken along a row direction of the organic EL display panel 10.

FIG. 27 illustrates results of measuring film thicknesses of functional layers up to the light-emitting layer 123 in a cross-section taken along the row direction of the light-emitting element 100B of the display panel 10. As illustrated in FIG. 27, film thickness of the functional layers formed by an application method is in a range from 0.26 to 0.33 within a range of 7.5 μm from a center (x=0) in the row direction of the gap 122z between banks, or in other words a flat portion 123fl exists in which variation in film thickness is 0.07 or less. On both side of the flat portion 123fl in the x direction, film thickness gradually increases from 0.33 to 0.73 as the distance from the flat portion 123fl increases, or in other words pinning portions 123pn exist with film thicknesses greater than the flat portion 123fl in ranges of 5 μm either side of the flat portion 123fl.

That is, each of the light-emitting layers 123 has a relatively uniform flat portion 123fl in a width range including a center of the gap 122z between the banks in the row direction having a film thickness in a defined range. Further, the light-emitting layers 123 include pinning portions 123pn on both sides of the flat portions 123fl in the row direction that have larger film thicknesses than the flat portions 123fl. In the pinning portions 123pn, film thickness gradually increases towards a maximum film thickness with increasing distance from the flat portion 123fl.

Figure 28:
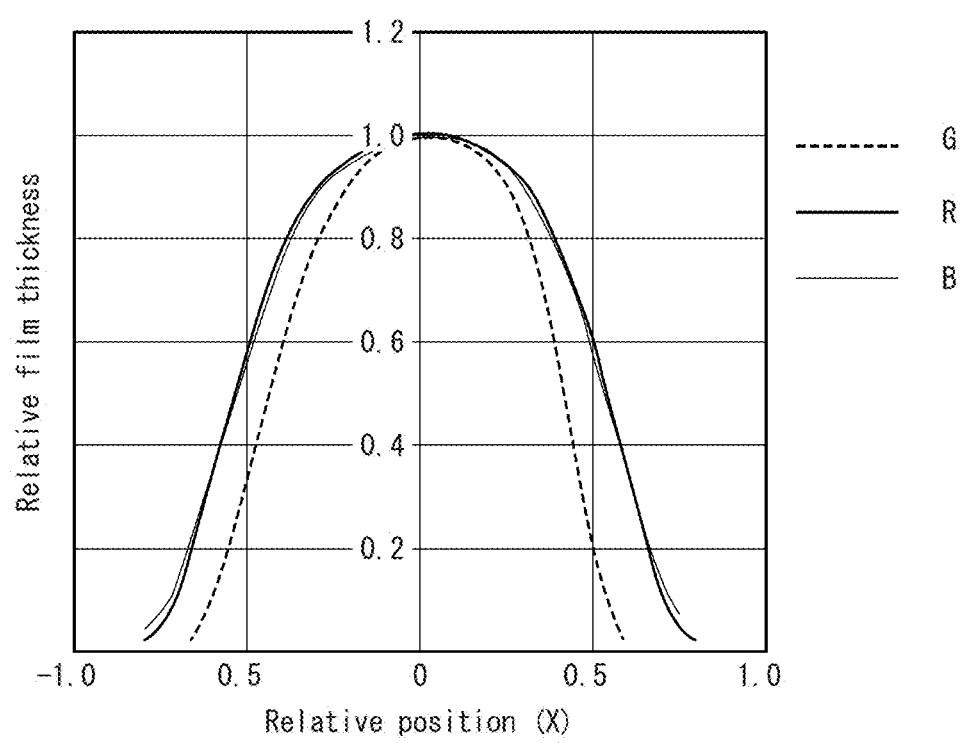
FIG. 28 is a graph of measurement results of chromaticity (y value) distribution measured at positions corresponding to the line A1-A1 in FIG. 1 in sub-pixels of an organic EL display panel.

FIG. 28 is a schematic diagram illustrating results of measurement of luminance (relative luminance) distribution of monochromatic light measured at positions corresponding to A1-A1 in FIG. 1 for each color of sub-pixel of the display panel 10.

As illustrated in FIG. 28, in each color of light-emitting element 100R, 100G, 100B of the display panel 10, a distribution of relative brightness of 0.1 or more was observed in a range corresponding to the flat portion 123fl of the light-emitting layer 123. Light emission luminance distribution shape is different depending on the colors of the light-emitting elements 100R, 100G, 100B, with the light-emitting elements 100G showing a steeper distribution shape than the light-emitting elements 100R, 100n.

Further, the inventor confirmed that when the light-emitting elements 100R, 100G, 100B are viewed from the viewing angle α, the light-emitting elements 100R, 100B have a larger rate of reduction in visually recognized luminance than the light-emitting elements 100G.

In the light-emitting layer 123, the flat portion 123fl having a smaller film thickness that the pinning portions 123pn has a smaller electrical resistance than the pinning portions 123pn, and therefore current density is high and light emission in the flat portion 123fl becomes dominant. Thus, in a range corresponding to the flat portion 123fl of the light-emitting layer 123, a relative luminance distribution of 0.1 or more was observed.

Further, in manufacturing the light-emitting layers 123, as described above, the inks 123RI, 123GI, 123BI that contain materials of R, G, B organic light-emitting layers are applied to the gaps 122z that are sub-pixel formation areas, the inks are dried under low pressure, and baked to form the light-emitting layers 123R, 123G, 123B. In the application of the inks of the light-emitting layers 123, solutions for forming the light-emitting layers 123 are applied using a droplet discharge device, but the inks 123RI, 123GI, 123BI each include different organic light-emitting layer material, have different solute density, ink viscosity, number of applied droplets, and the like, and therefore the film shapes of the light-emitting layers 123 tend to be different from each other. According to at least one embodiment, the width in the x direction of the flat portions 123fl in the light-emitting layers 123G of the light-emitting elements 100G is smaller than the width in the x direction of the flat portions 123fl in the light-emitting layers 123R, 123B of the light-emitting elements 100R, 100B, and therefore the light-emitting elements 100G have a steeper distribution shape than the light-emitting elements 100R, 100B.

Due to the differences in luminance distribution shapes between the light-emitting elements 100R, 100G, 100B, when the light-emitting elements 100R, 100G, 100B are viewed from the direction of the viewing angle α, even if the light-shielding width and the light-shielding ratios are the same, the light-emitting elements 100R, 100B have a larger visible reduction rate of luminance than the light-emitting elements 100G, luminance balance of the light-emitting elements 100R, 100G, 100B when viewed from the viewing angle α changes, and therefore the chromaticity visually recognized changes.

According to the display panel 10H pertaining to Modification 10, thickness of portions of the light-shielding film 133 corresponding to the light-emitting elements 100G is increased inside the upper substrate 130, and the optical distances from the light emission reference points to the light-shielding film 133 are longer for the light-emitting elements 100G than for the light-emitting elements 100R, 100B.

Figure 29:
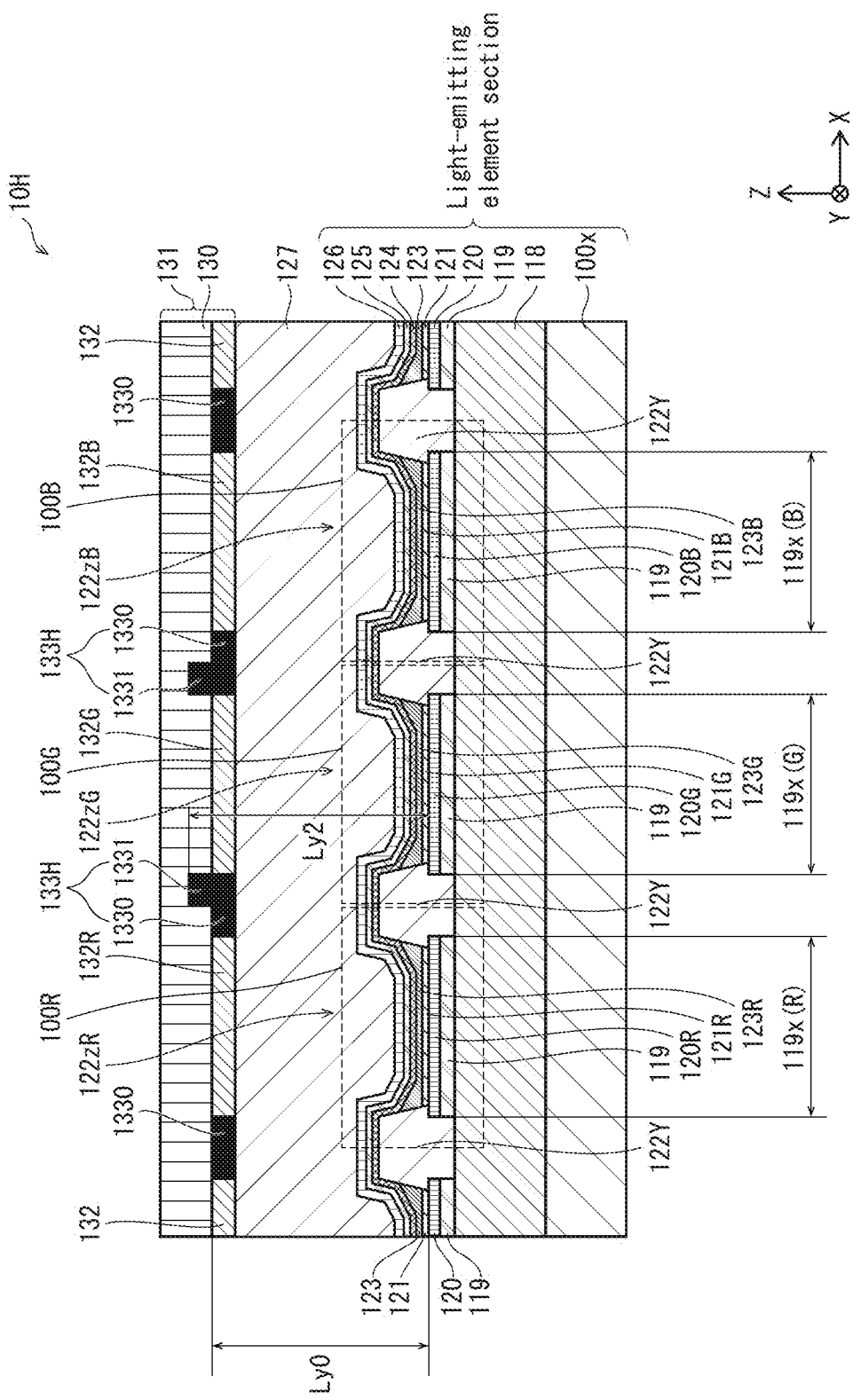
FIG. 29 is a schematic diagram of a cross-section taken from the same location as line A1-A1 in FIG. 1 from an organic EL display panel 10H according to Modification 10.

FIG. 29 is a schematic diagram of a cross-section taken from the same location as line A1-A1 in FIG. 1 from the organic EL display panel 10H according to Modification 10. As illustrated in FIG. 29, according to the display panel 10H, the lengths 119$x$(B), 119$x$(G), 119$x$(R) in the row direction of the pixel electrodes 119 of the light-emitting elements 100B, 100G, 100R are equal. Further, the thickened portions 1331 are formed around the openings 133$a$ corresponding to the light-emitting elements 100G, the base portions 1330 are formed around the openings corresponding to the light-emitting elements 100R, 100B, and therefore thickness of the light-shielding film 133H is greater adjacent to the openings corresponding to the light-emitting elements 100G than adjacent to the openings corresponding to the light-emitting elements 100R, 100B.

Thus, according to the display panel 10H, a structure is adopted in which the optical distance Ly2 in the light emission direction from the boundary between the hole injection layers 120 and the hole transport layers 121 of the light-emitting elements 100G to the edges of the openings of the light-shielding film corresponding to the light-emitting elements 100$g$ is longer than the optical distance in the light emission direction from the boundary between the hole injection layers 120 and the hole transport layers 121 of the light-emitting elements 100R, 100B to the edges of the openings of the light-shielding film corresponding to the light-emitting elements 100R, 100B.

Thus, according to the display panel 10H, a structure is adopted in which the optical distance from the light emission reference points of the light-emitting elements 100G to the edges of the openings of the light-shielding film corresponding to the light-emitting elements 100G is longer than the optical distance from the light emission reference points of the light-emitting elements 100R, 100B to the edges of the openings of the light-shielding film corresponding to the light-emitting elements 100R, 100B, and the light-shielding ratio of the light-emitting elements 100G is larger than the light-shielding ratios of the light-emitting elements 100R, 100$n$.

Thus, according to the display panel 10H, a change in visually recognized chromaticity when viewed from an oblique direction is reduced, where the change is due to differences in steepness of luminance distribution shapes of the light-emitting elements 100R, 100G, 100B causing differences in visually recognized luminance among the light-emitting elements 100 that have the same apparent light-shielding ratio when viewed from the oblique direction. That is, by changing light-shielding ratios to compensate for differences in luminance reduction rates of the light-emitting elements 100B, 100G, 100R, changes in chromaticity when viewed from an oblique direction can be reduced.

<Effect on Optical Resonator Structure>

Figure 30:
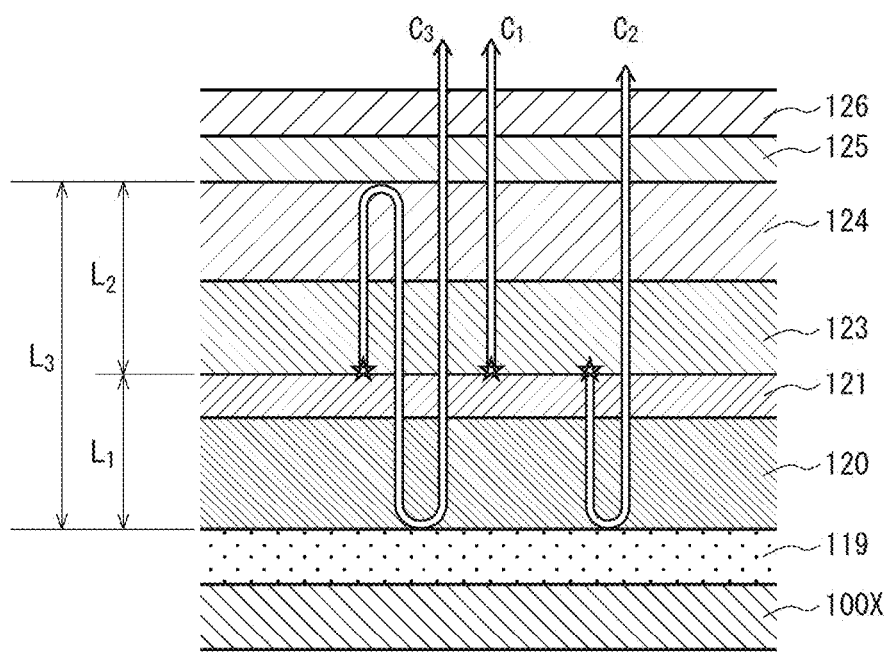
FIG. 30 is a diagram illustrating light interference in an optical resonator structure of the organic EL display panel 10 according to at least one embodiment.

According to the display panel 10, an optical resonator structure is adopted to adjust light extraction efficiency. FIG. 30 is a diagram illustrating light interference in an optical resonator structure of the display panel 10 according to at least one embodiment. The drawing illustrates an element section corresponding to one sub-pixel 100$se$.

In the optical resonator structure of the sub-pixel 100$se$ of the light-emitting element 100, light is emitted from the light-emitting layer 123 from the vicinity of an interface with the hole transport layer 121, and is transmitted through layers. Part of the light is reflected at interfaces between layers, and therefore interference occurs.

Part of the light emitted from the light-emitting layer 123 and traveling towards the counter electrode 125 passes through the counter electrode 125 and is emitted outside the light-emitting element along a first optical path $C_1$, and a part of the light emitted from the light-emitting layer 123 and traveling towards the pixel electrode 119 is reflected at the pixel electrode 119, transmitted through the light-emitting layer 123 and the counter electrode 125, and emitted outside the light-emitting element along a second optical path $C_2$. Thus, there is interference between this directly emitted and reflected light.

An optical film thickness $L_1$ illustrated in FIG. 30 corresponds to a difference in optical distance between the first optical path $C_1$ and the second optical path $C_2$. The optical film thickness $L_1$ is a total optical distance of the hole injection layer 120 and the hole transport layer 121 sandwiched between the light-emitting layer 123 and the pixel electrode 119.

Part of the light traveling from the light-emitting layer 123 towards the counter electrode 125 is reflected at the counter electrode 125, further reflected at the pixel electrode 119, then emitted outside the light-emitting element along a third optical path $C_3$. Thus, interference occurs between light traveling the third optical path $C_3$ and light traveling the first optical path $C_1$. A difference in optical distance between the second optical path $C_2$ and the third optical path $C_3$ corresponds to an optical film thickness $L_2$ illustrated in FIG. 30. The optical film thickness $L_2$ is a total optical distance of the light-emitting layer 123 and the electron transport layer 124.

Thus, interference occurs between light traveling the third optical path $C_3$ and light traveling the first optical path $C_1$. A difference in optical distance between the first optical path $C_1$ and the third optical path $C_3$ corresponds to an optical film thickness $L_3$ illustrated in FIG. 30. The optical film thickness $L_3$ is the sum of the optical film thickness $L_1$ and the optical film thickness $L_2$ ($L_3=L_1+L_2$). The optical film distance $L_3$ is a total optical distance of the hole injection layer 120, the hole transport layer 121, the light-emitting layer 123, and the electron transport layer 124 sandwiched between the pixel electrode 119 and the counter electrode 125.

In the design of optical distance in a light emitting element using an optical resonator structure, film thickness of the light-emitting layer 123 for adjusting both the optical film thickness $L_2$ and the optical film thickness $L_3$ is determined in consideration of film thicknesses of the hole injection layer 120 and the hole transport layer 121, which are determined for adjustment of the optical film thickness $L_1$. In the adjustment of the optical film thicknesses $L_2$, $L_3$ that are affected by the film thickness of the light-emitting layer 123, an optimal optical distance between electrodes is longest for red pixels and shortest for blue pixels, due to differences in light emission wavelengths for each color.

According to investigation by the inventor, an effective optical path length when viewed from an oblique direction gradually decreases as an angle of the viewing direction from the front increases. Therefore, wavelengths of emitted light that cause constructive interference shift towards shorter wavelengths, and when the angle from the front of the viewing direction increases, the wavelengths of emitted light shift towards shorter wavelengths.

In response to this, according to the display panel 10H, the light-emitting elements 100 have different light emission distribution shapes along the row direction according to light emission color, and in the emission distribution shapes, for example, a light-emitting element 100 that has a larger range for a ½ luminance area has a larger distance between an opening edge and an edge of the light-emitting element 100 in the row direction than a light-emitting element 100 that has a smaller range for a ½ luminance area. More specifically, according to Modification 10, regarding the light-emitting elements 100G, which have the steepest light emission distribution, the thickened portions 1331 are provided around the openings 133a of the light-shielding film 133 corresponding to the light-emitting elements 100G, the base portions 1330 are provided around the openings 133a of the light-shielding film 133 corresponding to the light-emitting elements 100R, 100B, and therefore the thickness of the light-shielding film 133 is larger around the openings corresponding to the light-emitting elements 100G than around the openings corresponding to the light-emitting elements 100R, 100B. Thus, light-shielding ratios of each color of the light-emitting elements 100 can be changed to compensate for shifts towards shorter wavelengths of emitted light caused by different pinning portions 123*pn* when different light-emitting elements 100 are viewed from an oblique direction.

Thus, according to the display panel 10H, emission of light emitted from the flat portion 123*fl* and the pinning portions 123*pn* when viewed from an oblique angle can be adjusted by adjusting light-shielding ratios according to light emission colors of light-emitting elements, such that changes in chromaticity of light emitted from each sub-pixel when viewed from the oblique angle can be suppressed.

<Differences in Chromaticity Shifts in Row and Column Directions>

According to the display panel pertaining to at least one embodiment, the light-emitting layers 123 are formed by using an inkjet method, where inks containing constituent materials are applied in the gaps 122*z* defined by the column banks 122Y, then baked. The light-emitting layers 123 are applied films each having an elongated shape that extends continuously not just in the self-luminous areas 100*a*, but also in the non-self-luminous areas 100*b* that are adjacent. Thus, in each of the light-emitting elements 100, the film shape of the light-emitting layer 123 in the row direction includes the pinning portions 123*pn* on either side of the flat portion 123*fl* where film thickness gradually increases with distance from the flat portion 123*fl*. Length of the flat portion 123*fl* in the column direction is larger than length of the flat portion 123*fl* in the row direction. Further, in the display panel 10, the unit pixels 100*e* each composed of three light-emitting elements 100 arranged in the row direction are arranged in a matrix, and therefore row and column direction lengths of each of the sub-pixels 100*se* corresponding to the light-emitting elements 100 are such that the column direction length is larger than the row direction length. Thus, light-shielding ratios when viewed from an oblique viewing angle are such that the light-shielding ratio in the row direction is greater than the light-shielding ratio in the column direction, and a chromaticity change visually recognized from the oblique viewing angle also changes more in the row direction than in the column direction. Accordingly, regarding edges in the row direction of the openings 133*a* of the light-shielding film 133, according to at least one embodiment, a display panel structure is implemented that can effectively reduce chromaticity changes visually recognized from an oblique viewing angle by providing the thickened portions 1331.

That is, according to at least one embodiment, the widths Wbma in the row direction and the column direction of the openings 133*a* of the light-shielding film 133 corresponding to the light-emitting elements 100R, 100G, 100B lead to differences in the row direction and the column direction of visually recognized luminance when viewed from a viewing angle α (α may equal 45°) caused by portions of light emitted from the light-emitting elements 100 being blocked by the light-shielding film 133.

According to at least one embodiment, the widths Wbma in the row direction and the column direction of the openings 133*a* corresponding to the light-emitting elements 100R, 100G, 100B are structured such that a chromaticity difference (Δu'v') between observed chromaticity (u'v') viewed from the viewing angle α (where α is 45°) in the row direction and the column direction is 0.020 or less.

More specifically, a structure is adopted such that a difference between chromaticity observed from a viewing angle of 45° in the row direction and chromaticity observed from a viewing angle of 45° in the column direction, caused by portions of light from the light-emitting elements 100 being shielded by edges of the openings 133*a* of the light-shielding film 133, is from 0 to 0.020.

With such a structure, it is possible to reduce a change in chromaticity visually recognized from an oblique viewing angle when opening widths Wbma in the row direction and the column direction of each of the openings 133*a* of the light-shielding film 133 are decreased, causing light-shielding ratios to increase.

According to at least one embodiment, the change in chromaticity (Δu'v') is 0.004 or less. Thus, the change in chromaticity (Δu'v') is equal to or below a human recognition limit.

According to at least one embodiment, when luminance observed from the viewing angle of 45° in the column direction is 103% or more of luminance observed from a viewing angle of 45° in the row direction, where a difference in observed luminance is caused by a portion of light emitted from each of the light-emitting elements 100 being shielded by the edge of the openings 133*a* of the light-shielding film 133, then according to the present disclosure, for example, it effective to provide the thickened portions 1331. That is, by making the optical distances between the light emission reference point of the light-emitting elements 100 and the light-shielding film 133 corresponding to the light-emitting elements 100 different according to light-shielding ratios for each of the light-emitting elements 100, luminance balance from the light-emitting elements 100 can be controlled such that optimum points of chromaticity (u'v') observed from the viewing angle α (where α is 45°) in the row direction and the column direction can be made to match. Thus, where the light-emitting layers 123 of the light-emitting elements 100 are applied films each having an elongated shape that is continuous in one of the gaps 122*z* between the column banks 122Y, it is possible to implement a display panel structure that even more accurately compensates for changes in chromaticity visually recognized from an oblique viewing angle due to changes in light-shielding ratios of the light-emitting elements 100B, 100G, 100R.

<Differences in Chromaticity Shifts in Row and Column Directions>

According to at least one embodiment, as an optical resonator structure of the display panel 10, as illustrated in FIG. 30, an optical resonator structure is from a first reflective surface to a second reflective surface, where the first reflective surface is a boundary between the pixel electrodes 119 and the hole injection layers 120 and the second reflective surface is a boundary between the electron transport layer 124 and the counter electrode 125. However, according to a method described in JP 2018-88365, for example, according to at least one embodiment, film thickness and refractive index of each layer including the light-adjusting film 128 are appropriately set, such that a third reflective surface is a boundary between the light-adjusting film 128 and the sealing layer 126. According to this structure, the light-adjusting film 128 can more accurately compensate for changes in chromaticity visually recognized from an oblique viewing angle, and improve light extraction efficiency from the light-emitting elements 100.

Other Modifications

According to the display panels 10, 10A, 10B, 10C, 10D, 10E, 10F, 10G pertaining to various embodiments, the pixel electrodes 119 are arranged in a matrix corresponding to sets of three self-luminous areas 100aR, 100aG, 100aB arranged in order along the row direction. Lengths 119x in the row direction of the pixel electrodes 119 are configured such that the lengths 119x of the pixel electrodes 119 corresponding to the light-emitting elements 100 go from largest to smallest in the order of the light-emitting elements 100B, 100G, 100R. In plan view, areas of the self-luminous areas 100aB, 100aG, 100aR have a similar relationship of relative sizes. However, according to at least one embodiment, the lengths 119x in the row direction of the pixel electrodes 119, and lengths in the row direction and areas of the light-emitting elements 100B, 100G, 100R (self-luminous areas 100aB, 100aG, 100aR) are not limited to the examples described above. For example, according to Modification B, the lengths 119x in the row direction of the pixel electrodes 119 are the same for the light-emitting elements 100B, 100G, 100R. According to at least one embodiment, the lengths 119x in the row direction of the pixel electrodes 119 go from largest to smallest in the order of the light-emitting elements 100R, 100G, 100B. According to at least one embodiment, any alternative size relationship of the lengths 119x may be used.

According to the light-emitting elements 100 pertaining to at least one embodiment, the hole injection layers 120, the hole transport layers 121, the light-emitting layer 123, and the electron transport layer 124 are present between the pixel electrodes 119 and the electron transport layer 124, but the present disclosure is not limited to this structure. According to at least one embodiment, a structure may omit one or more of the hole injection layers 120, the hole transport layers 121, and the electron transport layer 124, such that, for example, between the pixel electrodes 119 and the counter electrode 125, the hole transport layers 121 and the light-emitting layers 123 are present, or the light-emitting layers 123 and the electron transport layer 124 are present, or the hole transport layers 121, the light-emitting layers 123, and the electron transport layer 124 are present. Further, for example, aside from the light-emitting layers 123, a structure may include a layer or a plurality of layers selected from the group consisting of hole injection layers, hole transport layers, electron transport layer, and electron injection layer. Further, all these layers need not be made of organic compounds, and one or more layers may be made of an inorganic compound.

According to the display panel 10 pertaining to at least one embodiment, the banks 122 have a line-shaped bank structure. Between each two adjacent pixel electrodes 119 in the row direction is one of the column banks 122Y that extends in the column direction (Y direction in FIG. 1). Between each two adjacent pixel electrodes 119 in the column direction is one of the row banks 122X that extends in the row direction (X direction in FIG. 1). The light-emitting layers 123 are continuous across areas where the row banks 122X are present, but organic luminescence does not occur in these areas, which are therefore non-self-luminous areas 100b. However, according to at least one embodiment, the light-emitting layers 123 are not formed in areas where the row banks 122X are present, the light-emitting layers 123 have island shapes within a lattice formed by the row banks 122X and the column banks 122Y, and therefore each sub-pixel is separated. Even in a structure where the light-emitting layers 123 are partitioned by pixel banks, chromaticity changes occur in the pinning portions 123pn of the light-emitting layers 123. In such a structure, according to the display panel 10, emission of light emitted from the flat portion 123fl and the pinning portions 123pn when viewed from an oblique angle can be adjusted by adjusting light-shielding ratios according to light emission colors of light-emitting elements, such that changes in chromaticity of light emitted from each sub-pixel when viewed from the oblique angle can be suppressed.

According to at least one embodiment, colors of light emitted by the light-emitting layers 123 of the sub-pixels 100se adjacent in the row direction in the gaps 122z between the column banks 122Y are different from each other, while light emitted by the light-emitting layers 123 of the sub-pixels 100se adjacent in the column direction in gaps between the row banks 122X is the same color. However, the light emitted by the light emitting layers 123 of the sub-pixels 100se that are adjacent in the row direction may be the same color, and the colors of light emitted by the light emitting layers 123 of the sub-pixels 100se that are adjacent in the column direction may be different from each other.

According to the display panel 10 pertaining to at least one embodiment, each of the pixels 100e includes a red sub-pixel, a green sub-pixel, and a blue sub-pixel, but the present disclosure is not limited to this. As another example, the light emitting layers may all be of a single type, or there may be four types emitting colors of light such as red, green, blue, and white.

Further, according to at least one embodiment, the pixels 100e are arranged in a matrix, but the present disclosure is not limited to this. For example, when an interval between pixel areas is one pitch, adjacent pixel regions in the row direction may be shifted by a half pitch in the column direction. In a high-definition display panel, a slight shift in the column direction is difficult to visually recognize, and even if film thickness irregularity occurs along a straight line (or staggered pattern) of a certain width, it will be visually recognized as a band. Thus, even in such a case, display quality of a display panel can be improved by suppressing uneven luminance when arranged in a staggered pattern.

According to at least one embodiment, the pixel electrodes 119, which are anodes, are disposed below the EL element sections and connected to the wiring 110 connected to source electrodes of TFTs, but a structure may be adopted in which a counter electrode is disposed below the EL element sections and an anode is disposed above. In such a case, drains of the TFTs connect the cathode below the EL element sections.

Further, according to at least one embodiment, a structure is adopted in which two transistors $Tr_1$, $Tr_2$ are provided for each of the sub-pixels 100se, but the present disclosure is not limited to this. For example, a structure may be adopted in which a single transistor or three or more transistors correspond to one sub-pixel.

Further, according to at least one embodiment, a top-emission type of EL display panel is given as an example, but the present disclosure is not limited to this. For example, a bottom-emission type of display panel or the like can be used. In such a case, each structure can be changed appropriately.

At least one embodiment describes the method for manufacturing the organic EL display panel that uses organic electroluminescence for a light-emitting layer, but the present disclosure is also applicable to an inorganic EL display panel that uses inorganic electroluminescence for a light-emitting layer, a quantum dot display panel that uses quantum dot light-emitting diodes (LEDs) as a light-emitting layer (for example, see JP 2010-199067), or the like, where only structure and type of light-emitting layer are different, but structure such as the light-emitting layers and other functional layers being between pixel electrodes and a counter electrode is the same as that of an organic EL display panel, and where the light-emitting layers or another functional layer are formed by an application method.

Supplement

The embodiments described above each indicate one beneficial specific example of the present invention. Numerical values, shapes, materials, constituent elements, arrangement positions and connections of constituent elements, steps, order of steps, and the like indicated as embodiments are merely examples and are not intended to limit the present invention. Further, among constituent elements in the embodiments, any elements not described in independent claims representing top level concepts of the present invention are described as constituent elements constituting a more beneficial embodiment.

Further, the order described above in which steps are executed is for illustrative purposes, and the steps may be in an order other than described above. Further, a portion of the steps described above may be executed simultaneously (in parallel) with another step.

Further, in order to facilitate understanding of the invention, constituent elements in each drawing referenced by description of an embodiment are not necessarily drawn to scale. Further, the present invention is not limited to the description of the embodiments, and can be appropriately changed without departing from the scope of the present invention.

Further, at least a portion of functions of each embodiment and each modification may be combined.

Further, the present disclosure includes various modifications of the embodiments that are within the scope of ideas conceivable by a person skilled in the art.

The invention claimed is:

1. A self-luminous display panel in which pixels composed of sub-pixels are arranged, comprising:
light-emitting elements corresponding one-to-one with the sub-pixels, each sub-pixel in a pixel emitting a different color of light; and
a light-shielding layer at edge positions corresponding to the light-emitting elements in plan view, downstream in a light emission direction of the light-emitting elements, wherein
optical distances between the light-shielding layer and light emission reference points of the light-emitting elements are different, depending on light emission color of the light-emitting elements, and
the pixels are arranged in a matrix of rows and columns,
the light-emitting elements have different lengths in a row or column direction depending on the light emission color of the light-emitting elements, and
among the light-emitting elements of each pixel, a first light-emitting element that has a larger length in the row or column direction has a larger value among the optical distances than a second light-emitting element that has a smaller length in the row or column direction.

2. The self-luminous display panel of claim 1, wherein the optical distances are each a maximum distance in the light emission direction between an edge position of the light-shielding layer, and one of the light emission reference points of a corresponding one of the light-emitting elements.

3. The self-luminous display panel of claim 2, wherein positions in the light emission direction of top edges of the edge positions of the light-shielding layer corresponding to the light-emitting elements are different, depending on the light emission color of the light-emitting elements.

4. The self-luminous display panel of claim 2, wherein positions in the light emission direction of the light emission reference points of the light-emitting elements are different, depending on the light emission color of the light-emitting elements.

5. The self-luminous display panel of claim 1, further comprising:
a light-adjusting layer between the light-emitting elements and the light-shielding layer in the light emission direction, wherein
the light-adjusting layer has areas corresponding to the light-emitting elements in plan view, and a refractive index of the light-adjusting layer is different for different areas, depending on light emission color of the light-emitting elements.

6. The self-luminous display panel of claim 1, further comprising:
a light-adjusting layer between the light-emitting elements and the light-shielding layer in the light emission direction, the light-adjusting layer being common to a plurality of the light-emitting elements that emit different colors of light, wherein
a refractive index of the light-adjusting layer is different for different wavelengths of light emitted by the light-emitting elements.

7. The self-luminous display panel of claim 1, wherein the light-shielding layer is composed of portions of color filter layers overlapping in plan view above boundaries between the light-emitting elements, where the color filter layers correspond one-to-one with the light-emitting elements.

8. The self-luminous display panel of claim 1, wherein the pixels are arranged in a matrix of rows and columns, and
in plan view, in a row direction, a column direction, or both the row and column directions, the edge positions of the light-shielding layer each include the light-emitting element corresponding to the edge position, and a distance between an edge of the edge position and the light-emitting element is the same among the light-emitting elements, regardless of the light emission color of the light-emitting elements.

9. The self-luminous display panel of claim 1, wherein the pixels are arranged in a matrix of rows and columns, the light-emitting elements of each pixel are arranged in a line in the row direction,
banks extending in the column direction are disposed between the light-emitting elements in the row direction, each of the light-emitting elements includes a light-emitting layer including an applied film disposed in a gap between the banks, and each of the light-emitting layers includes a flat portion that has a substantially uniform film thickness disposed in a range that includes a center point in the row direction of the gap between the banks, and pinning portions disposed on either side of the flat portion in the row direction that have a larger film thickness than the flat portion.

10. The self-luminous display panel of claim 9, wherein a difference in chromaticity between chromaticity observed from a viewing angle of 45 degrees from the front of the display panel in the row direction and chromaticity observed from a viewing angle of 45 degrees from the front of the display panel in the column direction is from 0 to 0.02, where the difference in observed chromaticity is caused by a portion of light emitted from each light-emitting element being shielded by an edge of the edge position of the light shielding layer.

11. The self-luminous display panel of claim 9, wherein luminance observed from a viewing angle of 45 degrees from the front of the display panel in the column direction is 103% or more of luminance observed from a viewing angle of 45 degrees from the front of the display panel in the row direction, where a difference in observed luminance is caused by a portion of light emitted from each light-emitting element being shielded by the edge of the edge position of the light shielding layer.

12. A self-luminous display panel in which pixels composed of sub-pixels are arranged, comprising:

light-emitting elements corresponding one-to-one with the sub-pixels, each sub-pixel in a pixel emitting a different color of light;

a light-shielding layer at edge positions corresponding to the light-emitting elements in plan view, downstream in a light emission direction of the light-emitting elements, and a light-adjusting layer between the light-emitting elements and the light-shielding layer in the light emission direction, the light-adjusting layer being common to a plurality of the light-emitting elements that emit different colors of light, wherein optical distances between the light-shielding layer and light emission reference points of the light-emitting elements are different, depending on light emission color of the light-emitting elements, and a refractive index of the light-adjusting layer is different for different wavelengths of light emitted by the light-emitting elements.

* * * * *